(12) United States Patent
Kambe et al.

(10) Patent No.: US 8,530,062 B2
(45) Date of Patent: Sep. 10, 2013

(54) ORGANIC ELECTROLUMINESCENT ELEMENT AND DISPLAY

(75) Inventors: Emiko Kambe, Kanagawa (JP); Yasunori Kijima, Tokyo (JP); Tadahiko Yoshinaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 296 days.

(21) Appl. No.: 12/934,922

(22) PCT Filed: Apr. 2, 2009

(86) PCT No.: PCT/JP2009/056861
§ 371 (c)(1),
(2), (4) Date: Sep. 27, 2010

(87) PCT Pub. No.: WO2009/123277
PCT Pub. Date: Oct. 8, 2009

(65) Prior Publication Data
US 2011/0024736 A1    Feb. 3, 2011

(30) Foreign Application Priority Data

Apr. 3, 2008   (JP) .............................. P2008-096883
Mar. 12, 2009  (JP) .............................. P2009-058987

(51) Int. Cl.
*H01L 51/54* (2006.01)

(52) U.S. Cl.
USPC ............ 428/690; 428/917; 313/504; 313/506

(58) Field of Classification Search
None
See application file for complete search history.

(56) References Cited

U.S. PATENT DOCUMENTS

| | | | | |
|---|---|---|---|---|
| 2001/0008711 A1* | 7/2001 | Igarashi | | 428/690 |
| 2004/0004214 A1 | 1/2004 | Yamazaki et al. | | |
| 2005/0099118 A1* | 5/2005 | Kobayashi | | 313/506 |
| 2006/0019116 A1* | 1/2006 | Conley et al. | | 428/690 |
| 2006/0172147 A1* | 8/2006 | Matsuura et al. | | 428/690 |
| 2008/0292904 A1* | 11/2008 | Kambe et al. | | 428/690 |
| 2009/0033218 A1 | 2/2009 | Ikeda et al. | | |
| 2009/0053488 A1* | 2/2009 | Jinde et al. | | 428/213 |
| 2010/0253214 A1* | 10/2010 | Imai et al. | | 313/504 |

FOREIGN PATENT DOCUMENTS

| | | |
|---|---|---|
| EP | 1734038 | * 12/2006 |
| JP | 11-329748 | 11/1999 |
| JP | 2001-052870 | 2/2001 |
| JP | 2003-45676 | 2/2003 |
| JP | 2003-272860 | 9/2003 |
| JP | 2004-047447 | 2/2004 |
| JP | 2005-093401 | 4/2005 |
| JP | 2005-101008 | 4/2005 |
| JP | 2005-123094 | 5/2005 |
| JP | 2006-66890 | 3/2006 |
| JP | 2007-258362 | 10/2007 |
| WO | 2007/099802 | 9/2007 |

* cited by examiner

OTHER PUBLICATIONS

International Search Report dated May 27, 2009, for corresponding Patent Application PCT/JP2009/056861.

*Primary Examiner* — Dawn Garrett
(74) *Attorney, Agent, or Firm* — K&L Gates LLP

(57) ABSTRACT

An organic electroluminescent includes an organic layer with a total thickness of 150 nm or over is included between an anode and a cathode. The organic layer includes a light-emitting layer containing a host material of a polycyclic aromatic hydrocarbon compound with a basic skeleton having three to seven ring members, and hole supply layers arranged between the anode and the light-emitting layer and having a smaller thickness than a thickness of the light-emitting layer.

13 Claims, 8 Drawing Sheets

[d1] > [d2]

0.9 > [d1]/[da] > 0.3

ORGANIC ELECTROLUMINESCENT ELEMENT AND DISPLAY

CROSS REFERENCE TO RELATED APPLICATIONS

The present application is a National Stage of International Application No. PCT/JP2009/056861 filed on Apr. 2, 2009 and which claims priority to Japanese Patent Application No. 2008-096883 filed on Apr. 3, 2008, and Japanese Patent Application No. 2009-058987 filed on Mar. 12, 2009, the entire contents of which are being incorporated herein by reference.

BACKGROUND

The present disclosure relates to an organic electroluminescent element (organic EL element) and a display, and more specifically to an organic EL element and a display which include a light-emitting layer including an anthracene derivative.

An organic EL element utilizing electroluminescence (hereinafter referred to as EL) of an organic material is configured by arranging an organic layer, which is formed by laminating an organic hole transport layer or an organic light-emitting layer, between an anode and a cathode, and the organic EL element attracts attention as a light-emitting element capable of emitting light with high luminance by a low-voltage DC drive.

FIG. 10 is a sectional view illustrating one configuration example of such an organic EL element. An organic EL element 51 is arranged on a transparent substrate 52 made of, for example, glass or the like, and is configured of an anode 53, an organic layer 54 and a cathode 55. The organic layer 54 has a configuration in which a hole injection layer 54a, a hole transport layer 54b, a light-emitting layer 54c and an electron transport layer 54d are laminated in order from the anode 53 side. Moreover, in addition to the above, there is an organic EL element configured by laminating the cathode 55, the organic layer 54 and the anode 53 in order from a substrate side.

In the organic EL element 51 with such a configuration, electrons injected from the cathode 55 and holes injected from the anode 53 are recombined in the light-emitting layer 54c, and light generated by recombination of the electrons and the holes is extracted through the anode 53 or the cathode 55.

In the organic layer 54 configuring the above-described organic EL element 51, the light-emitting layer 54c often uses a host material of an anthracene derivative to which a dopant (a guest material) as a luminescent center is added. The anthracene derivative has a higher electron-transport property than a hole-transport property. Therefore, in the light-emitting layer 54c using the anthracene derivative, an electron-hole recombination region is concentrated on the anode 53 side. Therefore, while high luminous efficiency is obtainable, electron leakage to the hole transport layer 54b easily occurs, and such electron leakage is one factor in a decline in life characteristics of the organic EL element 51.

Therefore, as an attempt to adjust a carrier balance in a whole element, there is disclosed an organic EL element with a configuration in which a layer with a high hole-transport property is arranged between the light-emitting layer 54c and the electron transport layer 54d (for example, refer to PTL 1).

Moreover, in the above organic EL element 51, to prevent a short between the anode 53 and the cathode 55 so as to reduce the occurrence of light emission failures, the organic layer 54 needs a certain or larger thickness. Typically, the thickness of the hole transport layer 54b exhibiting high mobility is increased to secure the thickness of the whole organic layer 54 (for example, refer to PTL 2). In addition, there is proposed an organic EL element with a configuration in which the electron transport layer 54d is doped with an active metal so as to have high mobility and the thickness of the electron transport layer 54d is increased (for example, refer to PTL 3).

CITATION LIST

Patent Literature

[PTL 1] Japanese Unexamined Patent Application Publication No. 2006-66890
[PTL 2] Japanese Unexamined Patent Application Publication No. 2005-101008
[PTL 3] Japanese Unexamined Patent Application Publication No. 2005-123094

SUMMARY

However, in an organic EL element (PTL 1) in which a layer with a high hole-transport property is arranged between a light-emitting layer and an electron transport layer, an electron-transport property to the light-emitting layer declines. Therefore, current efficiency is decreased due to an increase in drive voltage and a lack of carriers, and as a result, an effect of improving life characteristics is low.

Moreover, in an organic EL element (PTL 2) securing the thickness of an organic layer by increasing the thickness of a hole transport layer, while the hole transport layer exhibits high mobility, a drive voltage is easily increased, and it is difficult to deposit the organic layer to a certain or larger thickness. In an organic EL element (PTL 3) securing the thickness of an organic layer by increasing the thickness of an electron transport layer doped with an active metal, the organic EL element is allowed to become an element with a low drive voltage, but the active metal is diffused to outside of the electron transport layer during the element is driven; therefore, the organic EL element becomes a quenching site and the life of the organic EL element is reduced.

The present embodiments provide an organic EL element having good luminous efficiency and good life characteristics while securing a certain thickness of a whole organic layer to prevent the occurrence of a light emission failure, and to provide a display using the organic EL element.

An organic EL element of an embodiment includes an organic layer with a total thickness of 150 nm or over between an anode and a cathode. The organic layer includes a light-emitting layer, and the light-emitting layer contains a host material of a polycyclic aromatic hydrocarbon compound with a basic skeleton having three to seven ring members. Moreover, the organic layer includes a hole supply layer arranged between the anode and the light-emitting layer and having a smaller thickness than a thickness of the light-emitting layer.

A display of an embodiment is formed by arranging organic EL elements with such a configuration on a substrate.

In the organic EL element with such a configuration and the display, as the thickness of the hole supply layer is relatively thinner than the thickness of the light-emitting layer, a hole supply amount from the anode side to the light-emitting layer is increased. Thereby, a carrier supply amount is allowed to be sufficiently secured without excess and deficiency of holes and electrons. Therefore, high luminous efficiency is obtainable as will be described in the following working examples. Moreover, because of no excess and no deficiency of holes and electrons, it is less likely to lose a carrier balance, and drive deterioration is preventable and light emission life is allowed to be increased.

Moreover, as will be described in the following working examples, even if the total thickness of the organic layer is as large as 150 nm or over, a drive voltage is allowed to be kept low. Thereby, a foreign substance on the substrate is allowed to be covered with an organic film with a large thickness so that it is less likely to cause a short between the anode and the cathode, and a pixel not emitting light is not formed. Therefore, production yields of the organic EL element are allowed to be improved.

Thus, according to the organic EL element and the display of the invention, while a certain total thickness of the whole organic layer is secured to prevent the occurrence of a light emission failure, an organic EL element with good luminous efficiency and good life characteristics is obtainable. As a result, a display with low power consumption and good long-term reliability is allowed to be efficiently produced and achieved.

Additional features and advantages are described herein, and will be apparent from, the following Detailed Description and the figures.

DETAILED DESCRIPTION

Figure 1:
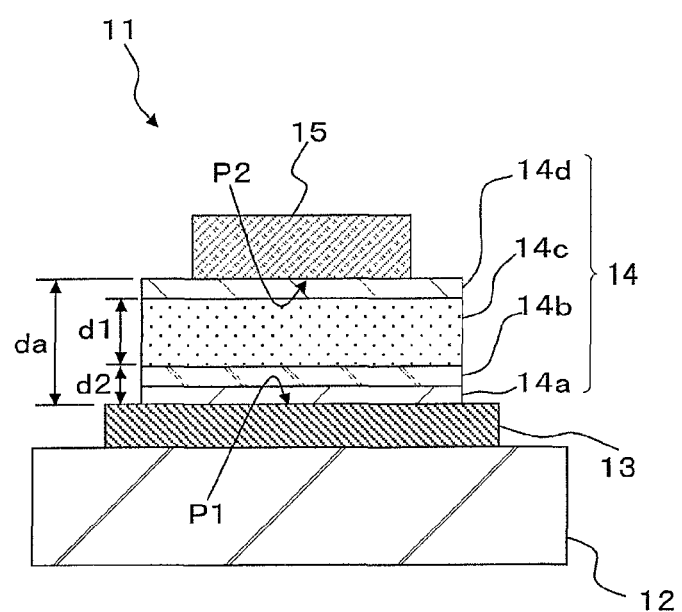
FIG. 1 is a sectional view illustrating an organic EL element according to an embodiment.

An embodiment will be described below in the following order.
1. Whole configuration of organic EL element
2. Configuration of substrate
3. Configuration of anode
4. Configuration of cathode
5. Whole configuration of organic layer
6. Materials of organic layer
7. Thickness configuration of organic layer
8. Configuration of display
9. Application Examples 1. Whole Configuration of Organic EL Element FIG. 1 illustrates one configuration example an embodiment of an organic EL element. An organic EL element 11 includes an anode 13 arranged on a substrate 12, an organic layer 14 arranged so as to be laminated on the anode 13, and a cathode 15 arranged on the organic layer 14.

The organic EL element 11 is a top emission system in which emitted light generated by recombining holes injected from the anode 13 and electrons injected from the cathode 15 in a light-emitting layer 14c is extracted from the cathode 15 side opposite to the substrate 12.

2. Configuration of Substrate

As the substrate 12, one selected as necessary from a transparent substrate such as glass, a silicon substrate, and further a film-shaped flexible printed circuit or the like is used. Moreover, in the case where the drive system of a display configured with use of the organic EL element 11 is an active matrix system, as the substrate 12, a TFT (Thin Film Transistor) substrate configured by arranging a TFT for each pixel is used. In this case, the display has a configuration in which the top emission system organic EL element 11 is driven with use of the TFT.

3. Configuration of Anode

As the anode 13 arranged as a lower electrode on the substrate 12, an anode having a large work function relative to the vacuum level of an electrode material is used to efficiently inject holes. For example, chromium (Cr), gold (Au), an alloy of tin oxide ($SnO_2$) and antimony (Sb), an alloy of zinc oxide (ZnO) and aluminum (Al), a silver (Ag) alloy, and further oxides and the like of these metals and alloys may be used singly or in mixture.

In the top emission system organic EL element 11, the anode 13 is made of a high-reflectivity material so that light extraction efficiency to outside is allowed to be improved by an interference effect and a high-reflectivity effect. Such an electrode material is preferably used for, for example, an electrode including Al, Ag or the like as a main component. Also, carrier injection efficiency is allowed to be improved by arranging a transparent electrode material layer with a large work function such as ITO (Indium Tin Oxide) on a high-reflectivity material layer.

Moreover, when the anode 13 is made of an Al alloy, and, for example, a metal such as neodymium having a relatively smaller work function than Al which is a main component is used as an accessory component, the stability of the Al alloy is improved, and a stable anode with high reflectivity is achievable. In this case, the anode generally have a smaller work function than an anode configured of a transparent electrode material layer having a large work function such as ITO, and a hole-injection barrier is often increased only in the case where an amine-based hole injection layer typically used is provided. Therefore, when a layer made of an amine material mixed with an acceptor material such as F4TCNQ (2,3,5,6-Tetrafluoro-7,7,8,8-tetracyanoquinodimethane), or a so-called p-doped layer such as PEDOT-PSS (polyethylene dioxythiophene-polystyrene sulphonate) is formed in an anode interface, or when an azatriphenylene derivative which will be described later is used, a low drive voltage is obtainable. In particular, in terms of element stability and a low drive voltage, the azatriphenylene derivative is preferable.

In addition, in the case where the drive system of the display configured with use of the organic EL element 11 is an active matrix system, the anode 13 is patterned in each pixel where the TFT is arranged. Then, an insulating film which is not illustrated herein is arranged on a top surface of the anode 13, and a surface of the anode 13 in each pixel is exposed through an opening section of the insulating film.

4. Configuration of Cathode

On the other hand, the cathode 15 is formed of a material having a small work function, and includes a layer in contact with the organic layer 14, and has good light transmissibility. For example, the cathode 15 has a configuration in which a first layer 15a and a second layer 15b are laminated in order from the anode 13 side.

The first layer 15a is configured with use of a material having a small work function and good light transmissibility. Examples of such a material include alkali metal oxides such as $Li_2O$, $Cs_2Co_3$, $Cs_2SO_4$, MgF, LiF and $CaF_2$, alkali metal fluorides, alkali earth metal oxides, and alkali earth fluorides. Moreover, the second layer 15b is configured of a material having light transmissibility and good electrical conductivity such as a thin-film MgAg electrode or a thin-film Ca electrode. Further, specifically in the case where the organic EL element 11 is a top emission light-emitting element configured of a resonator configuration in which emitted light is resonated between the anode 13 and the cathode 15 to be extracted, for example, the second layer 15b is configured with use of a semi-transparent reflective material such as Mg—Ag, so that emitted light is resonated between the second layer 15b and the anode 13. Moreover, the second layer 15b is made of, for example, a transparent SiNx compound, and is formed as a sealing electrode for preventing degradation of an electrode.

The first layer 15a and the second layer 15b are formed by a technique such as a vacuum deposition method, a sputtering method or a plasma CVD (Chemical Vapor Deposition) method. Moreover, in the case where the drive system of the display configured with use of the organic EL element is an active matrix system, the cathode 15 may be formed on the whole substrate 12 so as to be insulated from the anode 13 by an insulating film (not illustrated), with which an outer edge of the anode 13 is coated, and the organic layer 14, and the cathode 15 may be used as a common electrode for pixels.

5. Whole Configuration of Organic Layer

The organic layer 14 between the anode 13 and the cathode 15 includes at least the light-emitting layer 14c. The organic layer 14 is configured by laminating a hole supply layer (herein, a hole injection layer 14a and a hole transport layer 14b), the light-emitting layer 14c and the electron transport layer 14d in order from the anode 13 side. The hole supply layer configured by laminating the hole injection layer 14a and the hole transport layer 14b is a layer for supplying holes from the anode 13 to the light-emitting layer 14c. The electron transport layer 14d is a layer for supplying electrons from the cathode 13 to the light-emitting layer 14c.

Each of these layers is configured of an organic layer formed by, for example, a vacuum deposition method, or any other method such as a spin coat method.

The light-emitting layer 14c is a layer including a host material of a polycyclic aromatic hydrocarbon compound with a basic skeleton having three to seven ring members as will be described in detail later. The light-emitting layer 14c is a layer including such a host material as well as a luminous guest material. The luminous guest material may be contained in the whole light-emitting layer 14c, and as the host material configuring the light-emitting layer 14c with such a single-layer configuration, an anthracene derivative is preferably used.

The light-emitting layer 14c may contain the luminous guest material only in an area which is an actual light emission part on the anode 13 side in the light-emitting layer 14c, that is, only in a hole-electron recombination region. In this case, the light-emitting layer 14c has a laminate configuration including a layer which is an actual light emission part including the host material and the luminous guest material and a layer made of the host material in order from the anode 13 side.

In the light-emitting layer 14c with such a laminate configuration, a naphthacene derivative is preferably used as a host material configuring a light emission part (a recombination region) with the luminous guest material. As a host material configuring the layer not containing the luminous guest material, an anthracene derivative is preferably used.

Next, characteristics of the material and thickness of each of layers configuring the above organic layer 14 will be described below.

6. Materials of Organic Layer

First, the material configuration of each of layers configuring the organic layer 14 will be described in order of the light-emitting layer 14c and the electron transport layer 14d which are characteristic of the embodiment, and then the material configurations of the hole injection layer 14a and the hole transport layer 14b will be further described.

<Host Material of Light-Emitting Layer 14c>

One of characteristic configurations of the invention is that the light-emitting layer 14c contains, as a host material, a polycyclic aromatic hydrocarbon compound with a basic skeleton having three to seven ring members. As the basic skeleton of the polycyclic aromatic hydrocarbon compound configuring the host material, anthracene, pyrene, benzopyrene, chrysene, naphthacene, benzonaphthacene, dihenzonaphthacene, perylene, or coronene is selected.

Among them, an anthracene derivative containing, as a basic skeleton, anthracene represented by the following general expression (1) is preferably used as the host material.

[Chemical Expression 1]

General expression (1)

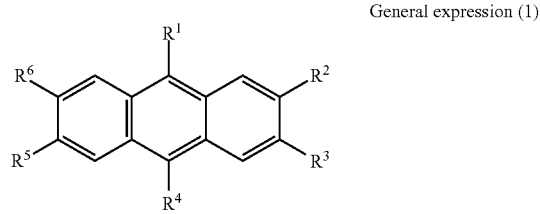

In the general expression (1), $R^1$ to $R^6$ independently represent hydrogen, halogen, a hydroxyl group, a carbonyl group with 20 or less carbon atoms which may have a substituent group, a carbonyl ester group with 20 or less carbon atoms which may have a substituent group, an alkyl group with 20 or less carbon atoms which may have a substituent group, an alkenyl group with 20 or less carbon atoms which may have a substituent group, an alkoxyl group with 20 or less carbon atoms which may have a substituent group, a cyano group, a nitro group, a silyl group with 30 or less carbon atoms which may have a substituent group, an aryl group with 30 or less carbon atoms which may have a substituent group, a heterocyclic group with 30 or less carbon atoms which may have a substituent group, or an amino group with 30 or less carbon atoms which may have a substituent group. In the case of the above-described groups which may have a substituent group, the number of carbon atoms includes carbon atoms in the substituent group.

Examples of the aryl group represented by $R^1$ to $R^6$ in the general expression (1) include a phenyl group, a 1-naphthyl group, a 2-naphthyl group, a fluorenyl group, a 1-anthryl group, a 2-anthryl group, 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group, a p-t-butylphenyl group and the like.

Moreover, the hetereocyclic group represented by $R^1$ to $R^6$ in the general expression (1) is a five- or six-membered ring aromatic heterocyclic group containing O, N and S as hetero atoms, or a condensed polycyclic aromatic heterocyclic group with 3 to 20 carbon atoms. Further, as the aromatic heterocyclic group and the condensed polycyclic aromatic heterocyclic group, a thienyl group, a furyl group, a pyrrolyl group, a pyridyl group, a quinolyl group, a quinoxalyl group, an imidazopyridyl group and a benzothiazole group are cited. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, and the like.

The amino group represented by $R^1$ to $R^6$ in the general expression (1) may be any one of an alkylamino group, an arylamino group, an aralkylamino group and the like. They preferably contain at least one of an aliphatic group with 1 to 6 carbon atoms in total and a monocyclic to tetracyclic aromatic carbon ring. Such groups include a dimethylamino group, a diethylamino group, a dibutylamino group, a diphenylamino group, a ditolylamino group, a bisbiphenylylamino group and a dinaphthylamino group.

In addition, two or more kinds of the above-described substituent groups may form a condensed ring, or may further include a substituent group.

As specific examples of the anthracene derivative suitable for the above host material, the following structural expressions (1)-1 to (1)-111 are exemplified.

[Chemical Expression 1-1]

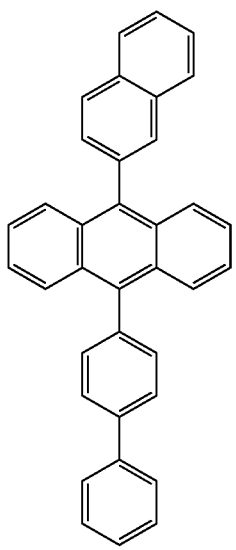

(1)-1

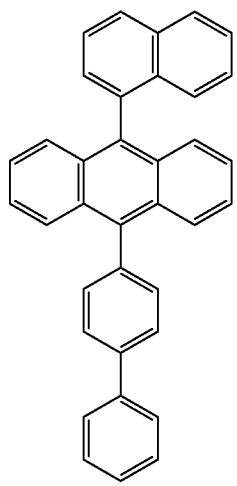

(1)-2

(1)-3
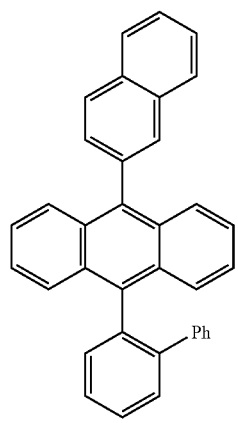
(1)-4
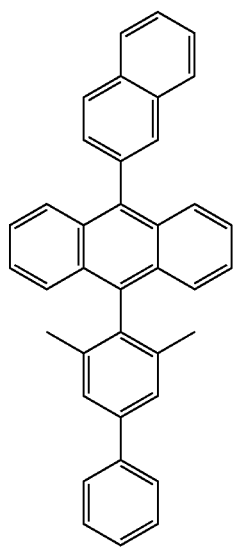
(1)-5
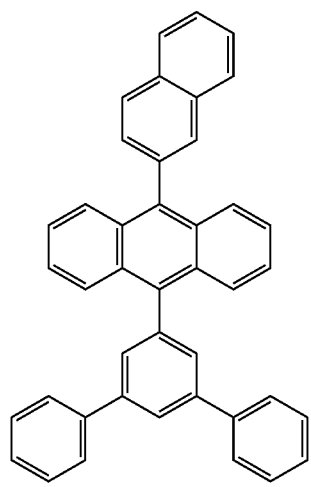
(1)-6
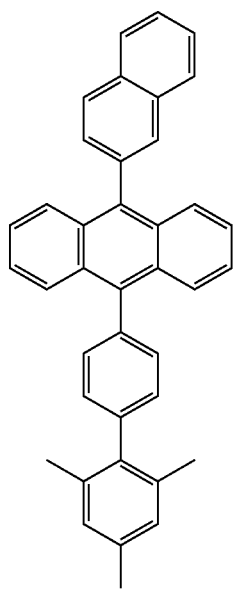

-continued
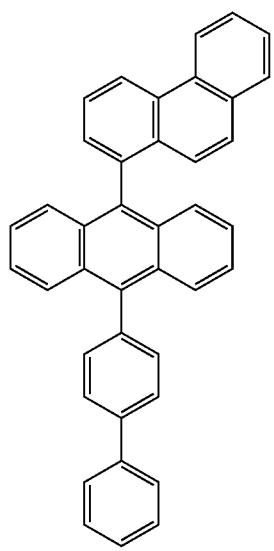
(1)-7
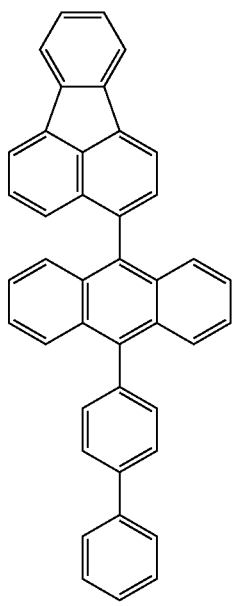
(1)-8
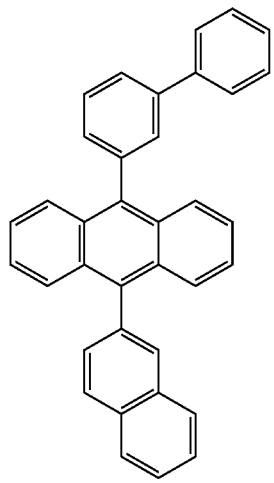
(1)-9
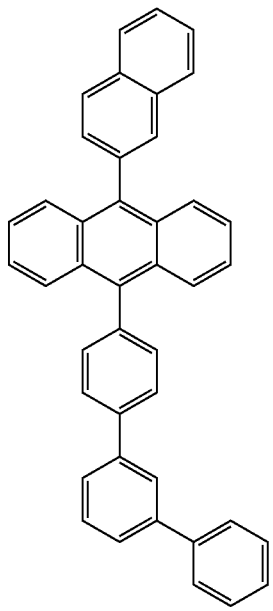
(1)-10

-continued
(1)-11
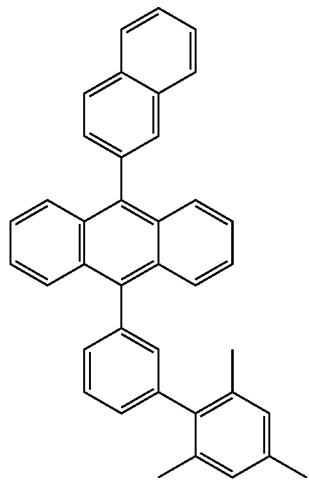
(1)-12
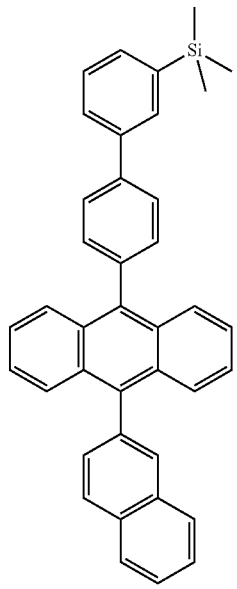
(1)-13
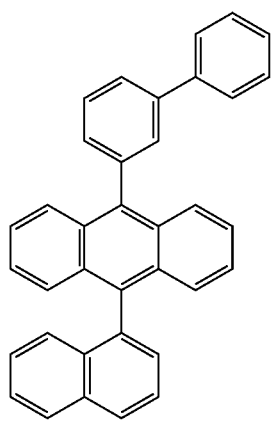
(1)-14
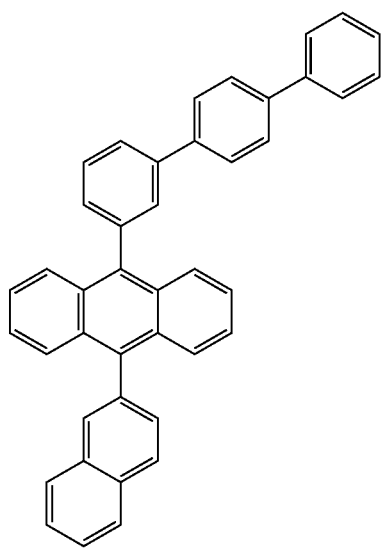

[Chemical Expression 1-2]
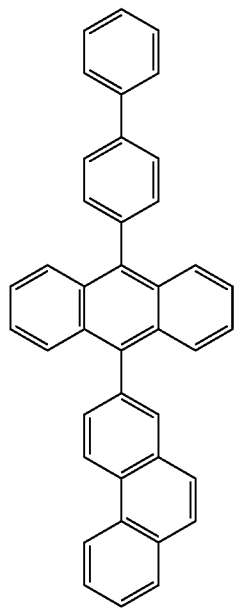
(1)-15
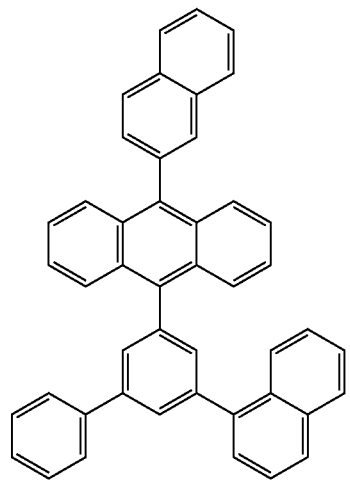
(1)-16
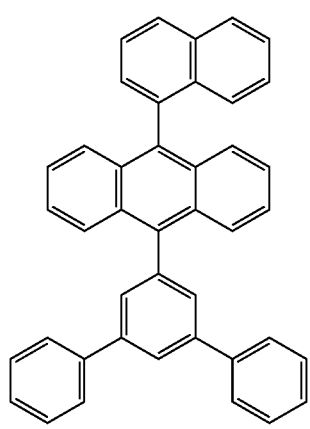
(1)-17
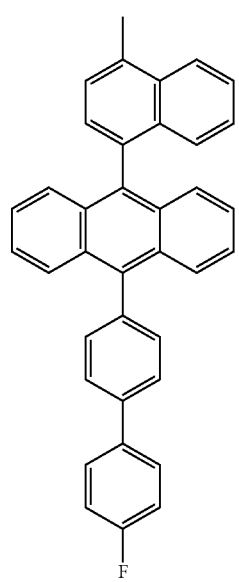
(1)-18

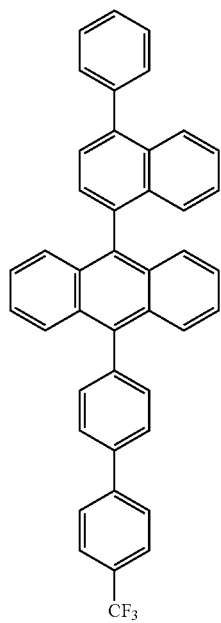
(1)-19
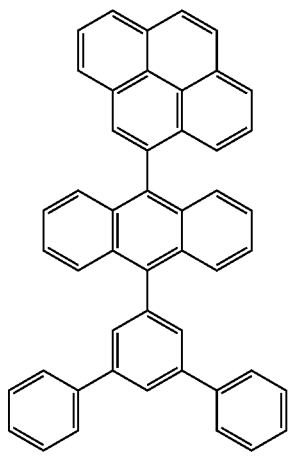
(1)-20
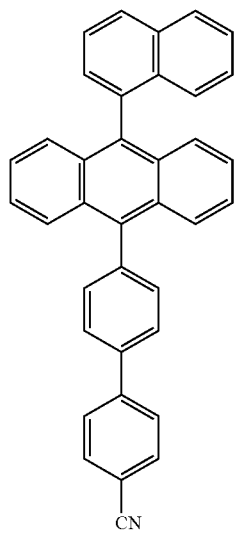
(1)-21
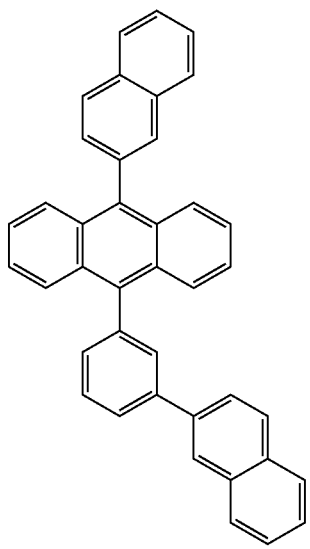
(1)-22

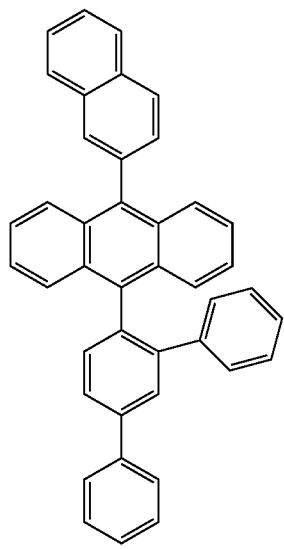
(1)-23
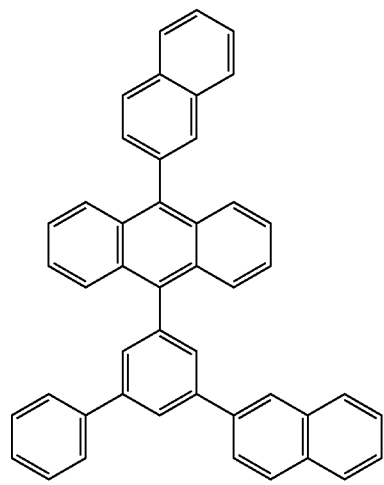
(1)-24
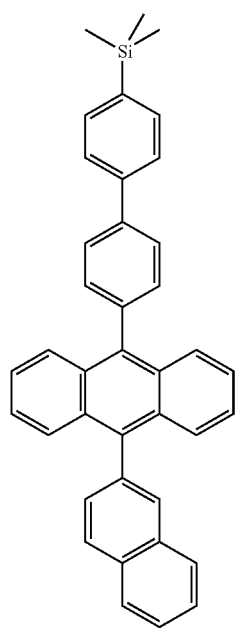
(1)-25

[Chemical Expression 1-3]
(1)-26
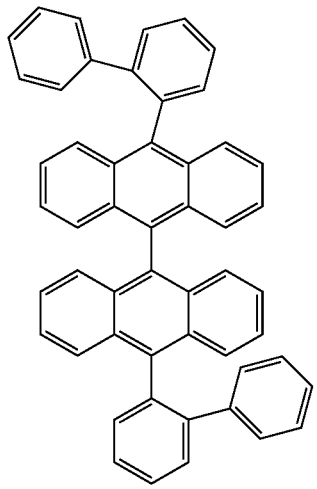
(1)-27
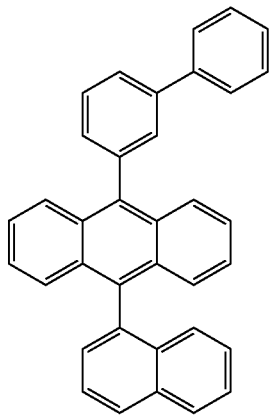
(1)-28
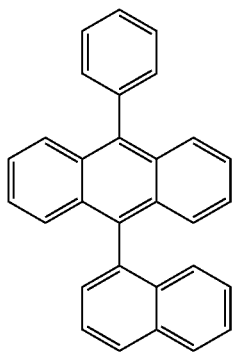
(1)-29
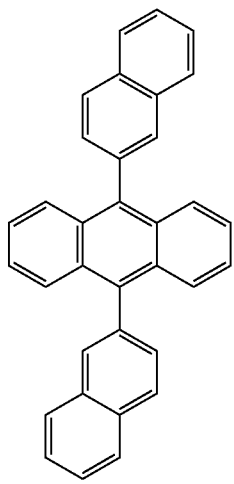
(1)-30
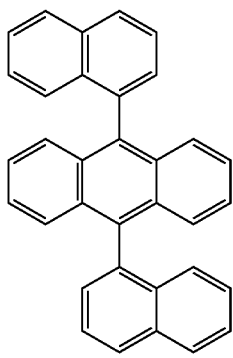
(1)-31
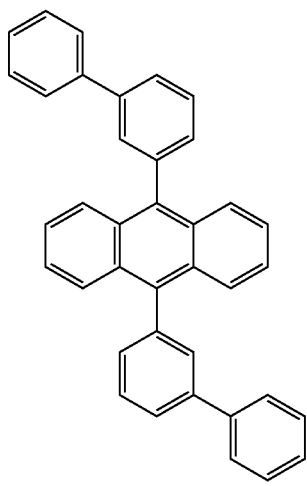

(1)-32
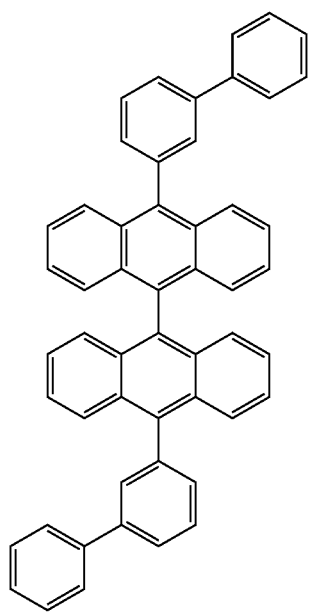
(1)-33
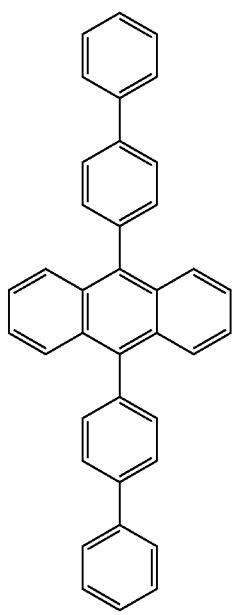
(1)-34
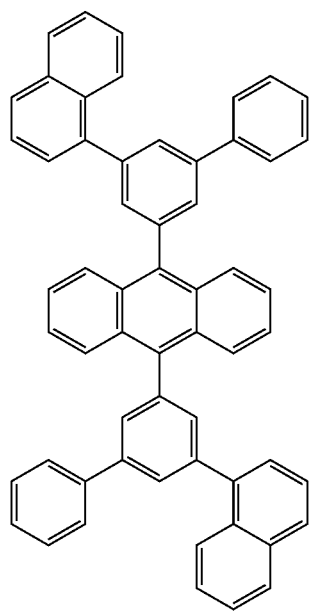
(1)-35
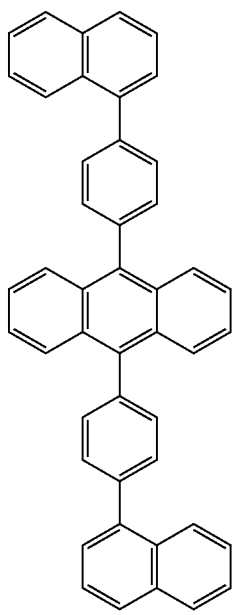

-continued
(1)-36
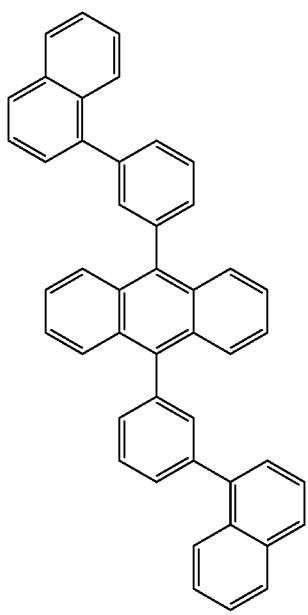
(1)-37
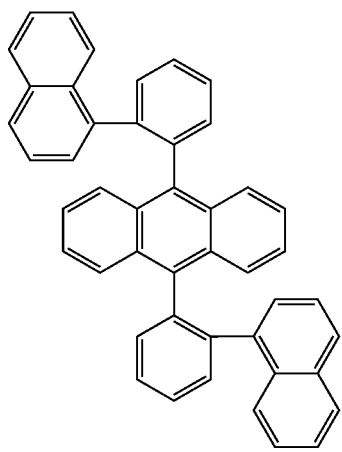
[Chemical Expression 1-4]
(1)-38
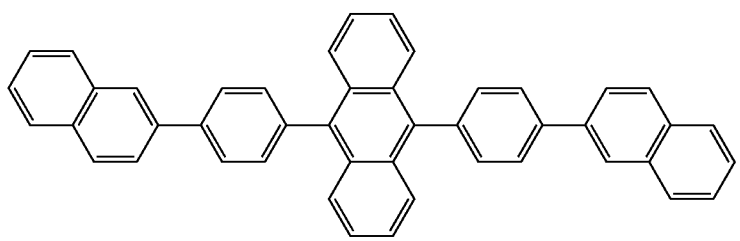
(1)-39
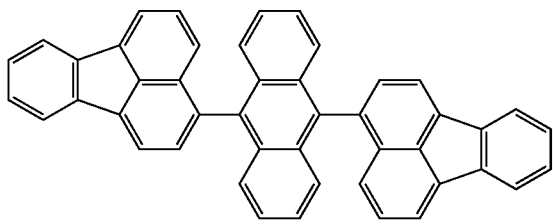
(1)-40
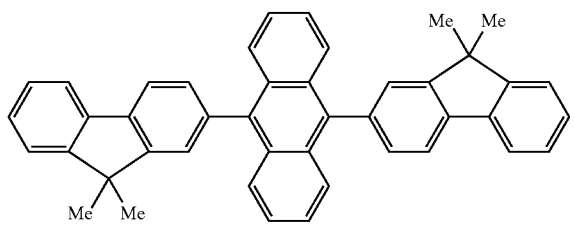
(1)-41
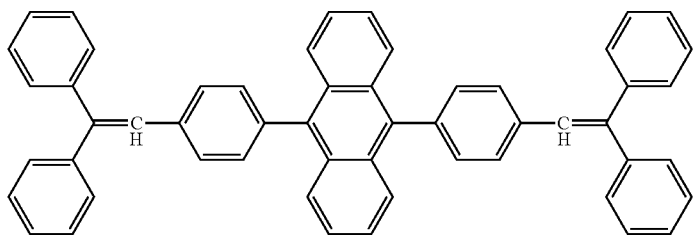

-continued
(1)-42
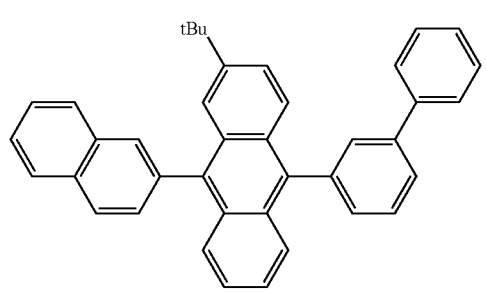
(1)-43
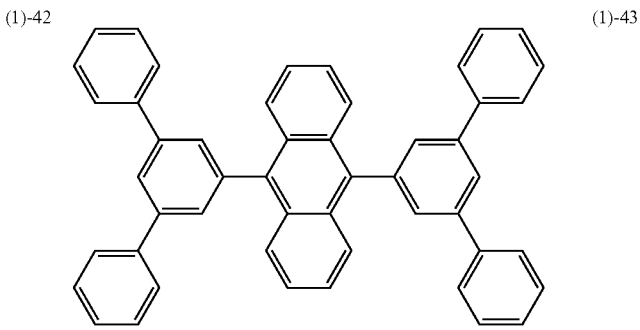
(1)-44
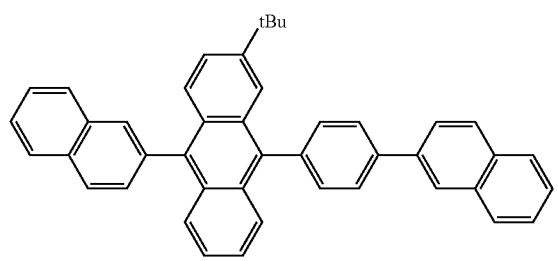
(1)-45
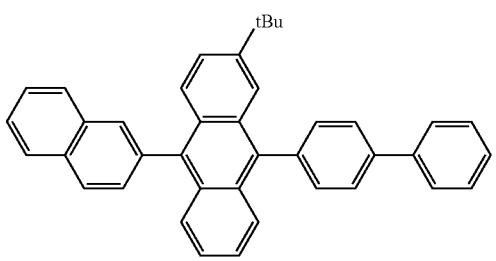
(1)-46
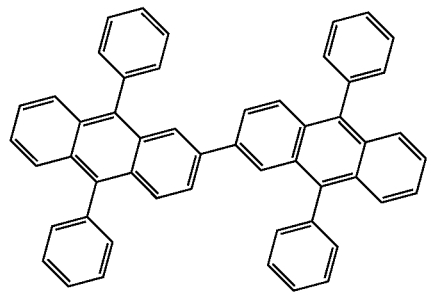
(1)-47
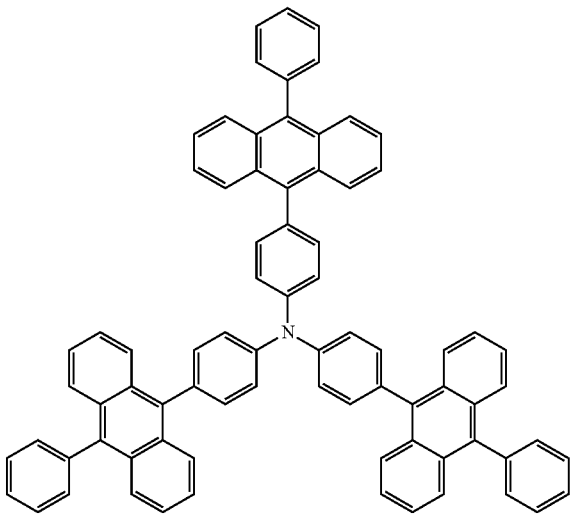
(1)-48
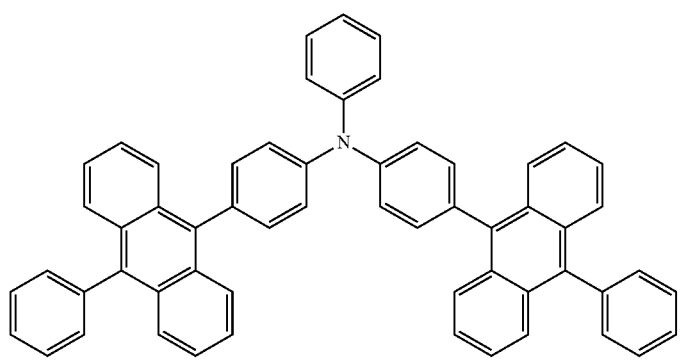

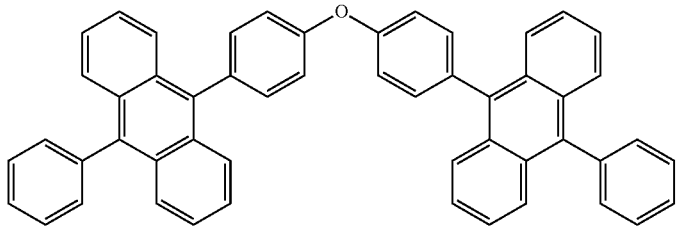
(1)-49
[Chemical Expression 1-5]
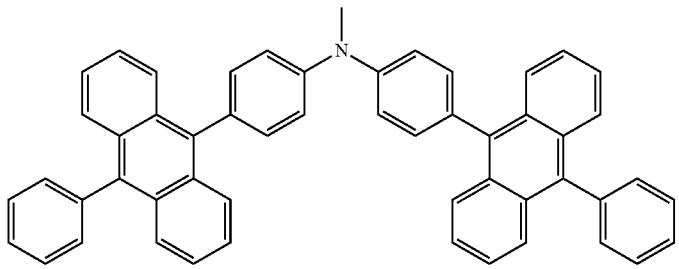
(1)-50
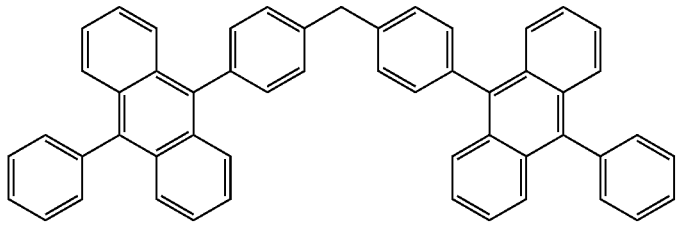
(1)-51
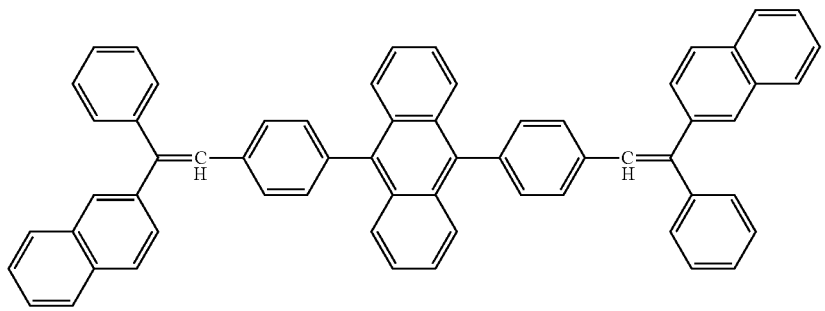
(1)-52
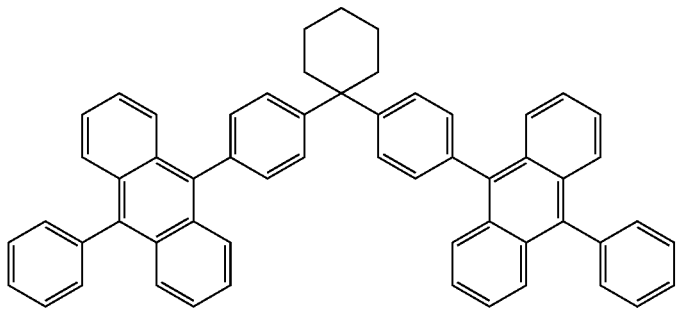
(1)-53

-continued
(1)-54
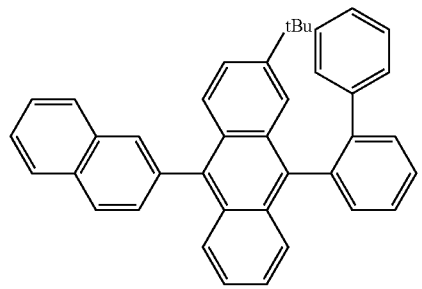
(1)-55
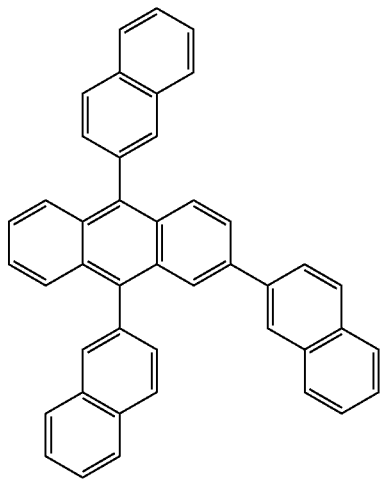
(1)-56
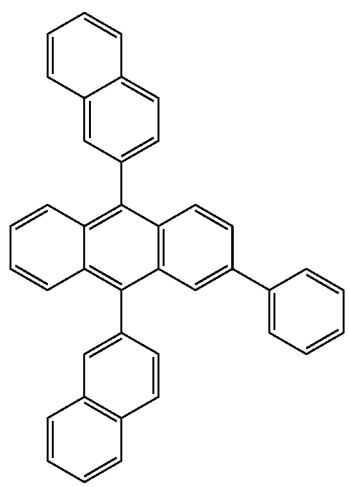
(1)-57
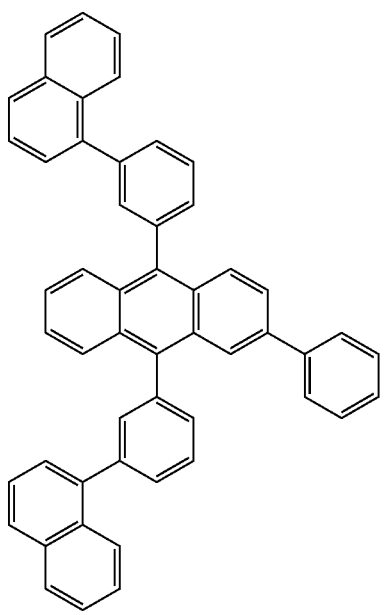

-continued
(1)-58
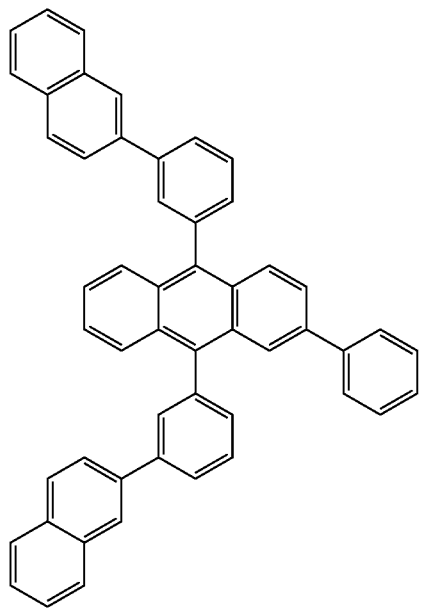
(1)-59
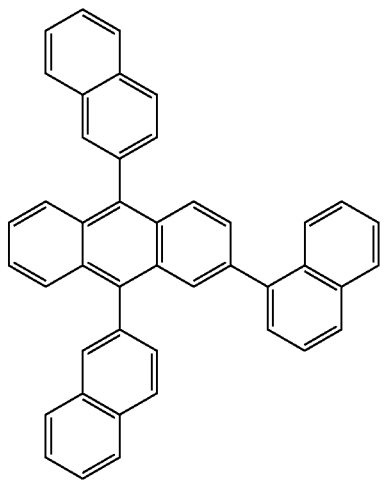
[Chemical FOmrul al-6]
(1)-60
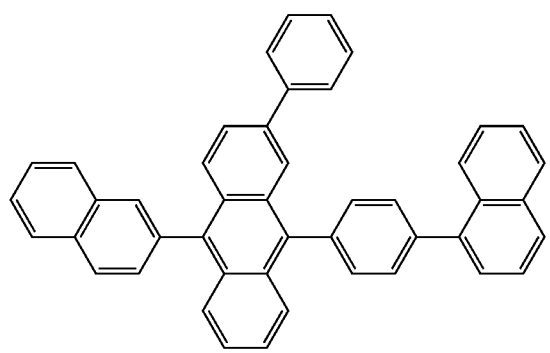
(1)-61
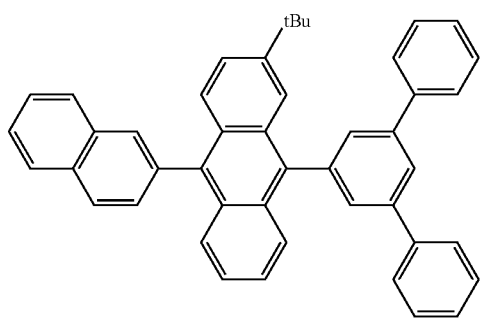
(1)-62
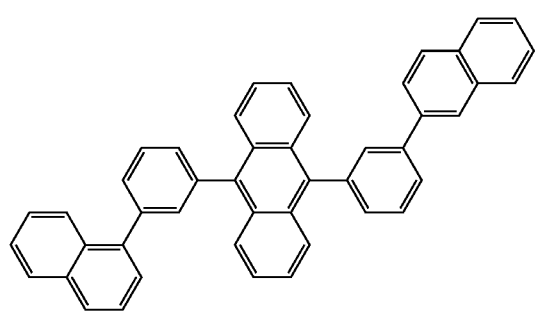
(1)-63
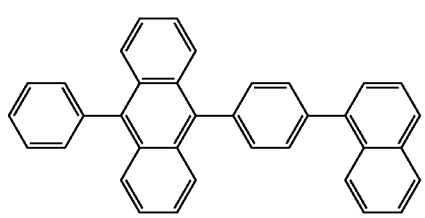
(1)-64
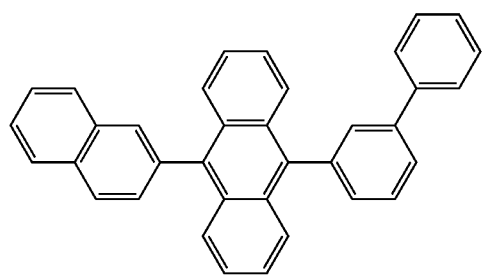
(1)-65
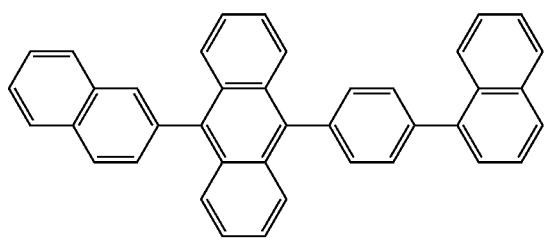

(1)-66
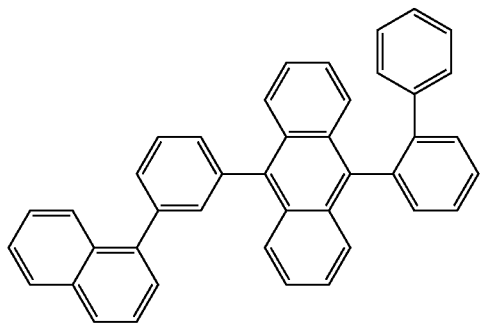
(1)-67
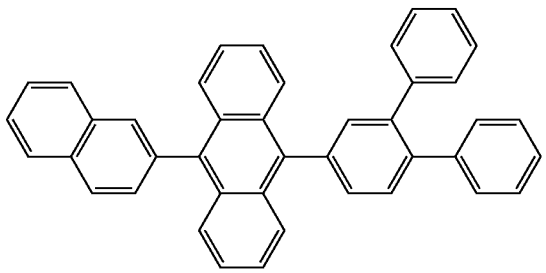
(1)-68
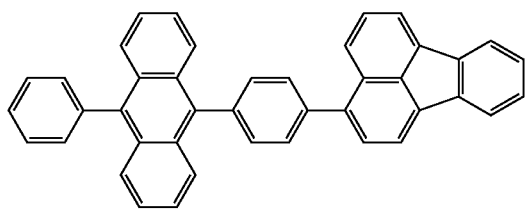
(1)-69
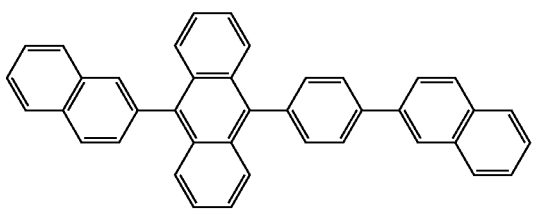
(1)-70
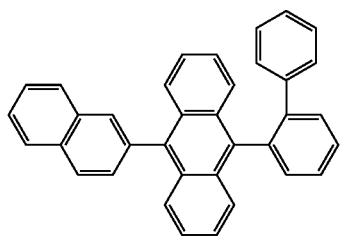
(1)-71
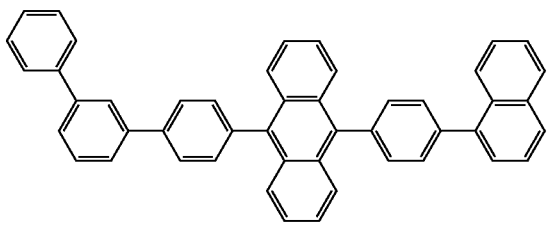
(1)-72
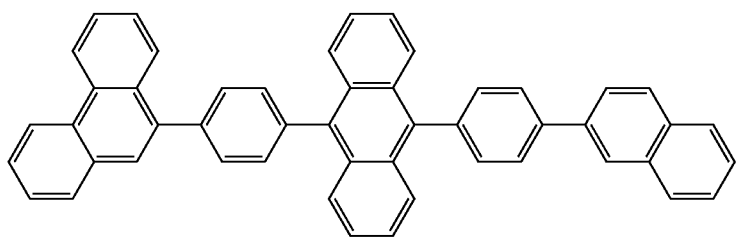
(1)-73
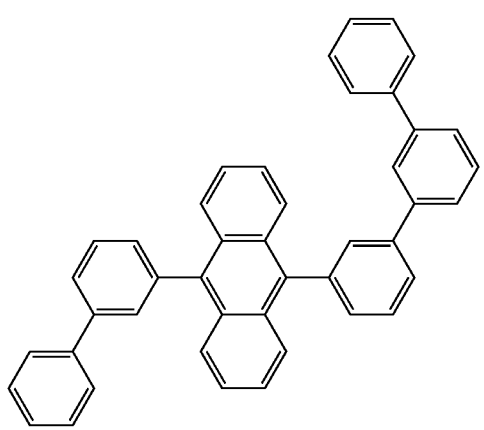

[Chemical Expression 1-7]
(1)-74
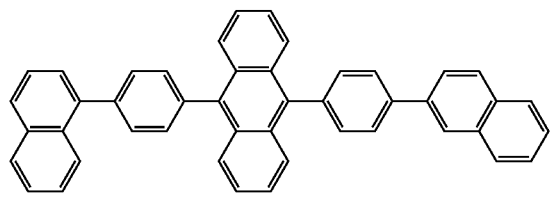
(1)-75
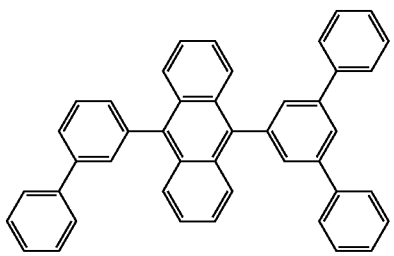
(1)-76
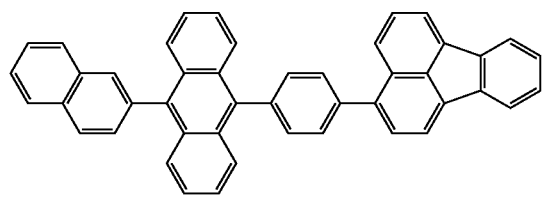
(1)-77
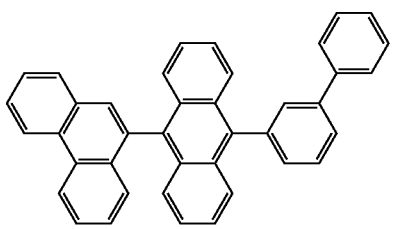
(1)-78
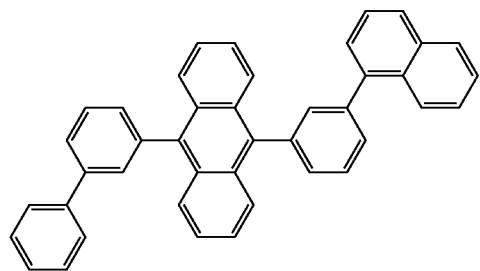
(1)-79
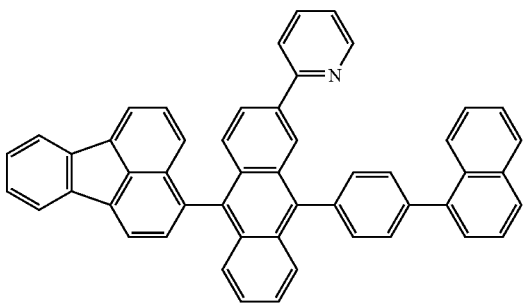
(1)-80
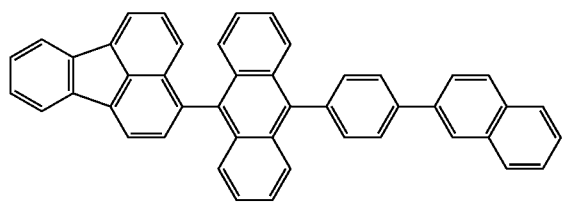
(1)-81
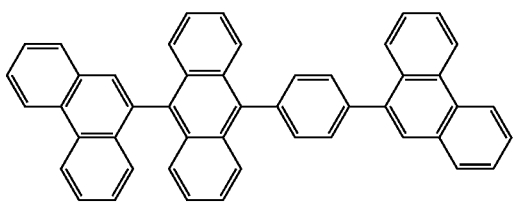
(1)-82
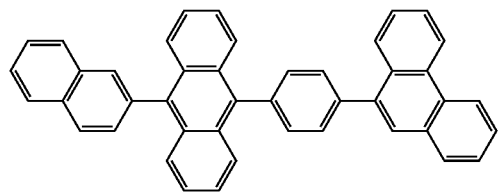
(1)-83
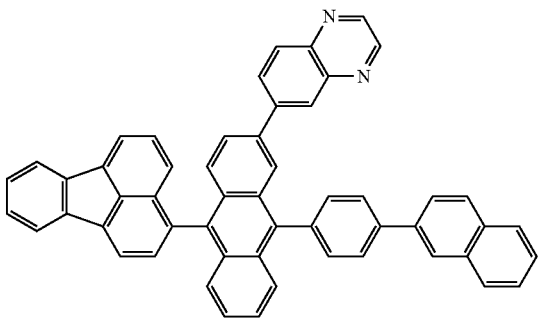

(1)-84
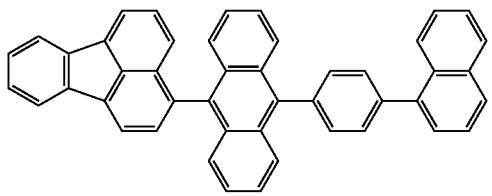
(1)-85
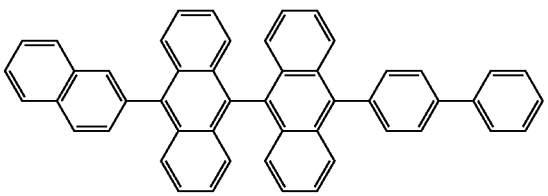
(1)-86
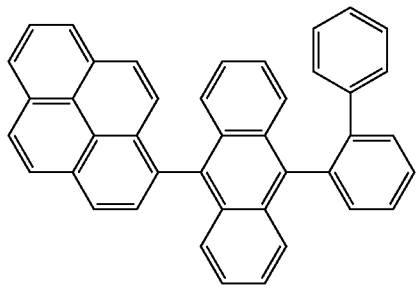
(1)-87
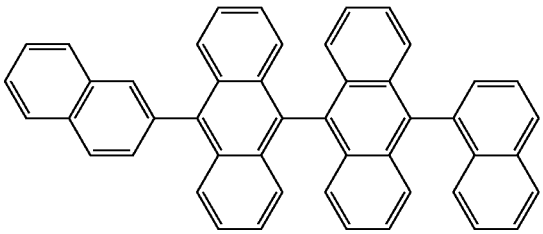
(1)-88
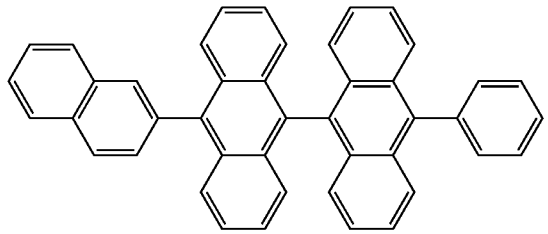
[Chemical Expression 1-8]
(1)-89
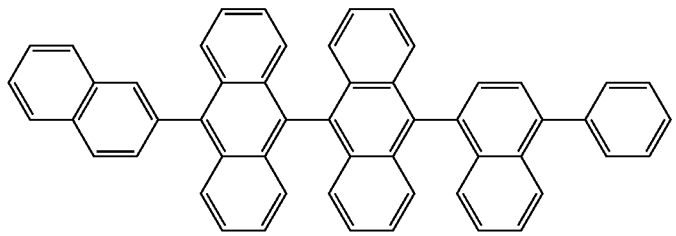
(1)-90
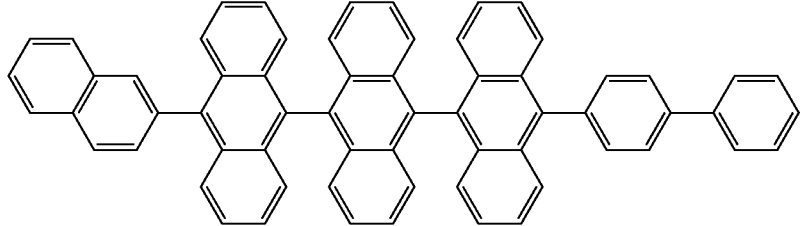
(1)-91
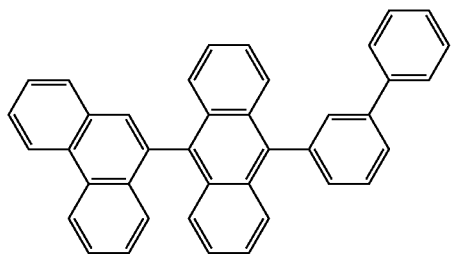
(1)-92
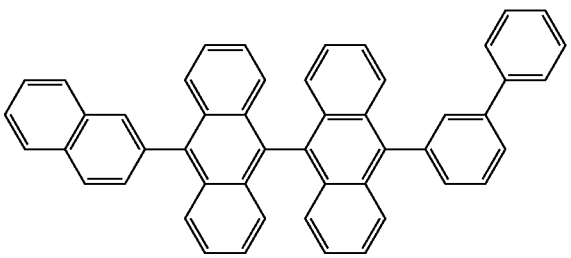

-continued
(1)-93
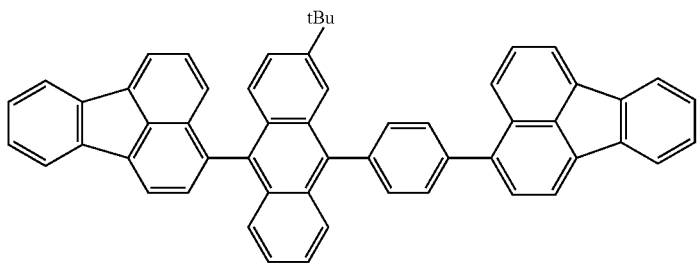
(1)-94
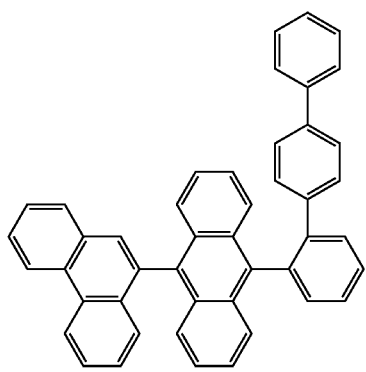
(1)-95
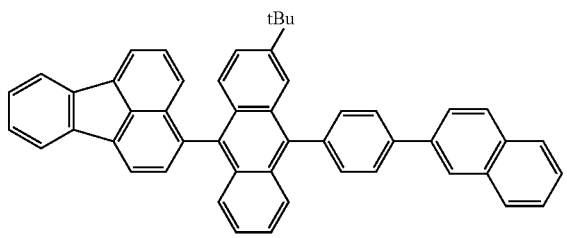
(1)-96
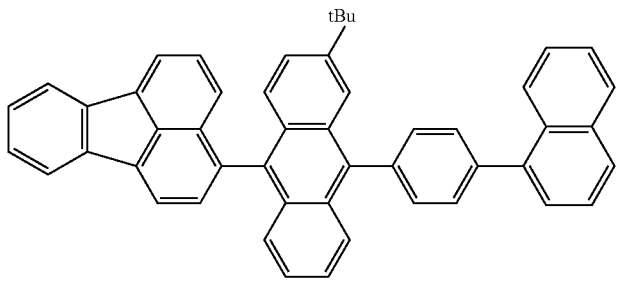
(1)-97
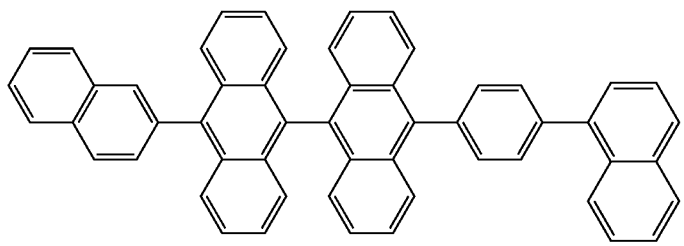
(1)-98
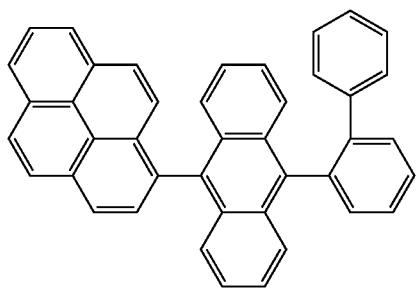
(1)-99
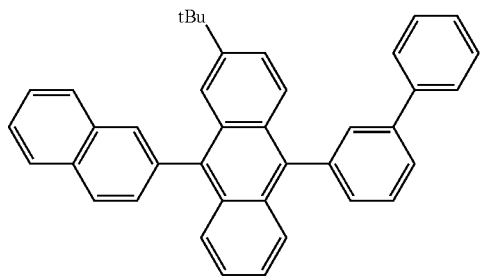

[Chemical Expression 1-9]
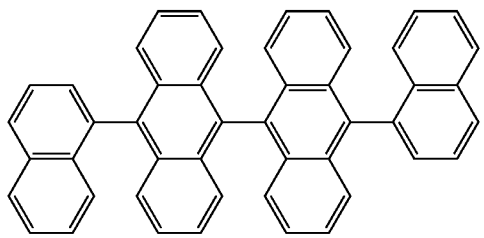
(1)-100
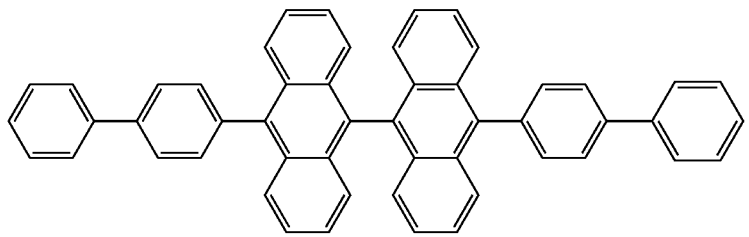
(1)-101
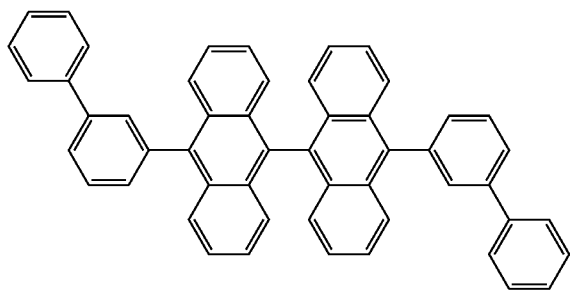
(1)-102
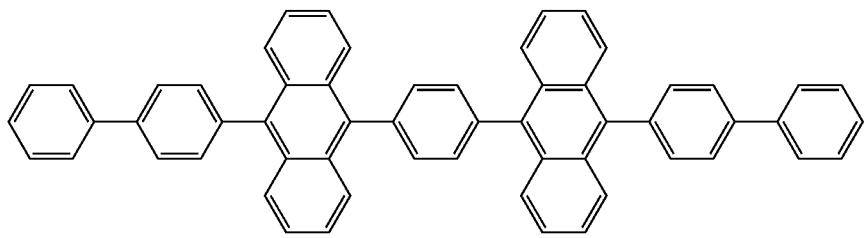
(1)-103
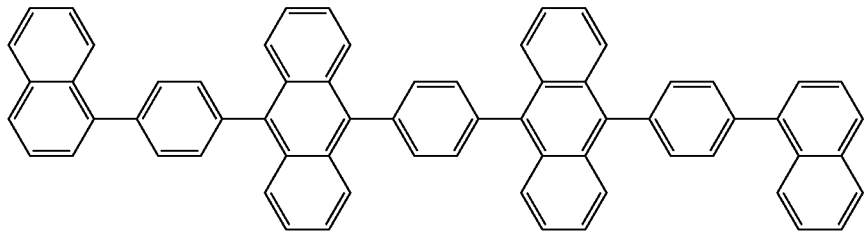
(1)-104
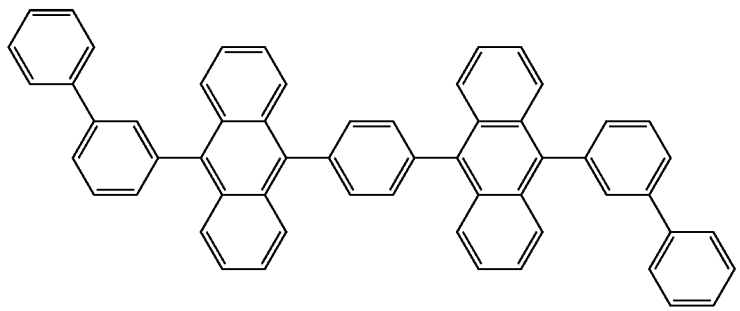
(1)-105

-continued
(1)-106
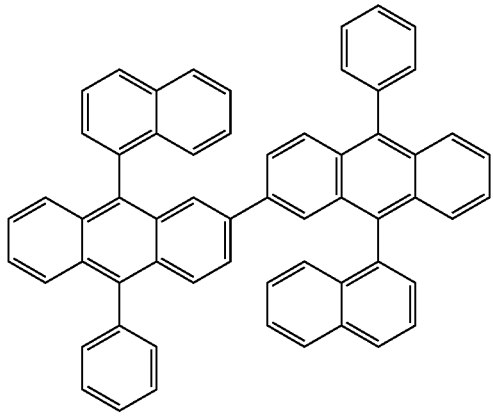
(1)-107
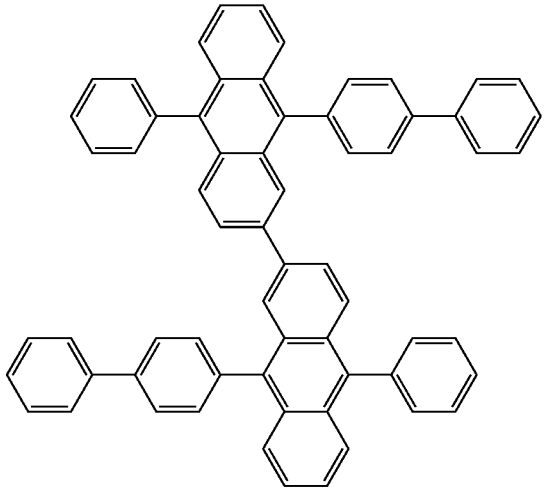
(1)-108
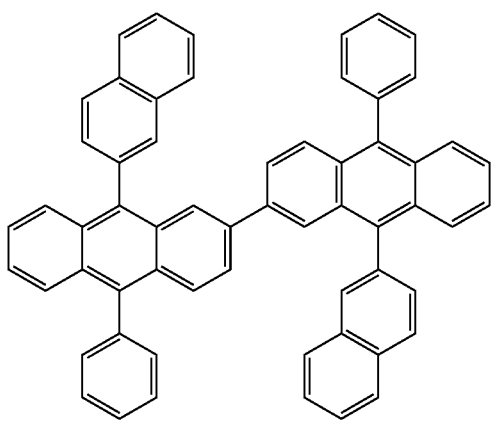
(1)-109
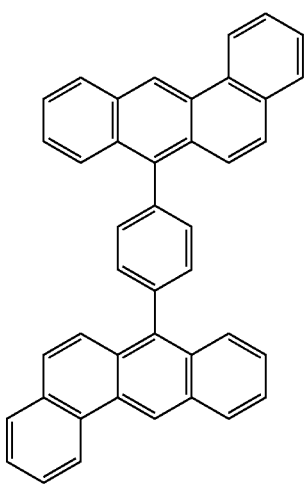
(1)-110
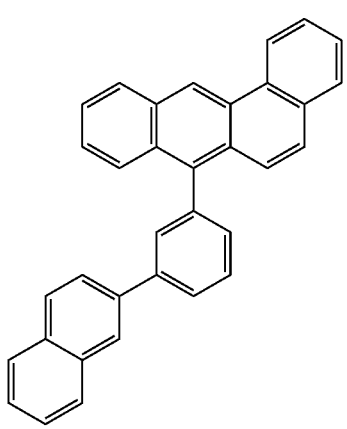

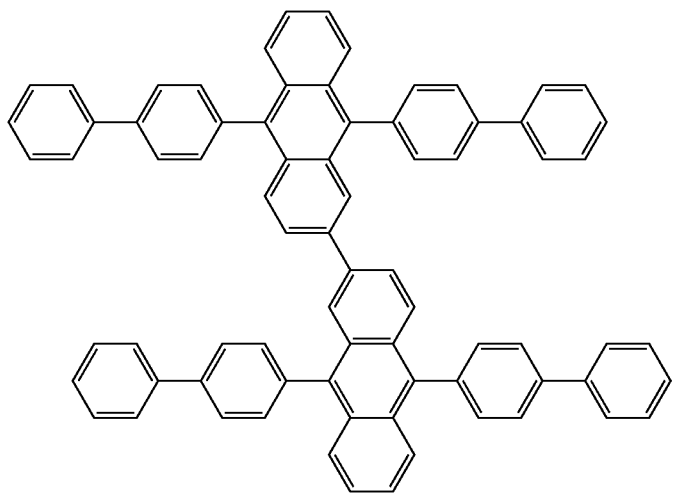

Such an anthracene derivative is preferably used as a host material in a configuration where the luminous guest material is contained in the whole light-emitting layer 14c. Moreover, the anthracene derivative is also preferably used as a host material of a layer (a part) not containing a luminous guest material in a configuration where a luminous guest material is contained only in a light emission part (a recombination region) of the light-emitting layer 14c.

Further, in particular, in the configuration where a luminous guest material is contained only in the light emission part (the recombination region) of the light-emitting layer 14c, a naphthacene derivative represented by the following general expression (1)' is preferably used as a host material used for the light emission part (the recombination region).

[Chemical Expression 2]

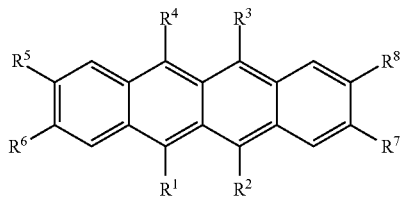

General expression (1)'

In the general expression (1)', $R^1$ to $R^8$ independently represent hydrogen, halogen, a hydroxyl group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a cyano group, a nitro group, a substituted or unsubstituted silyl group with 30 or less carbon atoms, a substituted or unsubstituted aryl group with 30 or less carbon atoms, a substituted or unsubstituted heterocyclic group with 30 or less carbon atoms or a substituted or unsubstituted amino group with 30 or less carbon atoms.

Examples of the aryl group represented by $R^1$ to $R^8$ in the general expression (1)' include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, an m-tolyl group, a p-tolyl group, a p-t-butylphenyl group, and the like.

Moreover, the heterocyclic group represented by $R^1$ to $R^8$ in the general expression (1)' is a five- or six-membered ring aromatic heterocyclic group containing O, N and S as hetero atoms, or a condensed polycyclic aromatic heterocyclic group with 2 to 20 carbon atoms. Further, as the aromatic heterocyclic group and the condensed polycyclic aromatic heterocyclic group, a thienyl group, a furyl group, a pyrrolyl group, a pyridyl group, a quinolyl group, a quinoxalyl group, an imidazopyridyl group and a benzothiazole group are cited. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, and the like.

The amino group represented by $R^1$ to $R^8$ in the general expression (1)' may be any one of an alkylamino group, an arylamino group, an aralkylamino group and the like. They preferably contain an aliphatic group with 1 to 6 carbon atoms in total and/or a monocyclic to tetracyclic aromatic carbon ring. Such groups include a dimethylamino group, a diethylamino group, a dibutylamino group, a diphenylamino group, a ditolylamino group, a bisbiphenylylamino group and a dinaphthyl amino group.

In addition, two or more kinds of the above-described substituent groups may form a condensed ring, or may further include a substituent group.

Moreover, in particular, the naphthacene derivative represented by the above-described general expression (1)' is preferably a rubrene derivative represented by the following general expression (1a)'.

[Chemical Expression 2-1]

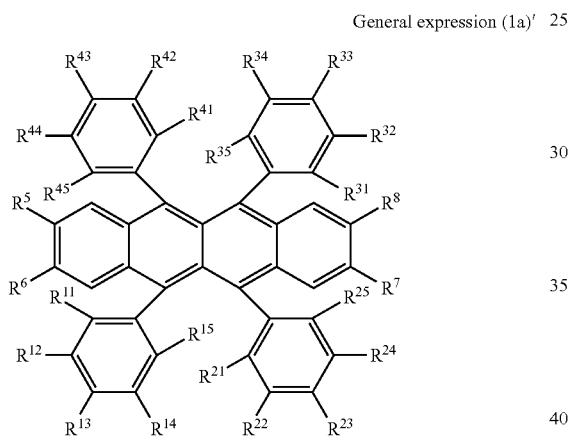

General expression (1a)'

In the general expression (1a)', $R^{11}$ to $R^{15}$, $R^{21}$ to $R^{25}$, $R^{31}$ to $R^{35}$, and $R^{41}$ to $R^{45}$ independently represent a hydrogen atom, an aryl group, a heterocyclic group, an amino group, an aryloxy group, an alkyl group or an alkenyl group. However, $R^{11}$ to $R^{15}$, $R^{21}$ to $R^{25}$, $R^{31}$ to $R^{35}$, and $R^{41}$ to $R^{45}$ are preferably the same as one another.

Moreover, $R^5$ to $R^8$ in the general expression (1a)' are independently a hydrogen atom, an aryl group which may have a substituent group, an alkyl group which may have a substituent group, or an alkenyl group which may have a substituent group.

Preferable modes of the aryl group, the heterocyclic group and the amino group in the general expression (1a)' may be the same as those of $R^1$ to $R^8$ in the general expression (1). In addition, in the case where $R^{11}$ to $R^{15}$, $R^{21}$ to $R^{25}$, $R^{31}$ to $R^{35}$, and $R^{41}$ to $R^{45}$ are amino groups, they are alkylamino groups, arylamino groups or aralkylamino groups. They preferably contain an aliphatic group with 1 to 6 carbon atoms in total or a monocyclic to tetracyclic aromatic carbon ring. Such groups include a dimethylamino group, a diethylamino group, a dibutylamino group, a diphenylamino group, a ditolylamino group, and a bisbiphenylylamino group.

Other more specific examples of the naphthacene derivative preferably used as the host material of the light-emitting layer 14c include rubrene represented by the following compound (1)'-1 which is one rubrene derivative in the general expression (1a)', and in addition to this, the following compounds (1)'-2 to (1)'-4 are exemplified.

[Chemical Expression 2-2]

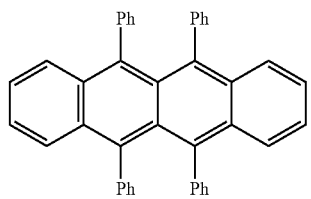

compound (1)'-1

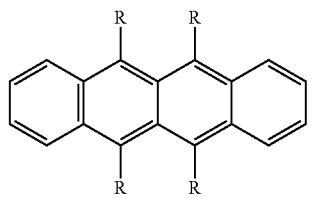

compound (1)'-2

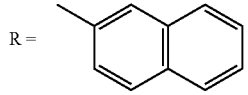

R =

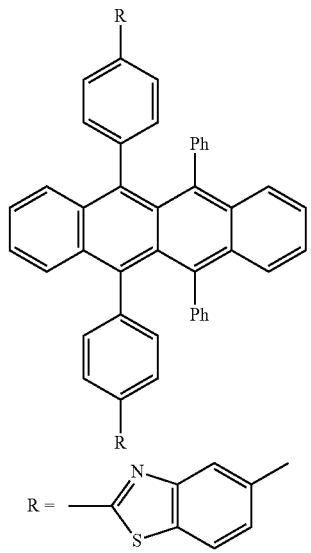

compound (1)'-3

R =

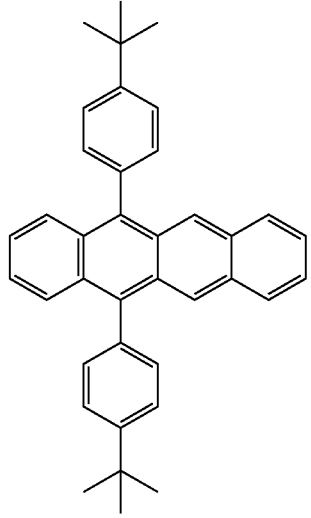

compound (1)'-4

<Luminous Guest Material of Light-Emitting Layer 14c>

As the luminous guest material configuring the light-emitting layer 14c, a fluorescent guest material or a phosphorescent guest material such as a low-molecular fluorescent dye, a fluorescent polymer, a low-molecular phosphorescent dye, a phosphorescent polymer or further a metal complex is used.

As the fluorescent guest material, an organic material such as a naphthalene derivative, an anthracene derivative, a naphthacene derivative, a styrylamine derivative, a bis (azinyl) methene boron complex, a pyrene derivative, a fluoranthene derivative, a perylene derivative, a coumarin derivative, a quinacridone derivative, an indeno[1,2,3-cd]perylene derivative, or a bis(azinyl)methene boron complex pyran-based dye is used.

Moreover, in particular, as a red fluorescent guest material, a perylene derivative, a diketopyrrolopyrrole derivative, a pyrromethene complex, a pyran derivative, a styryl derivative or the like is used. In this case, the naphthacene derivative represented by the above-described general expression (1)' is preferably used as the host material.

As the phosphorescent guest material, an organic metal phosphorescent material such as an iridium complex, a platinum complex, a rhenium complex, an osmium complex, a ruthenium complex or a gold complex, or another ortho-metalated complex is used. In addition, when a phosphorescent material obtaining phosphorescent light emission through a triplet exciton is used, compared to a fluorescent material utilizing fluorescent light emission through a singlet exciton, higher luminous efficiency is expected in principle.

As will be described later, as long as the light-emitting layer 14c is formed with a thickness of 70 nm or over, the whole light-emitting layer 14c may be doped with such a luminous guest material, or only a recombination region closer to the anode 13 in the light-emitting layer 14c may be doped with such a luminous guest material. Moreover, a few kinds of luminous guest materials may be mixed, or the light-emitting layer 14c may be configured of a laminate configuration containing different luminous guest materials.

The light-emitting layer 14c may be doped with an optimum amount, at which concentration quenching does not occur, of such a luminous guest material, and more specifically, the doping concentration of the luminous guest material is 50% to 0.1% as a volume ratio.

<Electron Transport Layer 14d>

A second one of characteristic configurations of the embodiment is that the electron transport layer 14d arranged between the light-emitting layer 14c and the cathode 15 is arranged as a layer including a nitrogen-containing heterocyclic derivative. The electron transport layer 14d including the nitrogen-containing heterocyclic derivative is provided for transporting electrons to the light-emitting layer 14c. Examples of the material of the electron transport layer 14d include quinoline, phenanthroline, pyrazine, triazole, oxazole, oxadiazole, benzoimidazol, a derivative thereof and a metal complex thereof. More specifically, tris(8-hydroxyquinoline)aluminum (Alq3 for short), a benzoimidazol derivative, acridine, stilbene, 1,10-phenanthroline, or a derivative thereof or a metal complex thereof is cited.

In particular, in the case where the light-emitting layer 14c is formed with a thickness of 150 nm or over, to drive the organic EL element 11 at a low voltage, the electron transport layer 14d which includes a benzoimidazol derivative which is represented by the following general expression (2) or a phenanthroline derivative which includes at least one phenanthroline ring and is represented by the following general expression (2)' as a nitrogen-containing heterocyclic derivative is preferable.

[Chemical Expression 3]

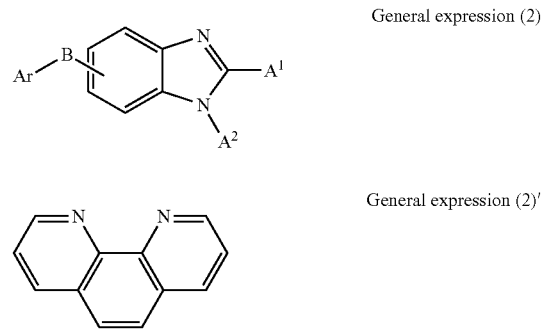

General expression (2)

General expression (2)'

In the general expression (2), $A^1$ and $A^2$ independently represent a hydrogen atom, an aryl group with 60 or less carbon atoms which may have a substituent group, a heterocyclic group which may have a substituent group, a alkyl group with 1 to 20 carbon atoms which may have a substituent group, or an alkoxy group with 1 to 20 carbon atoms which may have a substituent group. $A^1$ and $A^2$ may be connected each other through a linking group.

Moreover, B in the general expression (2) represents an arylene group with 60 or less carbon atoms which may have a substituent group, a pyridinylene group which may have a substituent group, a quinolinylene group which may have a substituent group or a fluorenylene group which may have a substituent group.

Further, Ar in the general expression (2) represents an aryl group with 6 to 60 carbon atoms which may have a substituent group, a heterocyclic group with 3 to 60 carbon atoms which may have a substituent group, an alkyl group with 1 to 20 carbon atoms which may have a substituent group, or an alkoxy group with 1 to 20 carbon atoms which may have a substituent group.

Specific examples of such a benzoimidazol derivative in the general expression (2) are represented by structural expressions (2)-1 to (2)-48 in the following tables 1 to 6. Note that in the tables 1 to 6, Ar(α) represents [benzoimidazol structure+$A^1$+$A^2$] in the general expression (2).

TABLE 1

| | Ar(α) | B | Ar | |
|---|---|---|---|---|
| | | | Ar(1) | Ar(2) |
| (2)-1 | 6-methyl-1-(pyridin-2-yl)-2-phenyl-benzimidazole | p-phenylene | 9,10-dimethylanthracenyl | 2-methylnaphthyl |
| (2)-2 | 5-methyl-1-(pyridin-2-yl)-2-phenyl-benzimidazole | p-phenylene | 9,10-dimethylanthracenyl | 2-methylnaphthyl |
| (2)-3 | 4-methyl-1-(pyridin-2-yl)-2-phenyl-benzimidazole | p-phenylene | 9,10-dimethylanthracenyl | 2-methylnaphthyl |
| (2)-4 | 7-methyl-1-(pyridin-3-yl)-2-phenyl-benzimidazole | p-phenylene | 9,10-dimethylanthracenyl | 2-methylnaphthyl |
| (2)-5 | 5-methyl-1-phenyl-2-methyl-benzimidazole | p-phenylene | 9,10-dimethylanthracenyl | 2-methylnaphthyl |
| (2)-6 | 6-methyl-1-methyl-2-phenyl-benzimidazole | p-phenylene | 9,10-dimethylanthracenyl | 2-methylnaphthyl |

TABLE 1-continued

| | Ar(α) | B | Ar(1) | Ar(2) |
|---|---|---|---|---|
| (2)-7 | 1-phenyl-2-methyl-5-methylbenzimidazole | p-phenylene | 9,10-anthracenyl | 2-methylnaphthalenyl |
| (2)-8 | 1-methyl-2-phenyl-5-methylbenzimidazole | p-phenylene | 9,10-anthracenyl | 2-methylnaphthalenyl |
| (2)-9 | 1-methyl-2-phenyl-5-methylbenzimidazole | p-phenylene | 9,10-anthracenyl | 1-methylnaphthalenyl |
| (2)-10 | 1,2-diphenyl-5-methylbenzimidazole | p-phenylene | 9,10-anthracenyl | 1-methylnaphthalenyl |

TABLE 2

| | Ar(α) | B | Ar(1) | Ar(2) |
|---|---|---|---|---|
| (2)-11 | 1,2-diphenyl-5-methylbenzimidazole | p-phenylene | 9,10-anthracenyl | 4-methylbiphenyl |
| (2)-12 | 1-methyl-2-phenyl-5-methylbenzimidazole | p-phenylene | 9,10-anthracenyl | 2-methylbiphenyl |

TABLE 2-continued

| | Ar(α) | B | Ar(1) | Ar(2) |
|---|---|---|---|---|
| (2)-13 | | | | |
| (2)-14 | | | | |
| (2)-15 | | | | |
| (2)-16 | | | | |
| (2)-17 | | | | |
| (2)-18 | | | | |

TABLE 3

| | Ar(α) | B | Ar | |
|---|---|---|---|---|
| | | | Ar(1) | Ar(2) |
| (2)-19 | 5-methyl-1-methyl-2-(biphenyl-4-yl)benzimidazole | 1,4-phenylene | 9,10-dimethylanthracene | 1-methylnaphthalene |
| (2)-20 | 5-methyl-1-methyl-2-(naphthalen-1-yl)benzimidazole | 1,4-phenylene | 9,10-dimethylanthracene | 1-methylnaphthalene |
| (2)-21 | 5-methyl-1-methyl-2-phenylbenzimidazole | 1,4-phenylene | 9,10-dimethylanthracene | 9,9-dimethyl-2-methylfluorene |
| (2)-22 | 5-methyl-1-methyl-2-phenylbenzimidazole | 1,4-phenylene | 2-tert-butyl-9,10-dimethylanthracene | 2-methylbiphenyl |
| (2)-23 | 5-methyl-1-methyl-2-phenylbenzimidazole | 1,4-phenylene | 1,6-dimethylpyrene | 2-methylbiphenyl |
| (2)-24 | 5-methyl-1-methyl-2-(naphthalen-1-yl)benzimidazole | 1,4-phenylene | 1,4-bis(10-methylanthracen-9-yl)benzene | 2-methylbiphenyl |

TABLE 4

| | Ar(α) | B | Ar |
|---|---|---|---|
| (2)-25 | 6-methyl-1,2-diphenyl-1H-benzimidazole | 9,10-dimethylanthracene | 2-methylnaphthalene |
| (2)-26 | 5-methyl-1,2-diphenyl-1H-benzimidazole | 9,10-dimethylanthracene | 2-methylnaphthalene |
| (2)-27 | 4-methyl-1,2-diphenyl-1H-benzimidazole | 9,10-dimethylanthracene | 2-methylnaphthalene |
| (2)-28 | 7-methyl-1,2-diphenyl-1H-benzimidazole | 9,10-dimethylanthracene | 2-methylnaphthalene |
| (2)-29 | 6-methyl-2-methyl-1-phenyl-1H-benzimidazole | 9,10-dimethylanthracene | 2-methylnaphthalene |
| (2)-30 | 6-methyl-1-methyl-2-phenyl-1H-benzimidazole | 9,10-dimethylanthracene | 2-methylnaphthalene |

TABLE 4-continued

| | Ar(α) | B | Ar |
|---|---|---|---|
| (2)-31 | 5-methyl-2-methyl-1-phenyl-benzimidazole | 9,10-dimethylanthracene | 2-methylnaphthalene |
| (2)-32 | 5-methyl-1-methyl-2-phenyl-benzimidazole | 9,10-dimethylanthracene | 2-methylnaphthalene |

TABLE 5

| | Ar(α) | B | Ar |
|---|---|---|---|
| (2)-33 | 6-methyl-1-phenyl-2-(pyridin-2-yl)-benzimidazole | 9,10-dimethylanthracene | 2-methylnaphthalene |
| (2)-34 | 5-methyl-1-phenyl-2-(pyridin-2-yl)-benzimidazole | 9,10-dimethylanthracene | 2-methylnaphthalene |
| (2)-35 | 6-methyl-1-phenyl-2-(pyridin-3-yl)-benzimidazole | 9,10-dimethylanthracene | 2-methylnaphthalene |

TABLE 5-continued

| | Ar(α) | B | Ar |
|---|---|---|---|
| (2)-36 | 5-methyl-1-phenyl-2-(pyridin-3-yl)benzimidazole | 9,10-dimethylanthracene | 2-methylnaphthalene |
| (2)-37 | 6-methyl-1-phenyl-2-(pyridin-4-yl)benzimidazole | 9,10-dimethylanthracene | 2-methylnaphthalene |
| (2)-38 | 5-methyl-1-phenyl-2-(pyridin-4-yl)benzimidazole | 9,10-dimethylanthracene | 2-methylnaphthalene |
| (2)-39 | 1,2,6-trimethylbenzimidazole | 9,10-dimethylanthracene | 2-methylnaphthalene |
| (2)-40 | 1,2,5-trimethylbenzimidazole | 9,10-dimethylanthracene | 2-methylnaphthalene |

TABLE 6

| | Ar(α) | B | Ar |
|---|---|---|---|
| (2)-41 | 6-methyl-2-phenyl-1-(pyridin-2-yl)benzimidazole | 9,10-dimethylanthracene | 2-methylnaphthalene |

TABLE 6-continued

| | Ar(α) | B | Ar |
|---|---|---|---|
| (2)-42 | 5-methyl-1-(pyridin-2-yl)-2-phenyl-benzimidazole | 9,10-dimethylanthracene | 2-naphthyl |
| (2)-43 | 5-methyl-1-(pyridin-3-yl)-2-phenyl-benzimidazole | 9,10-dimethylanthracene | 2-naphthyl |
| (2)-44 | 5-methyl-1-(pyridin-3-yl)-2-phenyl-benzimidazole | 9,10-dimethylanthracene | 2-naphthyl |
| (2)-45 | 5-methyl-1-(pyridin-4-yl)-2-phenyl-benzimidazole | 9,10-dimethylanthracene | 2-naphthyl |
| (2)-46 | 5-methyl-1-(pyridin-4-yl)-2-phenyl-benzimidazole | 9,10-dimethylanthracene | 2-naphthyl |
| (2)-47 | 5-methyl-1-(pyridin-2-yl)-2-(pyridin-2-yl)-benzimidazole | 9,10-dimethylanthracene | 2-naphthyl |

TABLE 6-continued

| Ar(α) | B | Ar |
|---|---|---|
| (2)-48 | | |

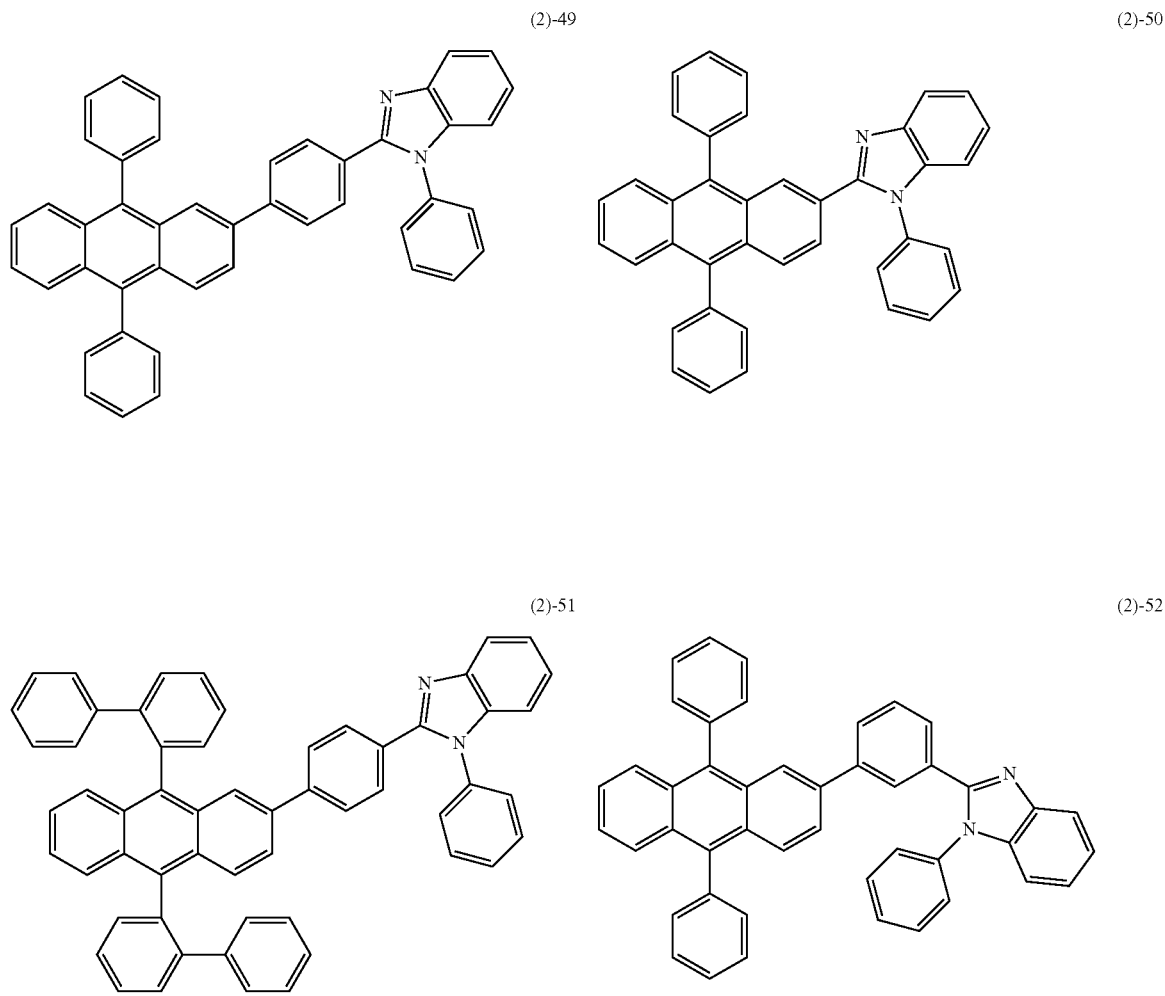

The benzoimidazol derivative in the general expression (2) typified by the above structural expressions (2)-1 to (2)-48 is allowed to be synthesized by a synthesizing method used in a synthesization example described in Japanese Patent No. 4185097, but the present invention is not limited thereto.

Moreover, the benzoimidazol derivative as a nitrogen-containing heterocyclic derivative configuring the electron transport layer arranged between the light-emitting layer 14c and the cathode 15 is not limited to the structure represented by the general expression (2), and may be materials represented by the following structural expressions (2)-49 to (2)-60.

[Chemical Expression 4]

-continued
(2)-53
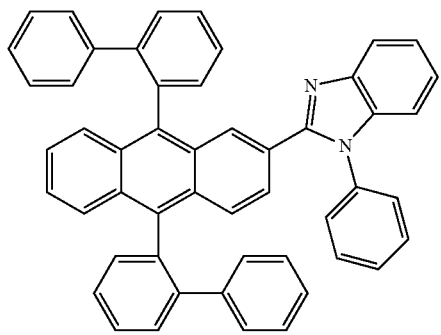
(2)-54
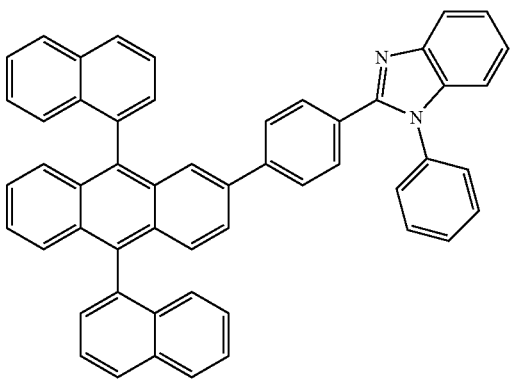
(2)-55
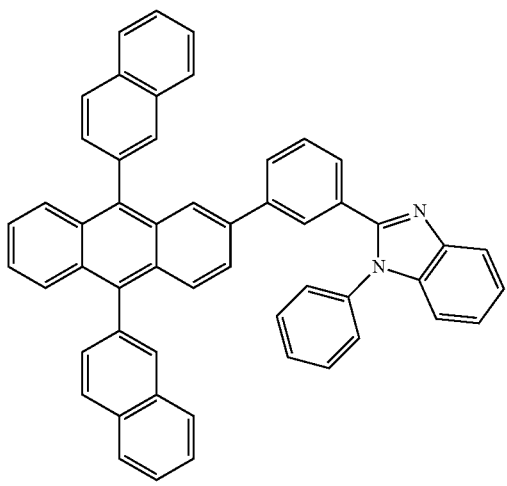
(2)-56
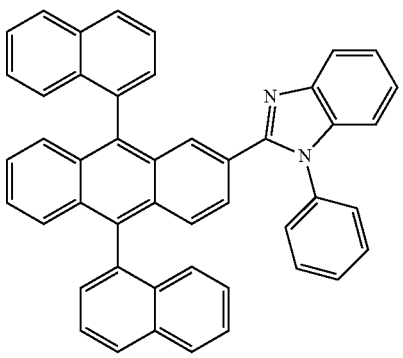
(2)-57
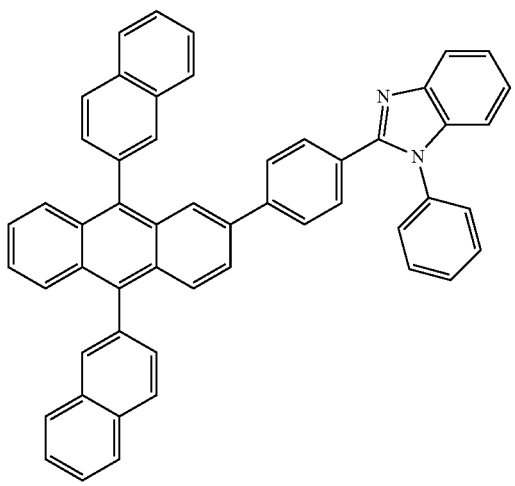

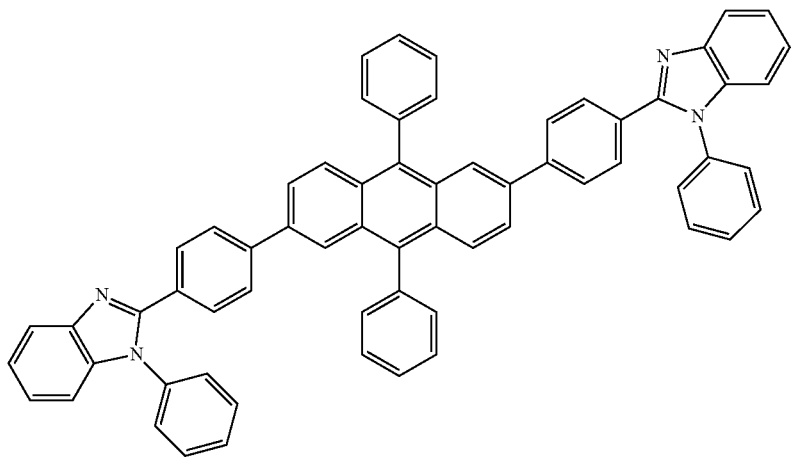
(2)-58
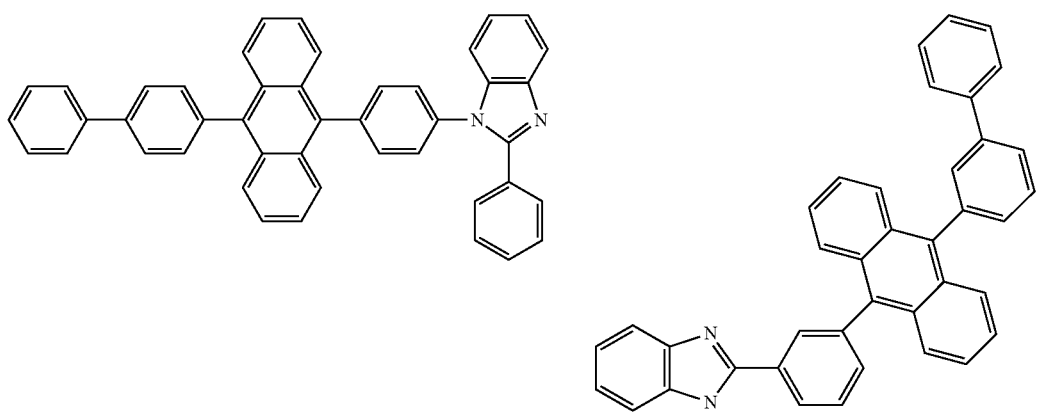
(2)-59 (2)-60
Further, the benzoimidazol derivative as a nitrogen-containing heterocyclic derivative configuring the electron transport layer arranged between the light-emitting layer 14c and the cathode 15 may be dibenzoimidazol derivatives represented by structural expressions (2)-61 to (2)-88 in addition to the above-described structures.
[Chemical Expression 5-1]
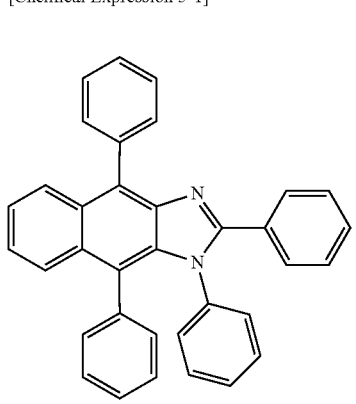
(2)-61
-continued
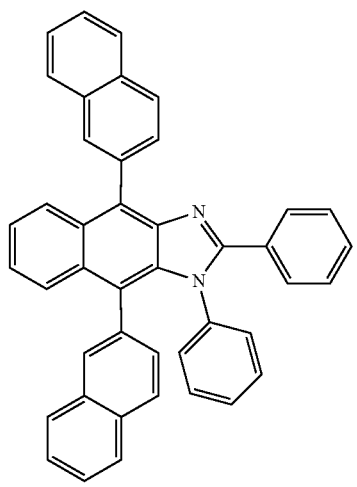
(2)-62

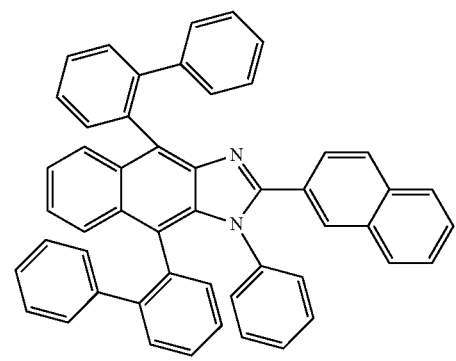
(2)-63
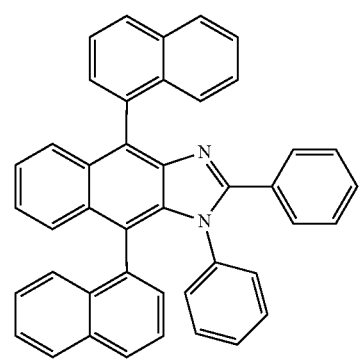
(2)-64
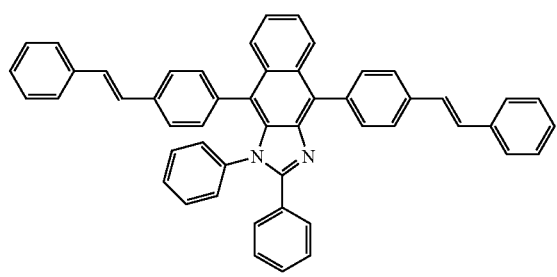
(2)-65
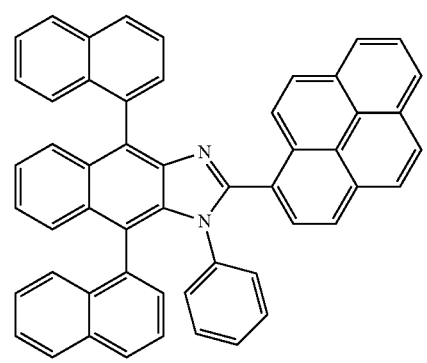
(2)-66
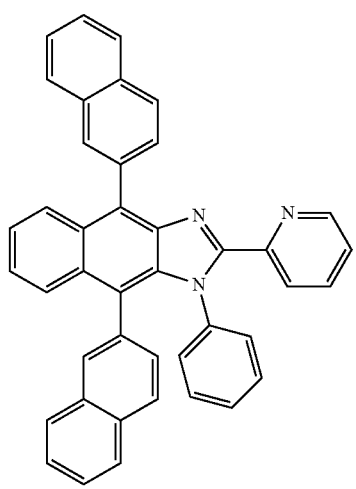
(2)-67
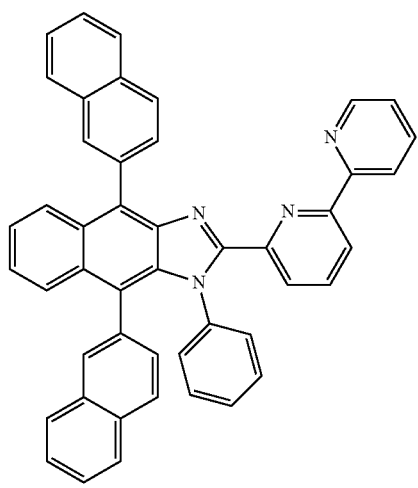
(2)-68
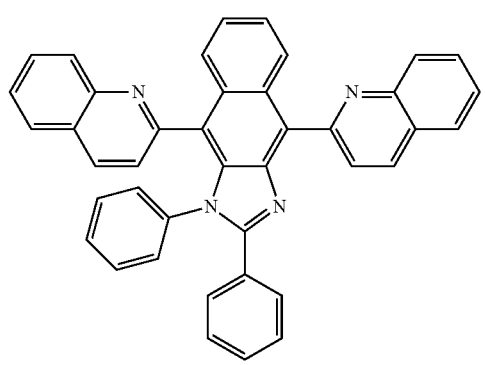
(2)-69

(2)-70
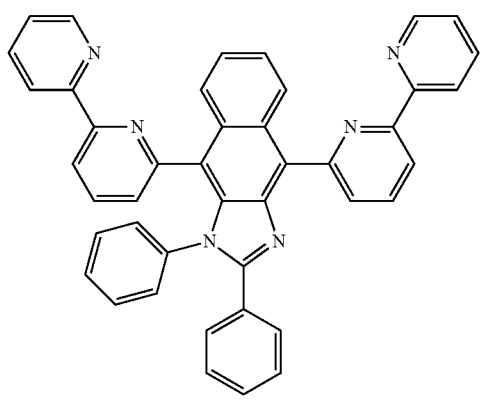
(2)-71
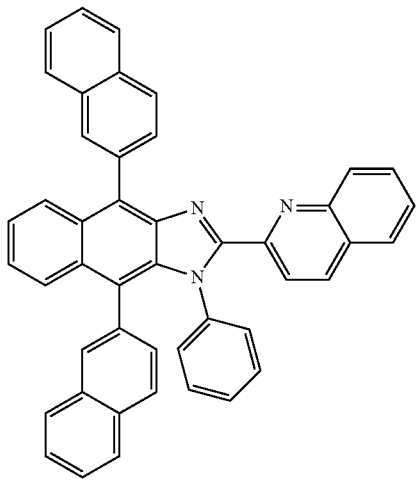
(2)-72
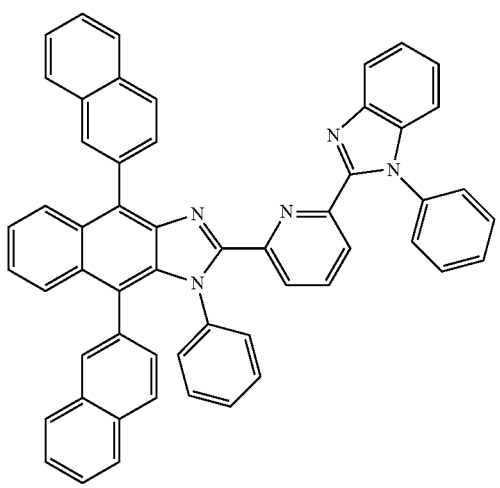
(2)-73
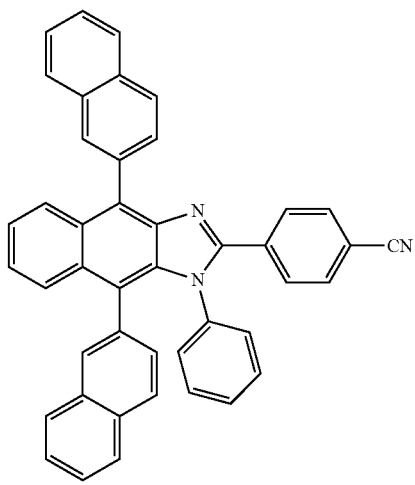
[Chemical Expression 5-2]
(2)-74
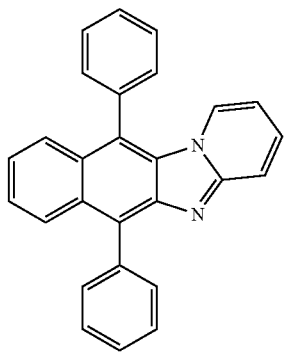
(2)-75
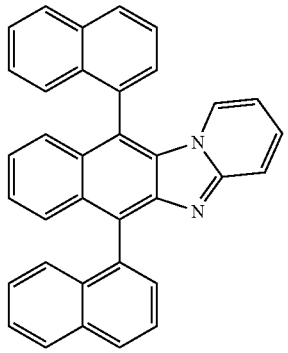

-continued
(2)-76
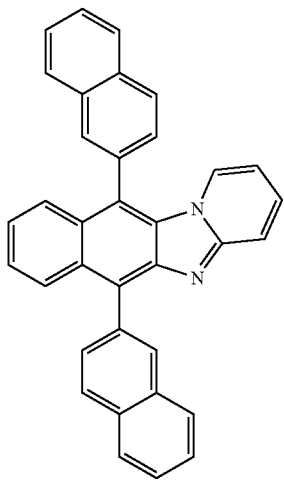
(2)-77
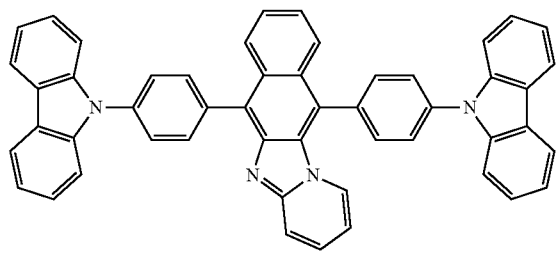
(2)-78
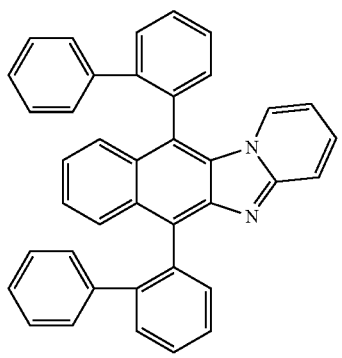
(2)-79
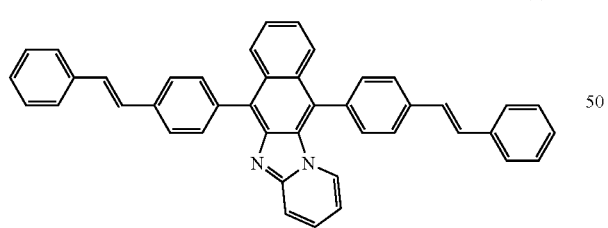
(2)-80
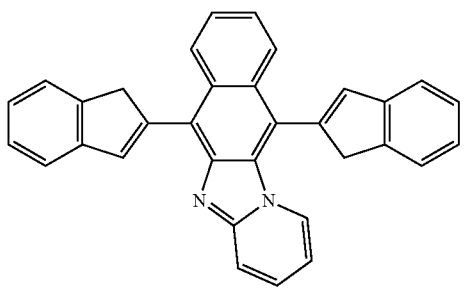
-continued
(2)-81
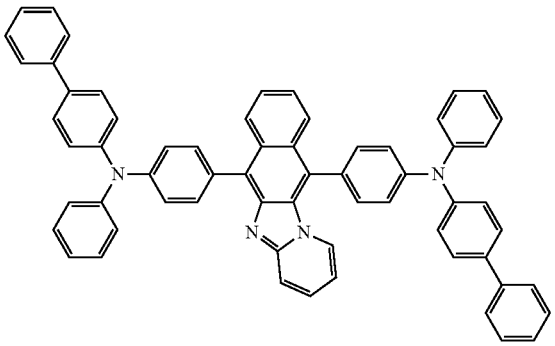
(2)-82
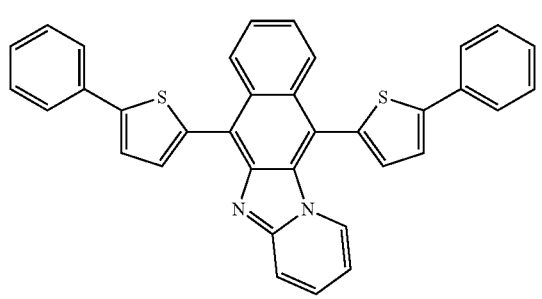
(2)-83
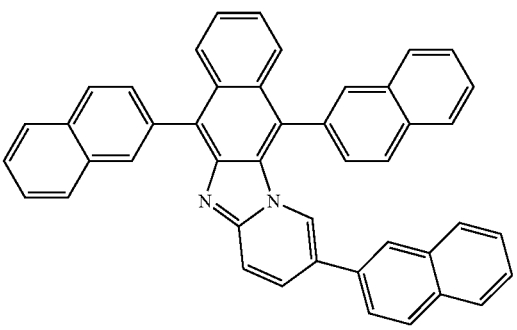
(2)-84
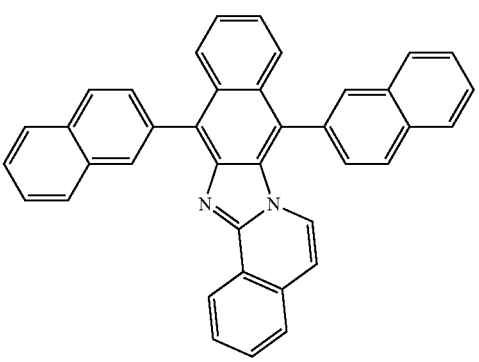

(2)-85
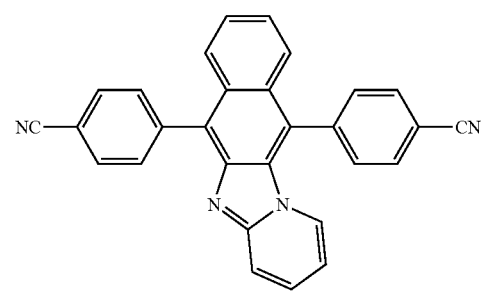
(2)-86
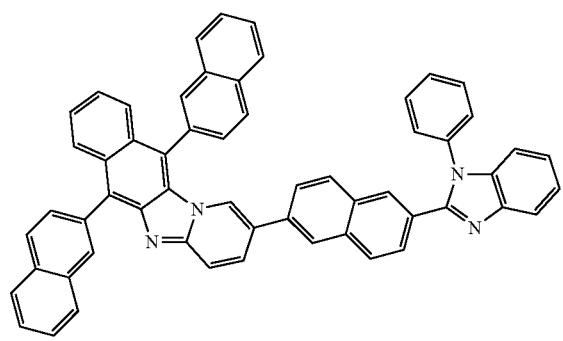
(2)-87
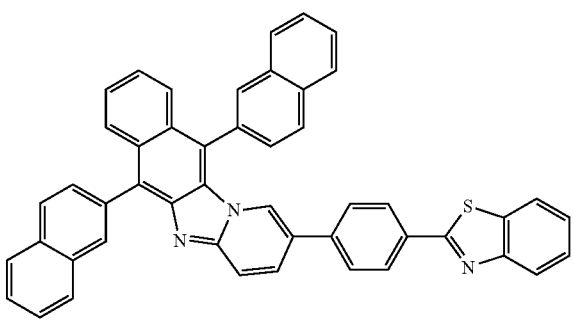
(2)-88
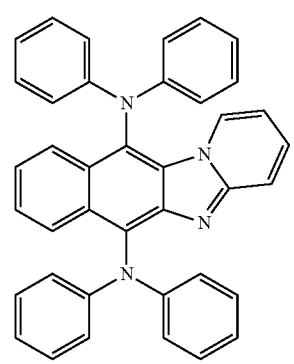
Moreover, specific examples of the phenanthroline derivative including at least one phenanthroline ring represented by the general expression (2)' are represented by the following structural expressions (2)'-1 to (2)'-14.
[Chemical Expression 6]
(2)'-1
(2)'-2
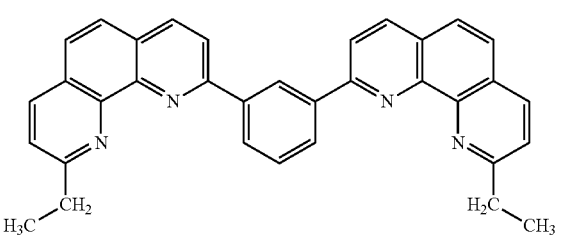
(2)'-3
(2)'-4
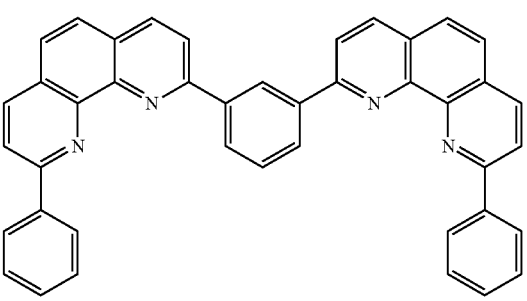
(2)'-5
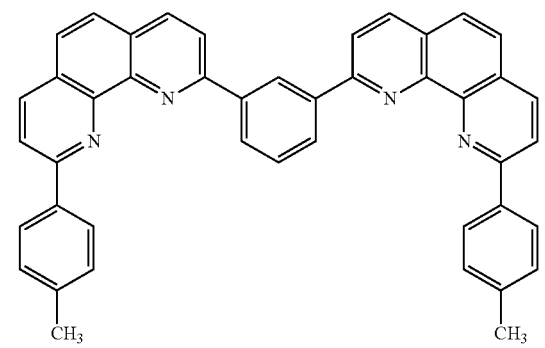

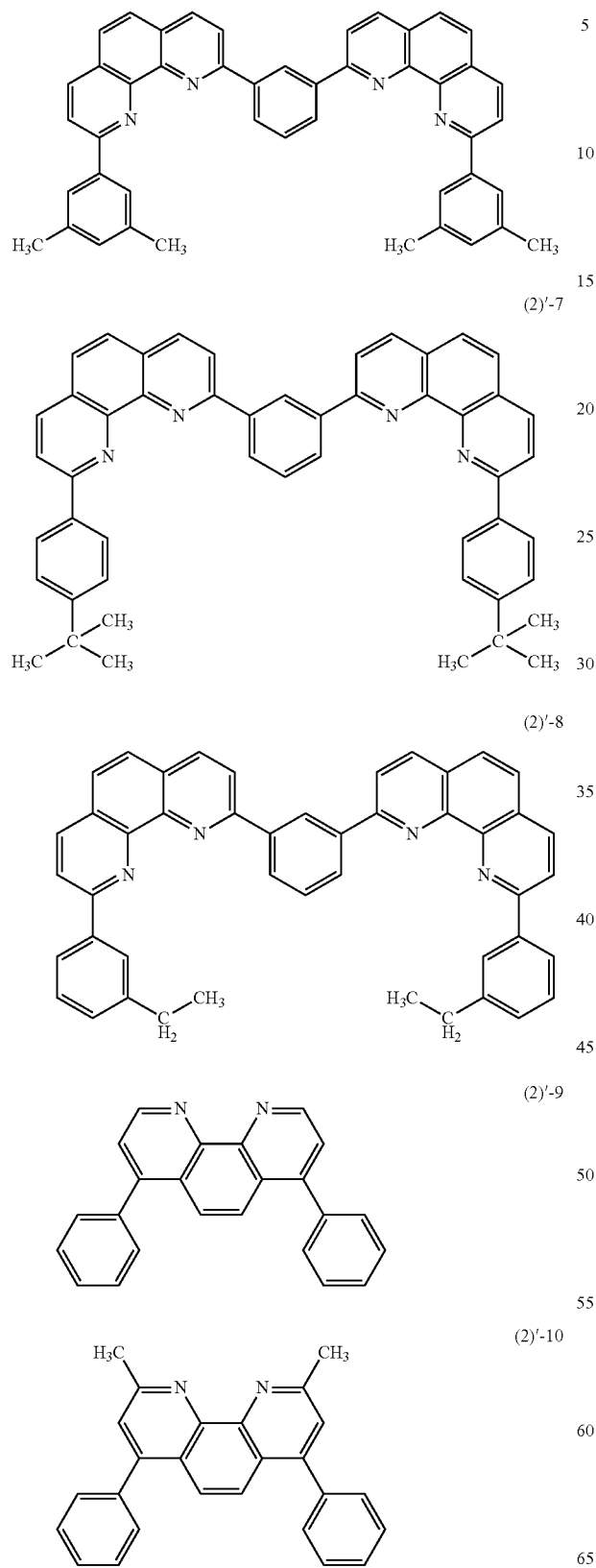
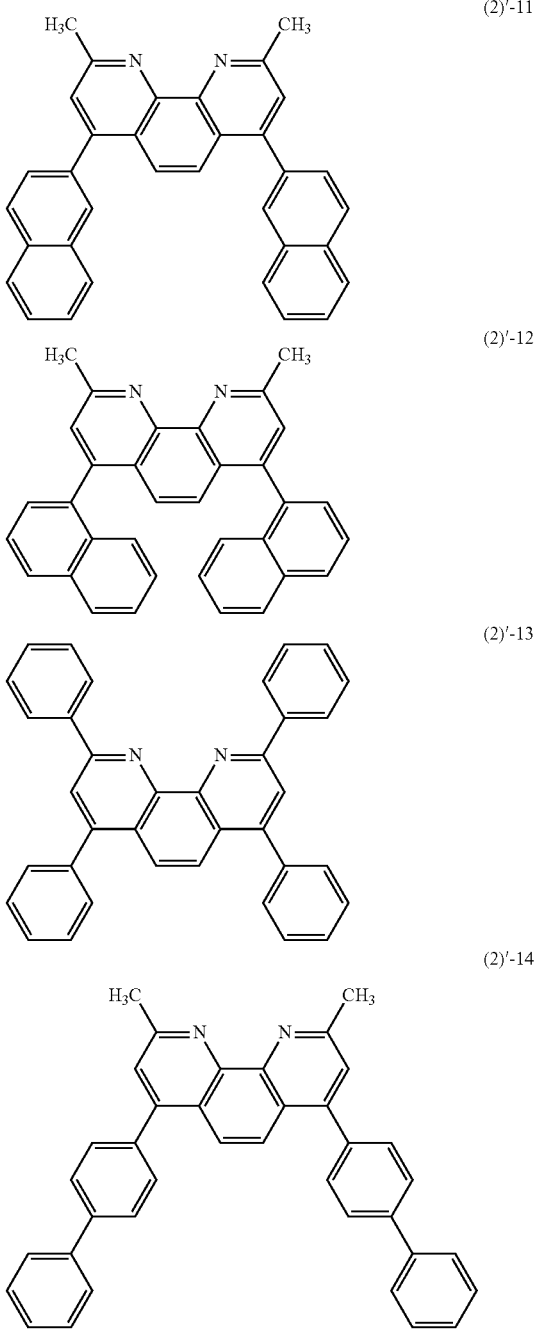

In addition, the electron transport layer 14d may be a single layer including one kind of nitrogen-containing heterocyclic derivative, or a mixed layer including two or more kinds of nitrogen-containing heterocyclic derivatives, or a mixed layer including a nitrogen-containing heterocyclic derivative and another compound. Herein, as another compound, at least one kind is selected from an alkali metal, an alkali earth metal, a rare-earth metal and an oxide thereof, a complex oxide, a fluoride and a carbonate. Moreover, the electron transport layer 14d may be configured by laminating a plurality of layers including the nitrogen-containing heterocyclic derivative, or may have a laminate configuration which includes a layer including the nitrogen-containing heterocyclic derivative and a layer including a compound except for the nitrogen-containing heterocyclic derivative. In this case, the layer including a compound except for the nitrogen-containing heterocyclic derivative may be arranged on the anode 13 side or the cathode 15 side of the layer including the nitrogen-containing heterocyclic derivative.

<Hole Injection Layer 14a and Hole Transport Layer 14b>

The hole injection layer 14a and the hole transport layer 14b configuring the hole supply layer are configured with use of a typical hole injection/transport material. Moreover, a more preferable material is an azatriphenylene derivative represented by the following general expression (3), an amine derivative represented by the following general expression (4), a diamine derivative represented by the following general expression (5), or a triarylamine multimeric complex represented by the following general expression (6). When the hole injection layer 14a and the hole transport layer 14b are configured with use of these compounds, hole supply from the hole injection layer 14a and the hole transport layer 14b to the light-emitting layer 14c is able to be optimized with respect to electron supply of the above-described electron transport layer 14d.

[Chemical Expression 7]

General expression (3)

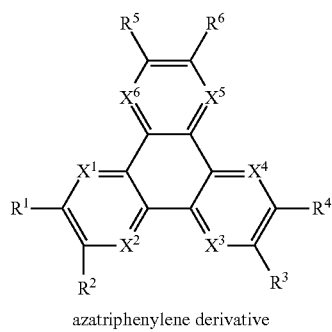

azatriphenylene derivative

General expression (4)

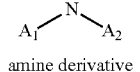

amine derivative

General expression (5)

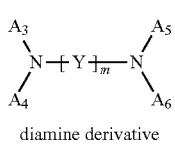

diamine derivative

General expression (6)

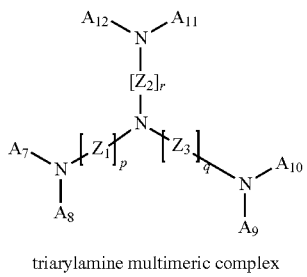

triarylamine multimeric complex

The materials represented by the general expressions (3) to (6) may be used for either the hole injection layer Ma or the hole transport layer 14b. However, when a compound having a composition with a high nitrogen (N) content is used for the hole injection layer 14a, a hole injection barrier from the anode 13 is allowed to be reduced. Moreover, in the configuration of the invention, electron injection is enhanced, so also to obtain a good carrier balance, an azatriphenylene derivative [the general expression (3)] with a high hole injection property is more preferably used for an anode interface.

Herein, in the azatriphenylene derivative represented by the above-described general expression (3), $R^1$ to $R^6$ in the general expression (3) independently represent a substituent group selected from hydrogen, halogen, a hydroxyl group, an amino group, an arylamino group, a substituted or unsubstituted carbonyl group with 20 or less carbon atoms, a substituted or unsubstituted carbonyl ester group with 20 or less carbon atoms, a substituted or unsubstituted alkyl group with 20 or less carbon atoms, a substituted or unsubstituted alkenyl group with 20 or less carbon atoms, a substituted or unsubstituted alkoxyl group with 20 or less carbon atoms, a substituted or unsubstituted aryl group with 30 or less carbon atoms, a substituted or unsubstituted heterocyclic group with 30 or less carbon atoms, a nitrile group, a cyano group, a nitro group, or a silyl group. Then, adjacent $R^m$ (m=1 to 6) may be connected to one another through a cyclic structure. $X^1$ to $X^6$ in the general expression (3) independently represent a carbon atom or a nitrogen (N) atom. In the compound, specifically when X is an N atom, the N content in the compound is increased, so the compound is preferably used for the hole injection layer 14a.

Here, as a specific example of the azatriphenylene derivative, hexanitrile azatriphenylene represented by the following structural expression (3)-1 is cited.

[Chemical Expression 8]

structural expression (3)-1

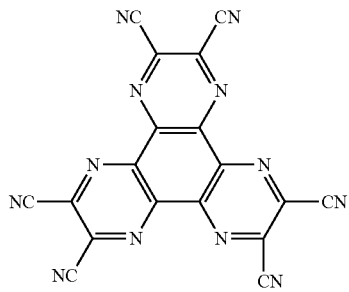

hexanitrile azatriphenylene

Moreover, in the amine derivative represented by the above-described general expression (4), $A_0$ to $A_2$ in the above-described general expression (4) independently represent an aromatic hydrocarbon with 6 to 30 carbon atoms. The aromatic hydrocarbon in each of $A_0$ to $A_2$ may be unsubstituted, or may have a substituent group. In this case, the substituent group is selected from among hydrogen, halogen, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group and a silyl group. Any number of hydrogen atoms of the aromatic hydrocarbon in $A_0$ to $A_2$ may be replaced with these substituent groups.

Herein, specific examples of the above-described amine derivative include compounds represented by the following structural expressions (4)-1 to (4)-9.

[Chemical Expression 9]
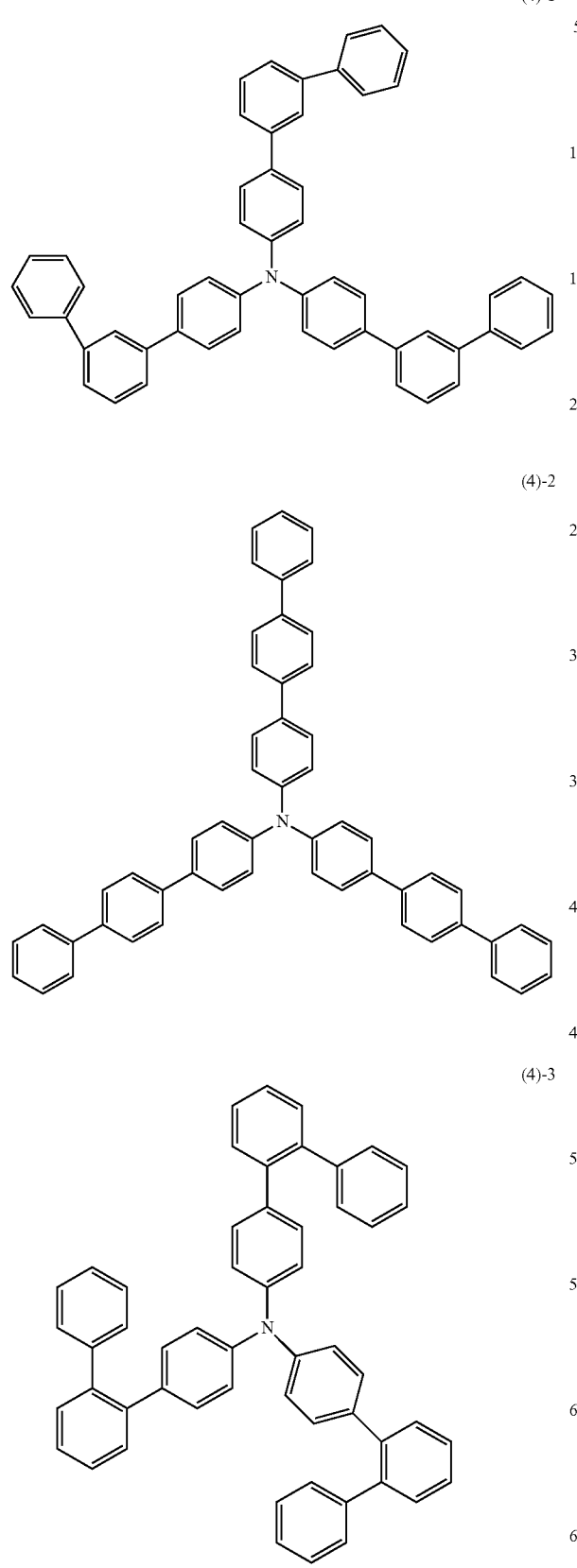
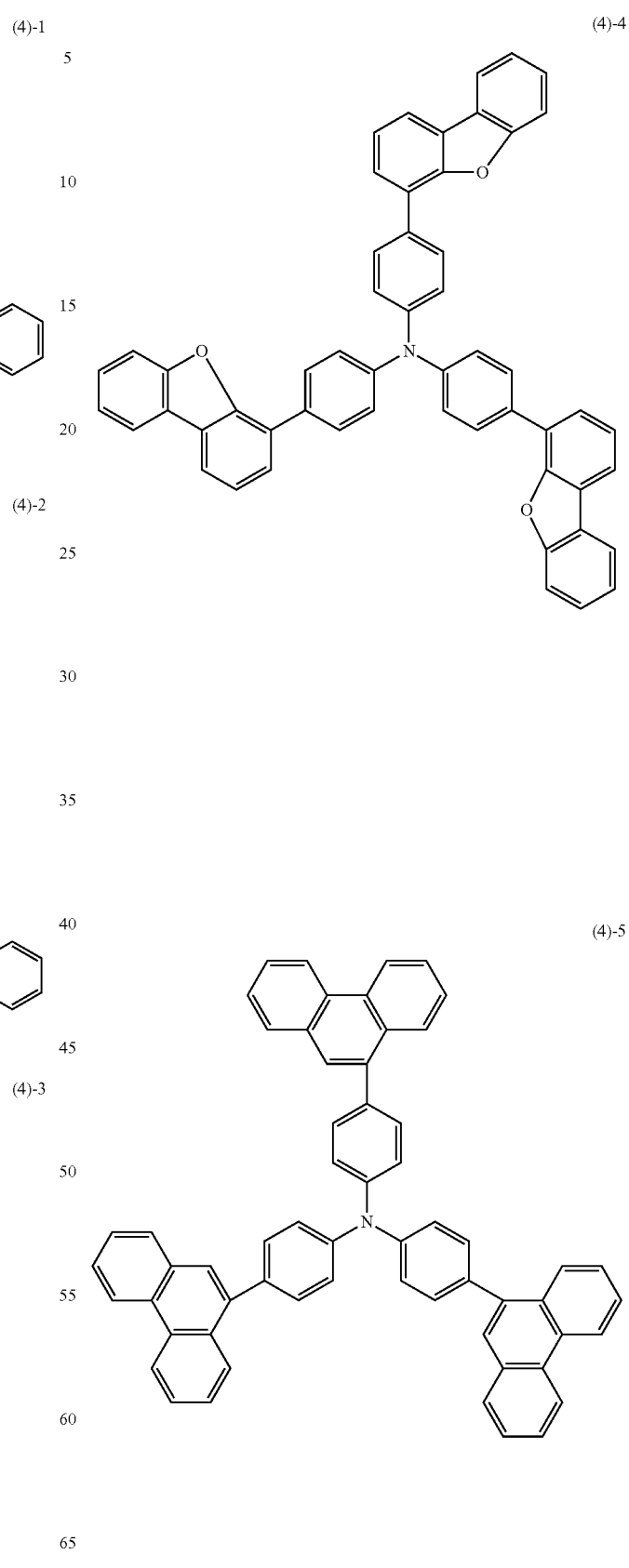

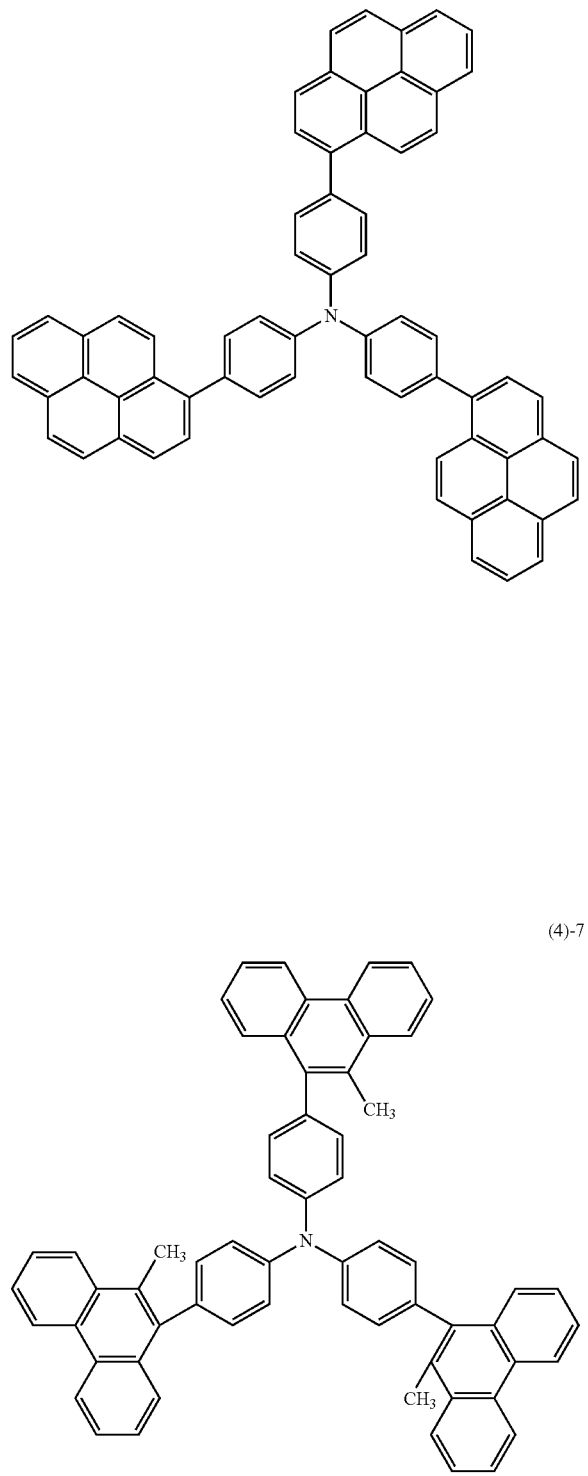

(4)-6

(4)-7

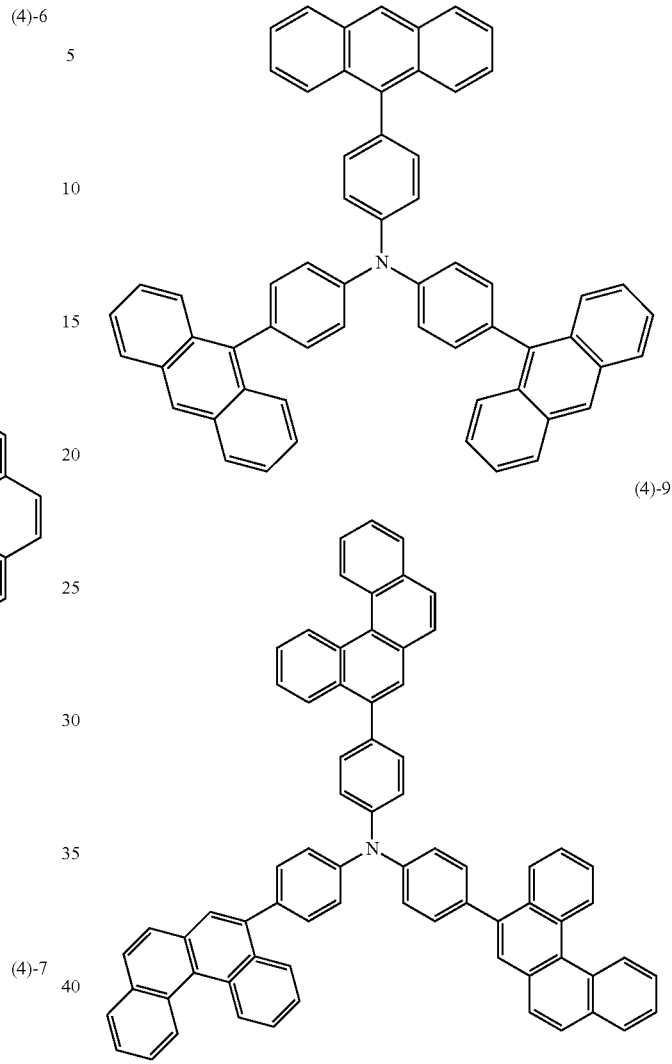

(4)-8

(4)-9

Moreover, in the diamine derivative represented by the general expression (5), $A_3$ to $A_6$ in the general expression (5) independently represent an aromatic hydrocarbon with 6 to 20 carbon atoms. The aromatic hydrocarbon in each of $A_3$ to $A_6$ may be unsubstituted, or may have a substituent group. In this case, the substituent group is selected from among hydrogen, halogen, a hydroxyl group, an aldehyde group, a carbonyl group, a carbonyl ester group, an alkyl group, an alkenyl group, a cyclic alkyl group, an alkoxy group, a aryl group, an amino group, a heterocyclic group, a cyano group, a nitrile group, a nitro group and a silyl group. Any number of hydrogen atoms of the aromatic hydrocarbon in $A_3$ to $A_6$ may be replaced with these substituent groups. Moreover, $A_3$ and $A_4$, and $A_5$ and $A_6$ may be connected to each other through a linking group. Y in the general expression (5) represents an aromatic hydrocarbon, and is one selected from benzene, naphthalene, anthracene, phenanthrene, naphthacene, fluoranthene and perylene, and m represents an integer of 1 or more.

Herein, specific examples of the above-described diamine derivative include compounds represented by the following structural expressions (5)-1 to (5)-83.

TABLE 7
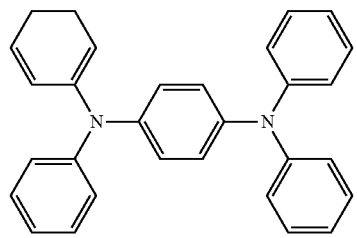 [SMILES: C1=CC(N(c2ccccc2)c2ccc(N(c3ccccc3)c3ccccc3)cc2)=CCC1]
(5)-1
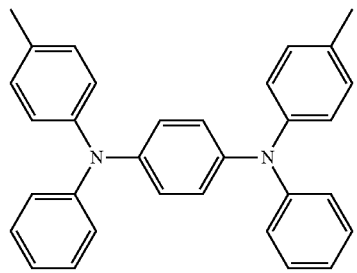 [SMILES: Cc1ccc(N(c2ccccc2)c2ccc(N(c3ccccc3)c3ccc(C)cc3)cc2)cc1]
(5)-2
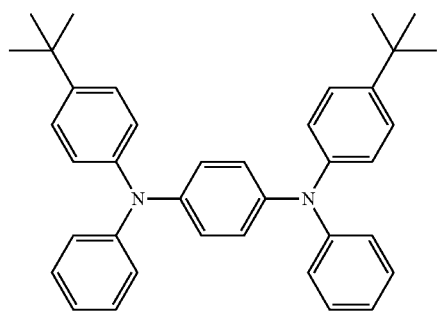 [SMILES: CC(C)(C)c1ccc(N(c2ccccc2)c2ccc(N(c3ccccc3)c3ccc(C(C)(C)C)cc3)cc2)cc1]
(5)-3
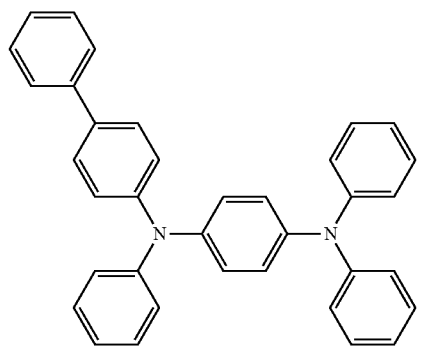 [SMILES: c1ccc(-c2ccc(N(c3ccccc3)c3ccc(N(c4ccccc4)c4ccccc4)cc3)cc2)cc1]
(5)-4
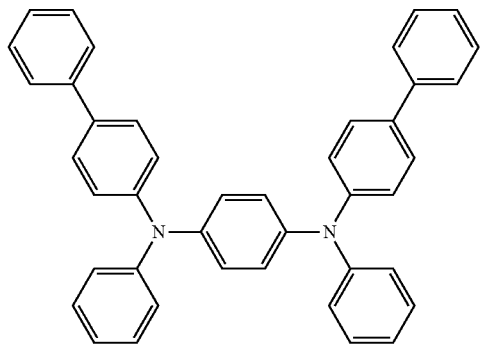 [SMILES: c1ccc(-c2ccc(N(c3ccccc3)c3ccc(N(c4ccccc4)c4ccc(-c5ccccc5)cc4)cc3)cc2)cc1]
(5)-5

TABLE 7-continued
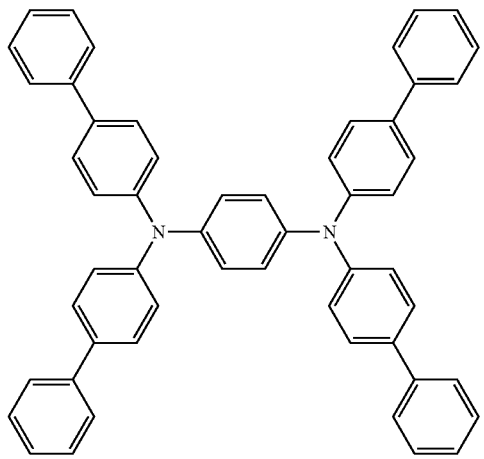 [SMILES: c1ccc(-c2ccc(N(c3ccc(-c4ccccc4)cc3)c3ccc(N(c4ccc(-c5ccccc5)cc4)c4ccc(-c5ccccc5)cc4)cc3)cc2)cc1]
(5)-6
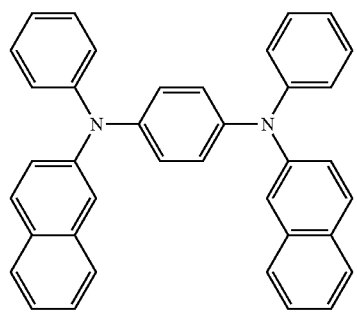 [SMILES: c1ccc(N(c2ccc(N(c3ccccc3)c3ccc4ccccc4c3)cc2)c2ccc3ccccc3c2)cc1]
(5)-7
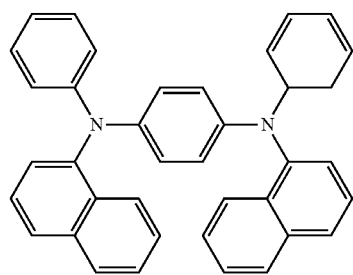 [SMILES: C1=CCC(N(c2ccc(N(c3ccccc3)c3cccc4ccccc34)cc2)c2cccc3ccccc23)C=C1]
(5)-8
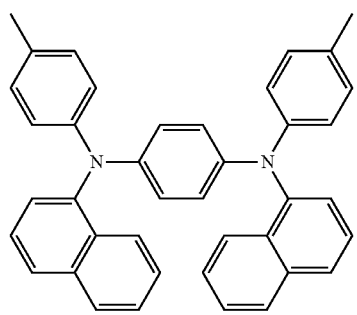 [SMILES: Cc1ccc(N(c2ccc(N(c3ccc(C)cc3)c3cccc4ccccc34)cc2)c2cccc3ccccc23)cc1]
(5)-9

TABLE 7-continued
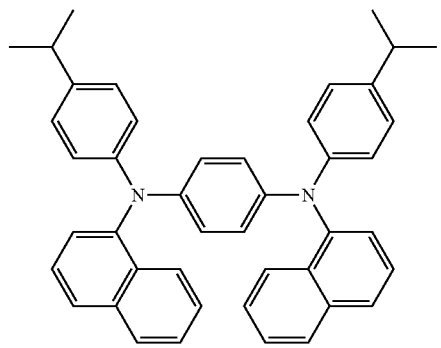 [SMILES: CC(C)c1ccc(N(c2ccc(N(c3ccc(C(C)C)cc3)c3cccc4ccccc34)cc2)c2cccc3ccccc23)cc1]
(5)-10
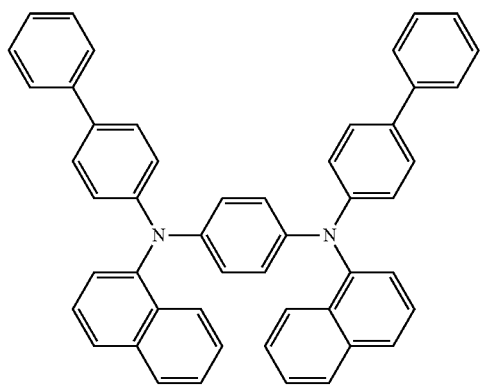 [SMILES: c1ccc(-c2ccc(N(c3ccc(N(c4ccc(-c5ccccc5)cc4)c4cccc5ccccc45)cc3)c3cccc4ccccc34)cc2)cc1]
(5)-11
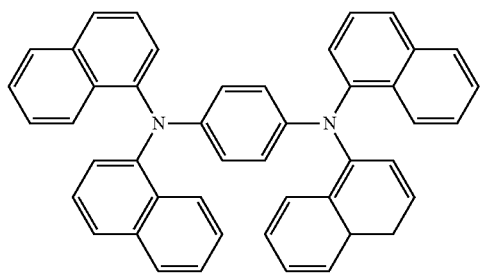 [SMILES: C1=CC2=C(N(c3ccc(N(c4cccc5ccccc45)c4cccc5ccccc45)cc3)c3cccc4ccccc34)C=CCC2C=C1]
(5)-12
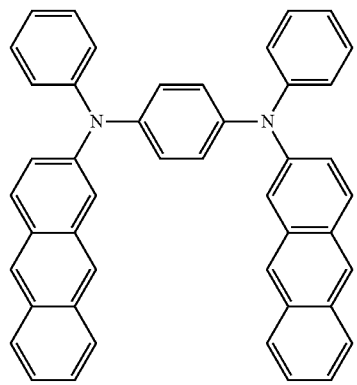 [SMILES: c1ccc(N(c2ccc(N(c3ccccc3)c3ccc4cc5ccccc5cc4c3)cc2)c2ccc3cc4ccccc4cc3c2)cc1]
(5)-13

TABLE 7-continued
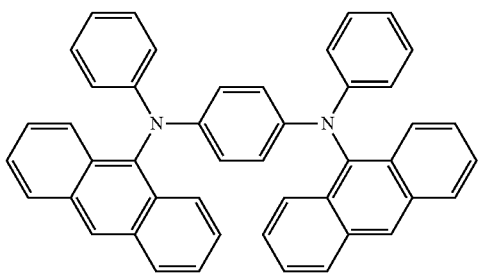 [SMILES: c1ccc(N(c2ccc(N(c3ccccc3)c3c4ccccc4cc4ccccc34)cc2)c2c3ccccc3cc3ccccc23)cc1]
(5)-14
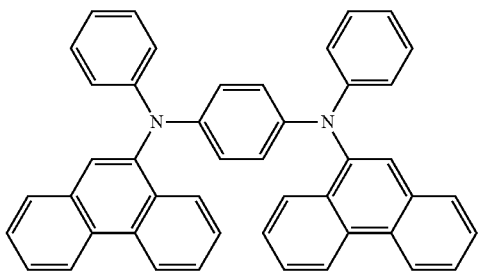 [SMILES: c1ccc(N(c2ccc(N(c3ccccc3)c3cc4ccccc4c4ccccc34)cc2)c2cc3ccccc3c3ccccc23)cc1]
(5)-15
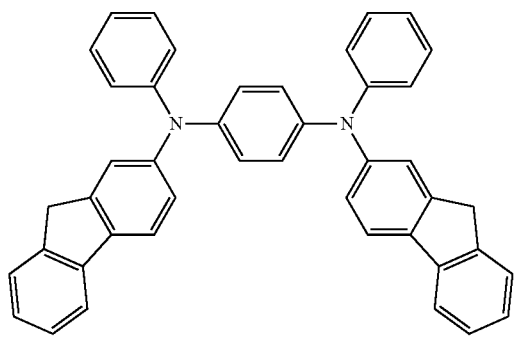 [SMILES: c1ccc(N(c2ccc(N(c3ccccc3)c3ccc4c(c3)Cc3ccccc3-4)cc2)c2ccc3c(c2)Cc2ccccc2-3)cc1]
(5)-16
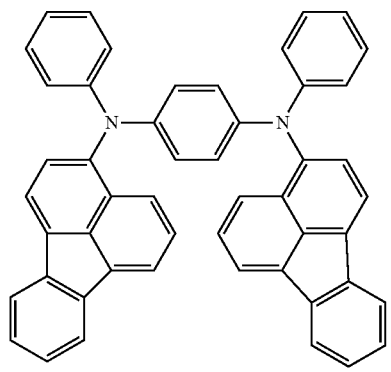 [SMILES: c1ccc(N(c2ccc(N(c3ccccc3)c3ccc4c5c(cccc35)-c3ccccc3-4)cc2)c2ccc3c4c(cccc24)-c2ccccc2-3)cc1]
(5)-17

TABLE 7-continued
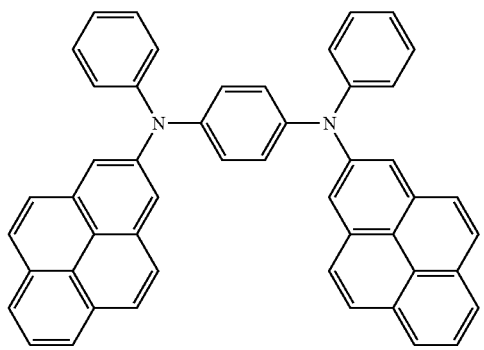 [SMILES: c1ccc(N(c2ccc(N(c3ccccc3)c3cc4ccc5cccc6ccc(c3)c4c56)cc2)c2cc3ccc4cccc5ccc(c2)c3c45)cc1]
(5)-18
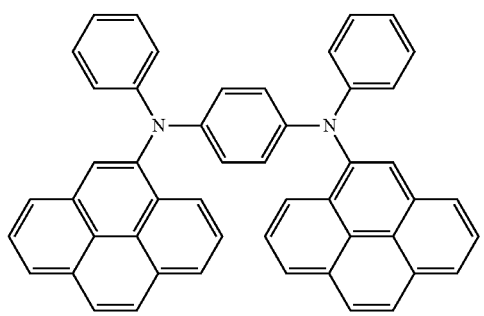 [SMILES: c1ccc(N(c2ccc(N(c3ccccc3)c3cc4cccc5ccc6cccc3c6c54)cc2)c2cc3cccc4ccc5cccc2c5c43)cc1]
(5)-19
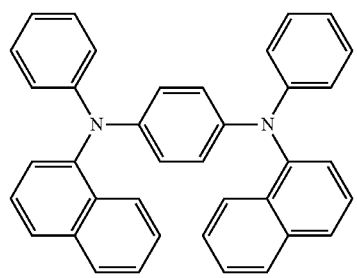 [SMILES: c1ccc(N(c2ccc(N(c3ccccc3)c3cccc4ccccc34)cc2)c2cccc3ccccc23)cc1]
(5)-20
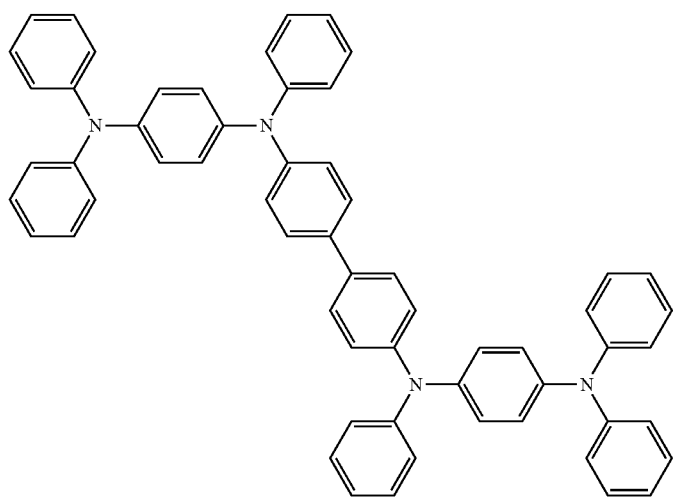 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
(5)-21

TABLE 7-continued
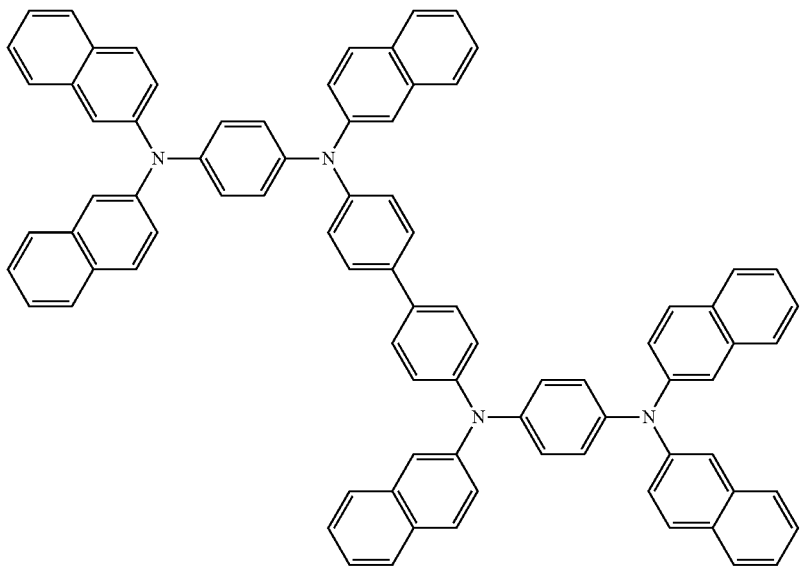 [SMILES: c1ccc2cc(N(c3ccc(-c4ccc(N(c5ccc(N(c6ccc7ccccc7c6)c6ccc7ccccc7c6)cc5)c5ccc6ccccc6c5)cc4)cc3)c3ccc(N(c4ccc5ccccc5c4)c4ccc5ccccc5c4)cc3)ccc2c1]
(5)-22
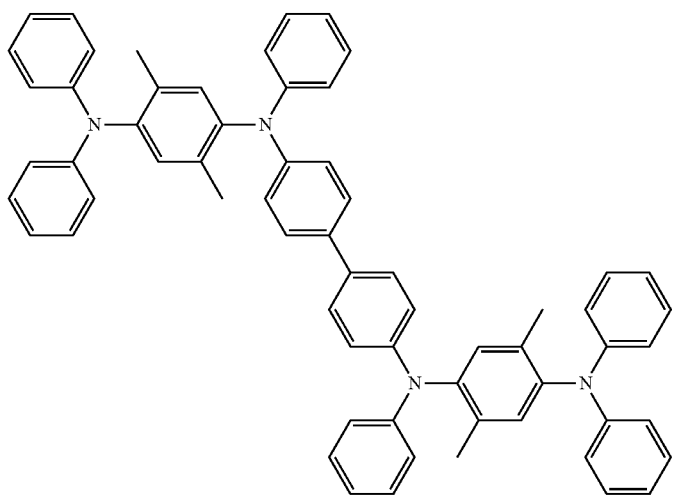 [SMILES: Cc1cc(N(c2ccccc2)c2ccc(-c3ccc(N(c4ccccc4)c4cc(C)c(N(c5ccccc5)c5ccccc5)cc4C)cc3)cc2)c(C)cc1N(c1ccccc1)c1ccccc1]
(5)-23
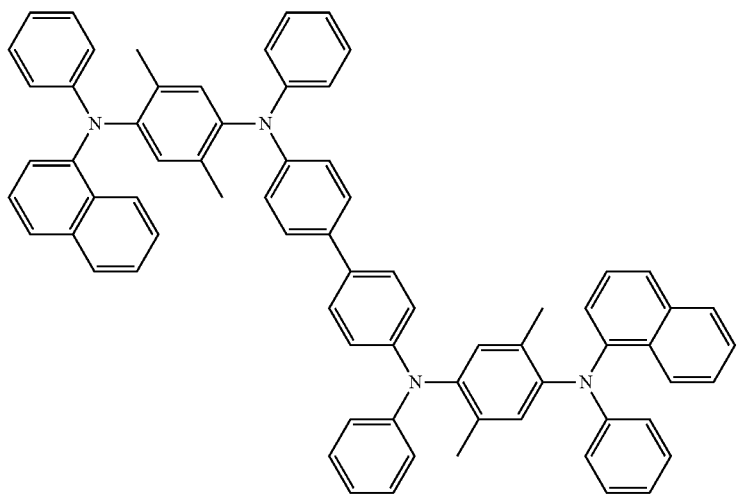 [SMILES: Cc1cc(N(c2ccccc2)c2cccc3ccccc23)c(C)cc1N(c1ccccc1)c1ccc(-c2ccc(N(c3ccccc3)c3cc(C)c(N(c4ccccc4)c4cccc5ccccc45)cc3C)cc2)cc1]
(5)-24

TABLE 8
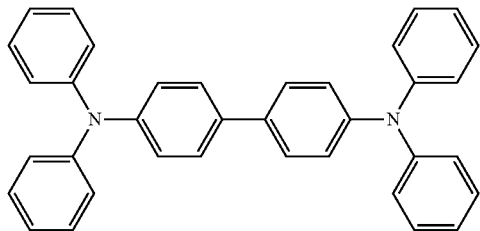 [SMILES: c1ccc(N(c2ccccc2)c2ccc(-c3ccc(N(c4ccccc4)c4ccccc4)cc3)cc2)cc1]
(5)-25
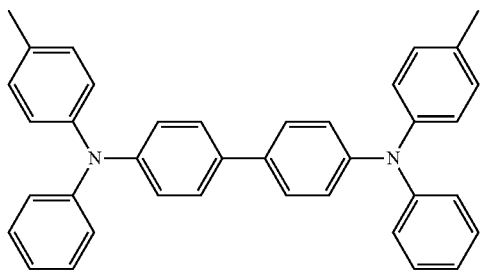 [SMILES: Cc1ccc(N(c2ccccc2)c2ccc(-c3ccc(N(c4ccccc4)c4ccc(C)cc4)cc3)cc2)cc1]
(5)-26
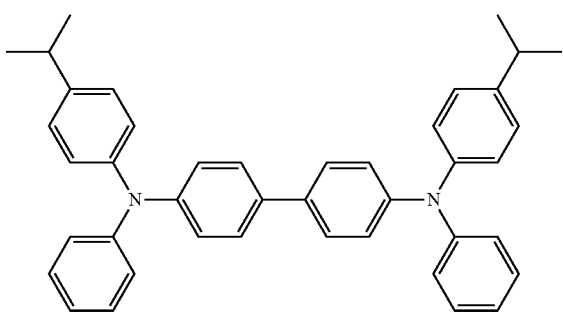 [SMILES: CC(C)c1ccc(N(c2ccccc2)c2ccc(-c3ccc(N(c4ccccc4)c4ccc(C(C)C)cc4)cc3)cc2)cc1]
(5)-27
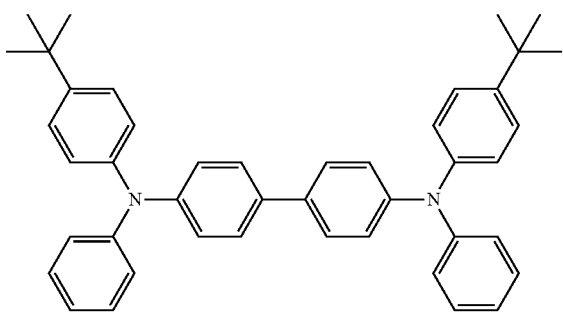 [SMILES: CC(C)(C)c1ccc(N(c2ccccc2)c2ccc(-c3ccc(N(c4ccccc4)c4ccc(C(C)(C)C)cc4)cc3)cc2)cc1]
(5)-28
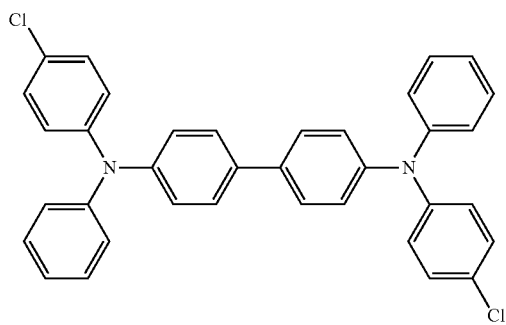 [SMILES: Clc1ccc(N(c2ccccc2)c2ccc(-c3ccc(N(c4ccccc4)c4ccc(Cl)cc4)cc3)cc2)cc1]
(5)-29

TABLE 8-continued
(5)-30
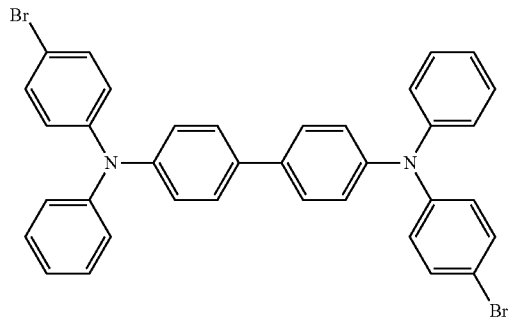 [SMILES: Brc1ccc(N(c2ccccc2)c2ccc(-c3ccc(N(c4ccccc4)c4ccc(Br)cc4)cc3)cc2)cc1]
(5)-31
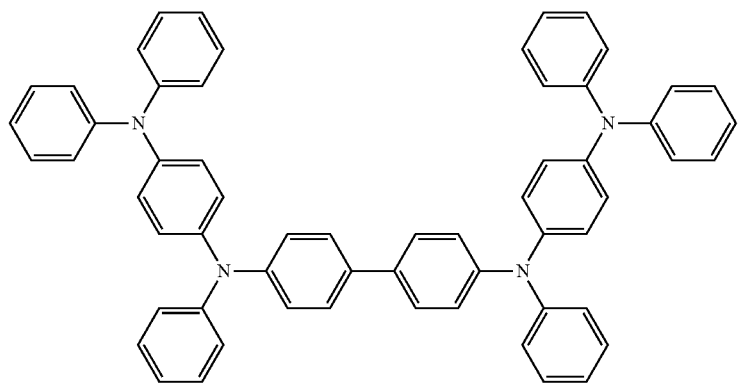 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
(5)-32
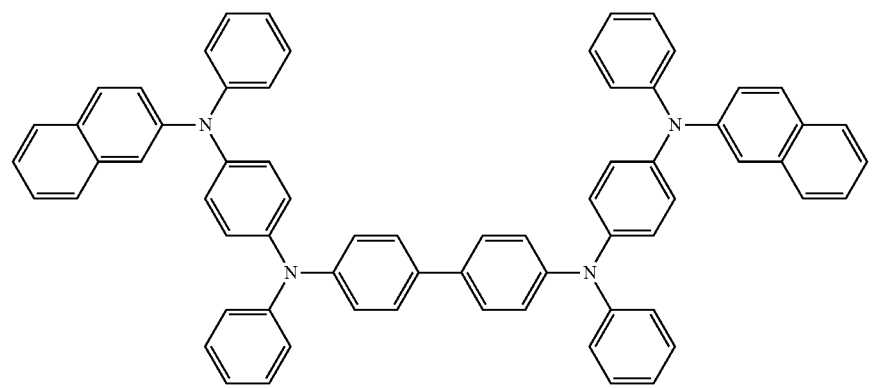 [SMILES: c1ccc(N(c2ccc(-c3ccc(N(c4ccccc4)c4ccc(N(c5ccccc5)c5ccc6ccccc6c5)cc4)cc3)cc2)c2ccc(N(c3ccccc3)c3ccc4ccccc4c3)cc2)cc1]
(5)-33
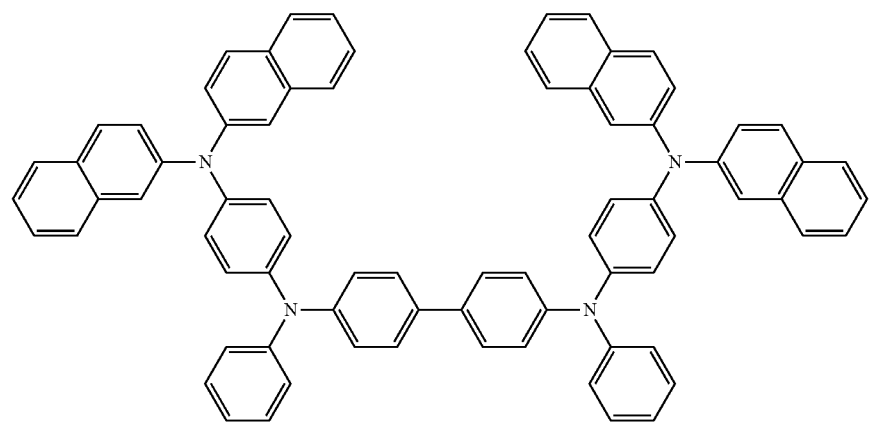 [SMILES: c1ccc(N(c2ccc(-c3ccc(N(c4ccccc4)c4ccc(N(c5ccc6ccccc6c5)c5ccc6ccccc6c5)cc4)cc3)cc2)c2ccc(N(c3ccc4ccccc4c3)c3ccc4ccccc4c3)cc2)cc1]

TABLE 8-continued
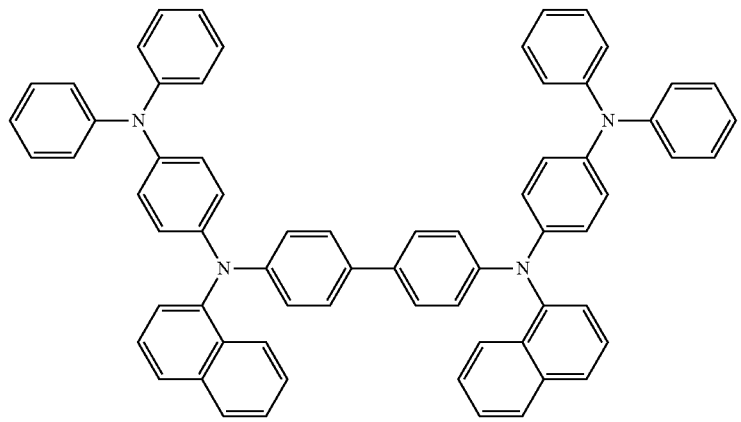 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
(5)-34
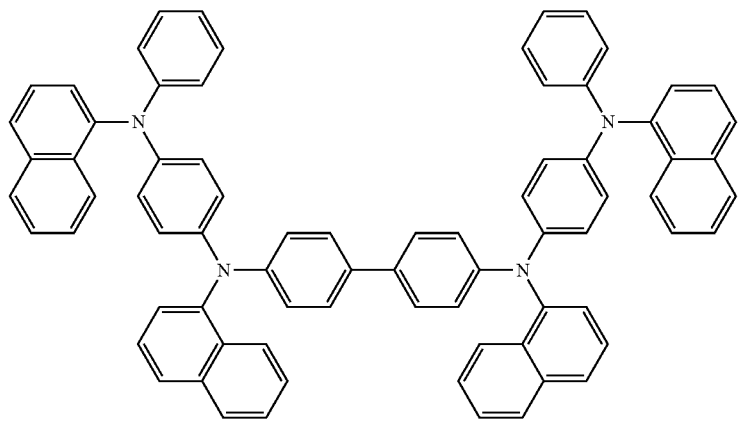 [SMILES: c1ccc(N(c2ccc(N(c3ccc(-c4ccc(N(c5ccc(N(c6ccccc6)c6cccc7ccccc67)cc5)c5cccc6ccccc56)cc4)cc3)c3cccc4ccccc34)cc2)c2cccc3ccccc23)cc1]
(5)-35
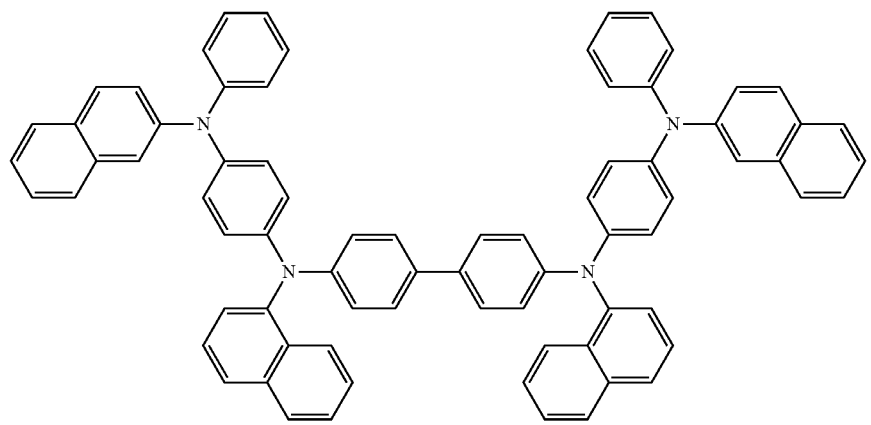 [SMILES: c1ccc(N(c2ccc(N(c3ccc(-c4ccc(N(c5ccc(N(c6ccccc6)c6ccc7ccccc7c6)cc5)c5cccc6ccccc56)cc4)cc3)c3cccc4ccccc34)cc2)c2ccc3ccccc3c2)cc1]
(5)-36
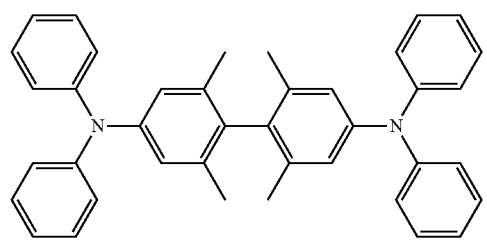 [SMILES: Cc1cc(N(c2ccccc2)c2ccccc2)cc(C)c1-c1c(C)cc(N(c2ccccc2)c2ccccc2)cc1C]
(5)-37

TABLE 8-continued
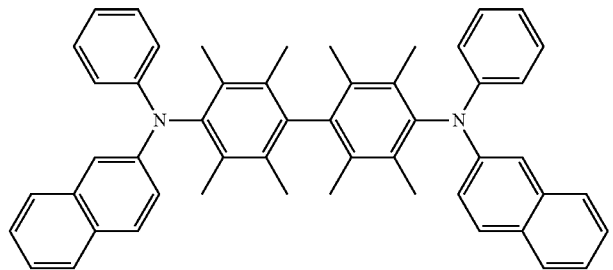 [SMILES: Cc1c(C)c(N(c2ccccc2)c2ccc3ccccc3c2)c(C)c(C)c1-c1c(C)c(C)c(N(c2ccccc2)c2ccc3ccccc3c2)c(C)c1C]
(5)-38
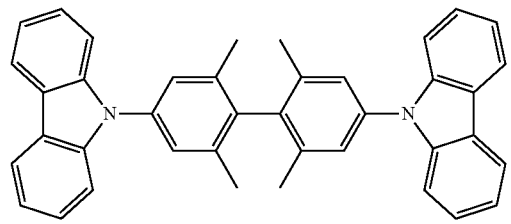 [SMILES: Cc1cc(-n2c3ccccc3c3ccccc32)cc(C)c1-c1c(C)cc(-n2c3ccccc3c3ccccc32)cc1C]
(5)-39
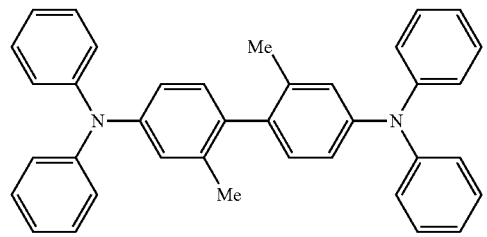 [SMILES: Cc1cc(N(c2ccccc2)c2ccccc2)ccc1-c1ccc(N(c2ccccc2)c2ccccc2)cc1C]
(5)-40
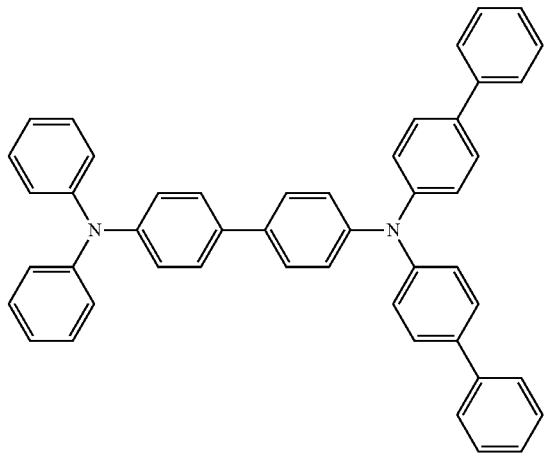 [SMILES: c1ccc(-c2ccc(N(c3ccc(-c4ccccc4)cc3)c3ccc(-c4ccc(N(c5ccccc5)c5ccccc5)cc4)cc3)cc2)cc1]
(5)-41
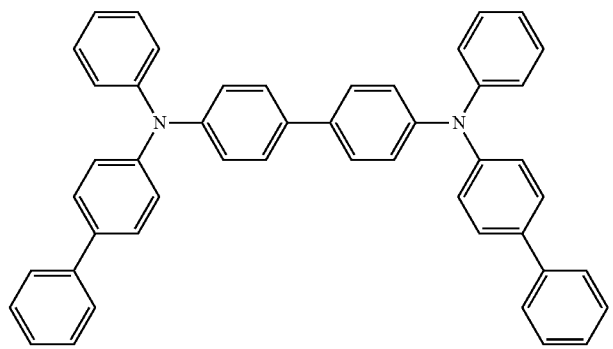 [SMILES: c1ccc(-c2ccc(N(c3ccccc3)c3ccc(-c4ccc(N(c5ccccc5)c5ccc(-c6ccccc6)cc5)cc4)cc3)cc2)cc1]
(5)-42

TABLE 8-continued
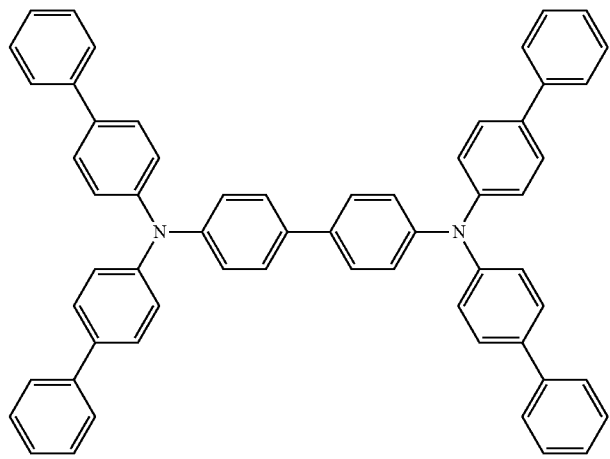 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
(5)-43
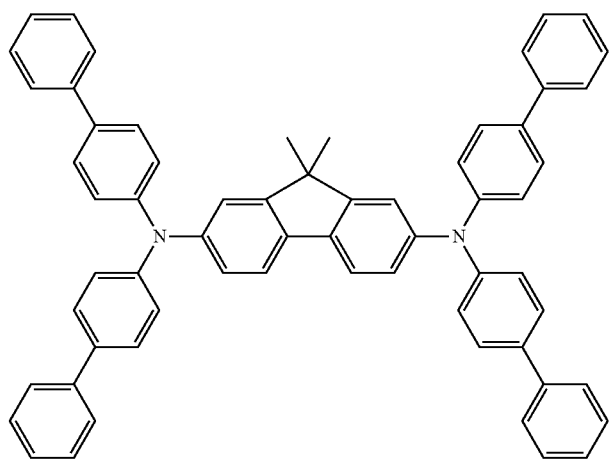 [SMILES: CC1(C)c2cc(N(c3ccc(-c4ccccc4)cc3)c3ccc(-c4ccccc4)cc3)ccc2-c2ccc(N(c3ccc(-c4ccccc4)cc3)c3ccc(-c4ccccc4)cc3)cc21]
(5)-44
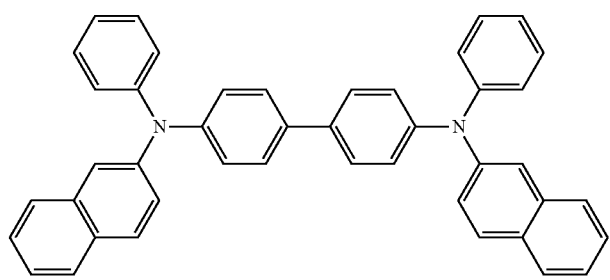 [SMILES: c1ccc(N(c2ccc(-c3ccc(N(c4ccccc4)c4ccc5ccccc5c4)cc3)cc2)c2ccc3ccccc3c2)cc1]
(5)-45
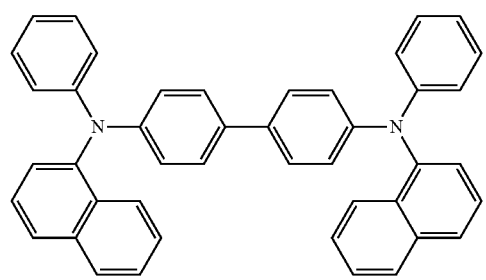 [SMILES: c1ccc(N(c2ccc(-c3ccc(N(c4ccccc4)c4cccc5ccccc45)cc3)cc2)c2cccc3ccccc23)cc1]
(5)-46

TABLE 8-continued
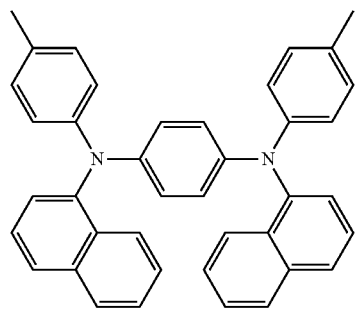 [SMILES: Cc1ccc(N(c2ccc(N(c3ccc(C)cc3)c3cccc4ccccc34)cc2)c2cccc3ccccc23)cc1]
(5)-47
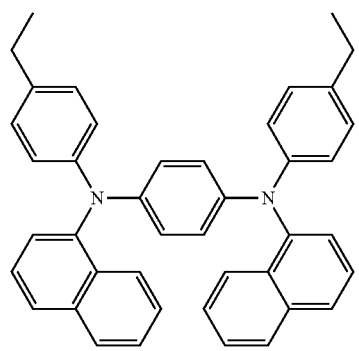 [SMILES: CCc1ccc(N(c2ccc(N(c3ccc(CC)cc3)c3cccc4ccccc34)cc2)c2cccc3ccccc23)cc1]
(5)-48
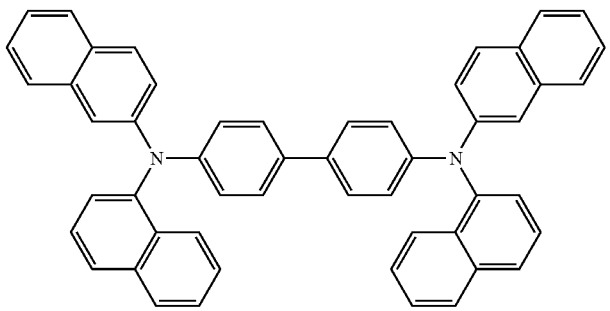 [SMILES: c1ccc2cc(N(c3ccc(-c4ccc(N(c5ccc6ccccc6c5)c5cccc6ccccc56)cc4)cc3)c3cccc4ccccc34)ccc2c1]
(5)-49
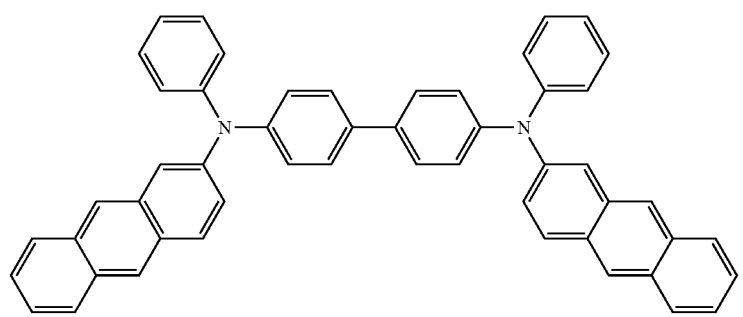 [SMILES: c1ccc(N(c2ccc(-c3ccc(N(c4ccccc4)c4ccc5cc6ccccc6cc5c4)cc3)cc2)c2ccc3cc4ccccc4cc3c2)cc1]
(5)-50

TABLE 8-continued
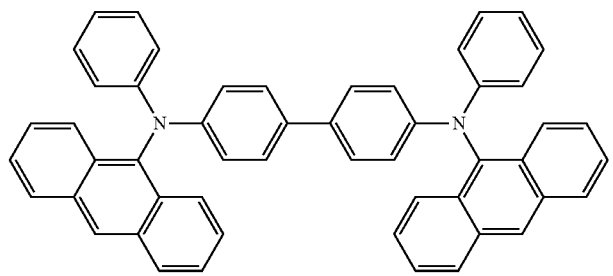 [SMILES: c1ccc(N(c2ccc(-c3ccc(N(c4ccccc4)c4c5ccccc5cc5ccccc45)cc3)cc2)c2c3ccccc3cc3ccccc23)cc1]
(5)-51
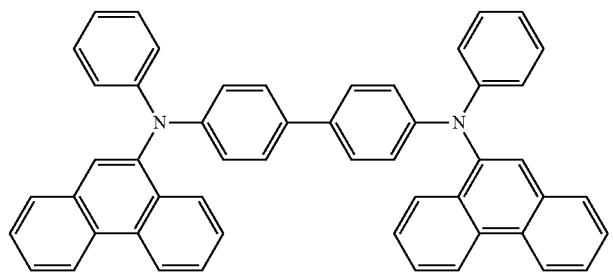 [SMILES: c1ccc(N(c2ccc(-c3ccc(N(c4ccccc4)c4cc5ccccc5c5ccccc45)cc3)cc2)c2cc3ccccc3c3ccccc23)cc1]
(5)-52
TABLE 9
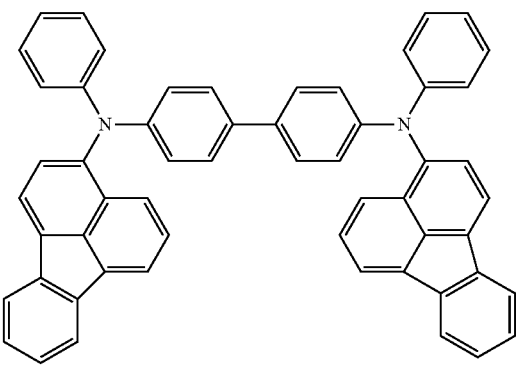 [SMILES: c1ccc(N(c2ccc(-c3ccc(N(c4ccccc4)c4ccc5c6c(cccc46)-c4ccccc4-5)cc3)cc2)c2ccc3c4c(cccc24)-c2ccccc2-3)cc1]
(5)-53
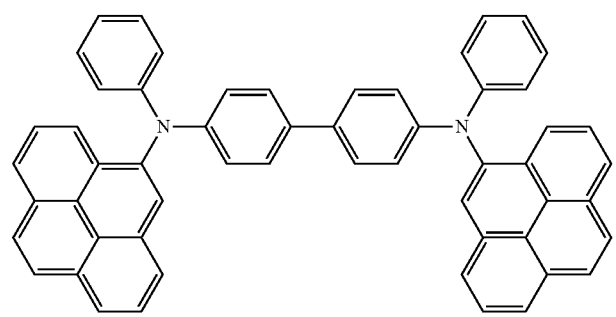
(5)-54

TABLE 9-continued
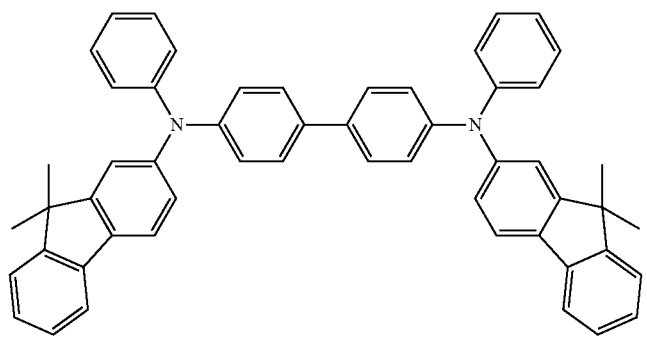 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]
(5)-55
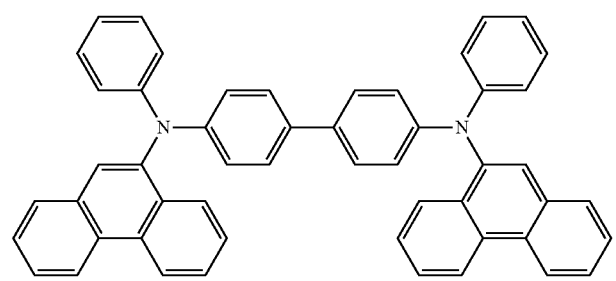 [SMILES: c1ccc(N(c2ccc(-c3ccc(N(c4ccccc4)c4cc5ccccc5c5ccccc45)cc3)cc2)c2cc3ccccc3c3ccccc23)cc1]
(5)-56
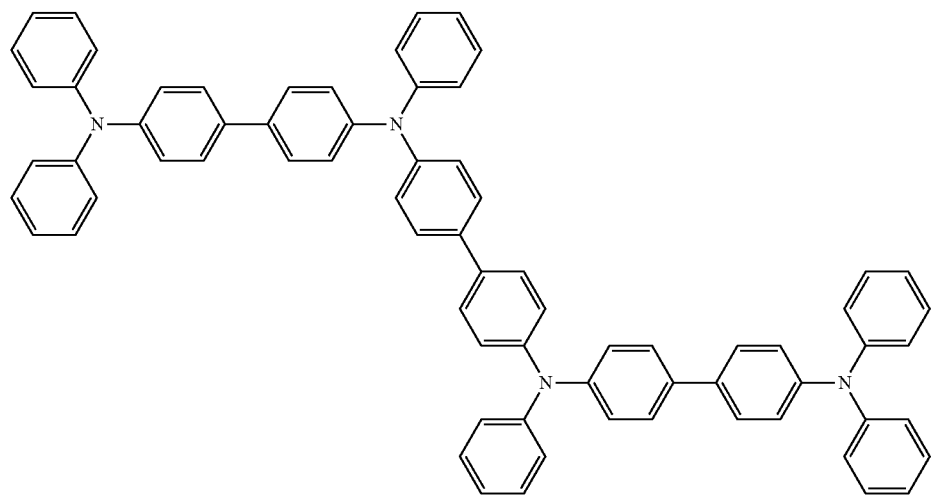 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
(5)-57

TABLE 9-continued
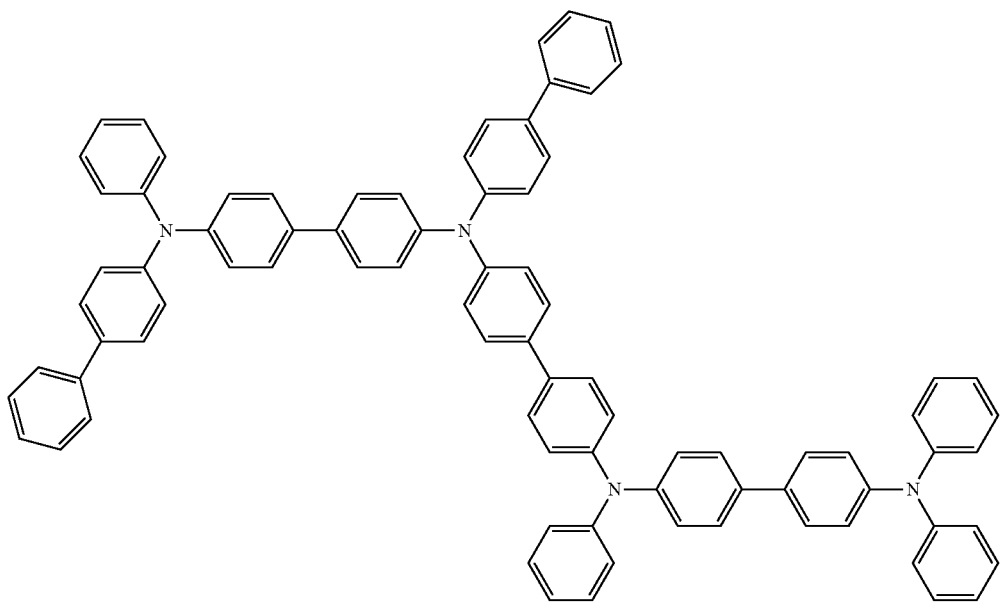 [SMILES: c1ccc(-c2ccc(N(c3ccccc3)c3ccc(-c4ccc(N(c5ccc(-c6ccccc6)cc5)c5ccc(-c6ccc(N(c7ccccc7)c7ccc(-c8ccc(N(c9ccccc9)c9ccccc9)cc8)cc7)cc6)cc5)cc4)cc3)cc2)cc1]
(5)-58
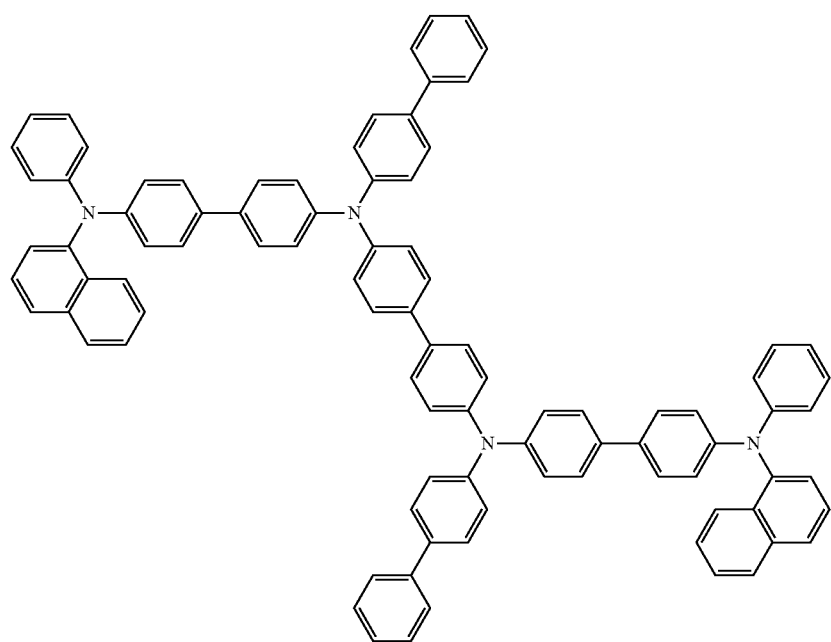 [SMILES: c1ccc(-c2ccc(N(c3ccc(-c4ccc(N(c5ccc(-c6ccccc6)cc5)c5ccc(-c6ccc(N(c7ccccc7)c7cccc8ccccc78)cc6)cc5)cc4)cc3)c3ccc(-c4ccc(N(c5ccccc5)c5cccc6ccccc56)cc4)cc3)cc2)cc1]
(5)-59

TABLE 9-continued
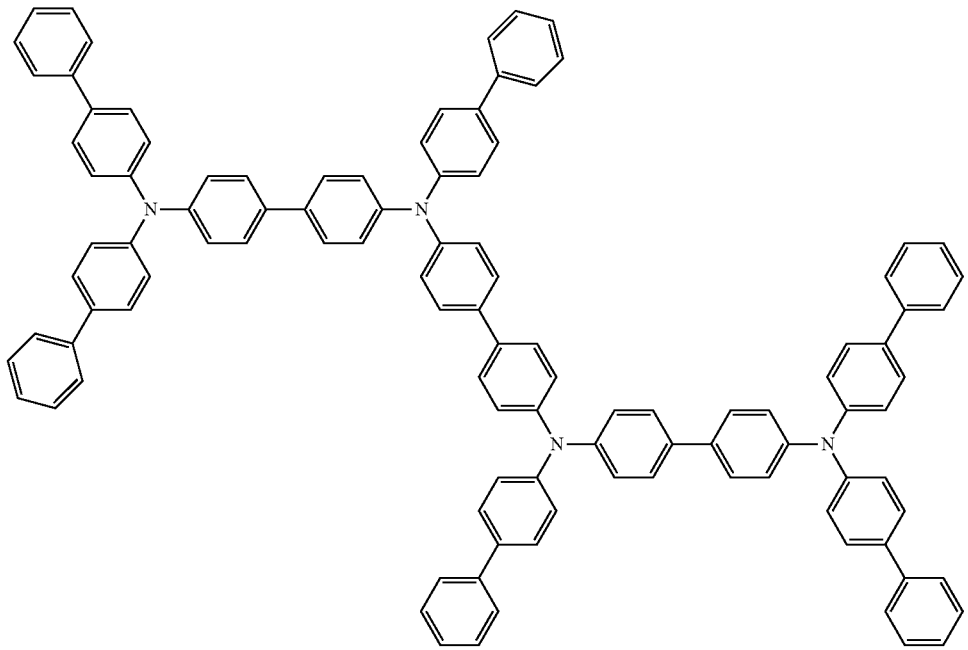 [SMILES: c1ccc(-c2ccc(N(c3ccc(-c4ccccc4)cc3)c3ccc(-c4ccc(N(c5ccc(-c6ccccc6)cc5)c5ccc(-c6ccc(N(c7ccc(-c8ccccc8)cc7)c7ccc(-c8ccc(N(c9ccc(-c%10ccccc%10)cc9)c9ccc(-c%10ccccc%10)cc9)cc8)cc7)cc6)cc5)cc4)cc3)cc2)cc1]
(5)-60
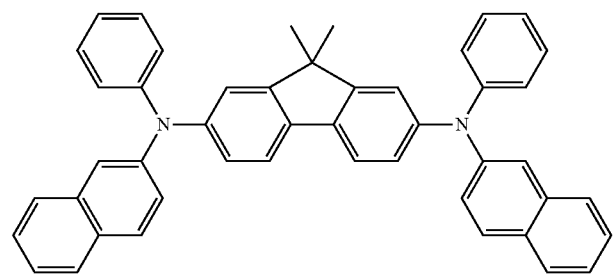
(5)-61
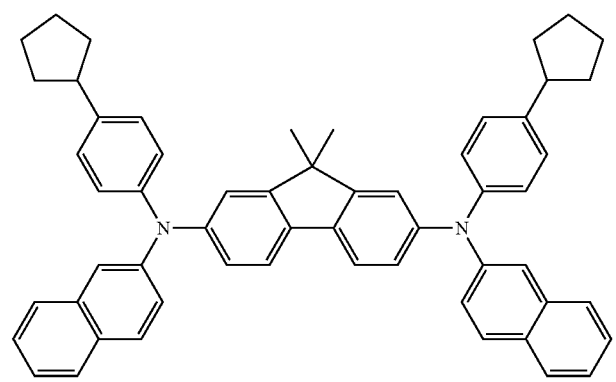 [SMILES: CC1(C)c2cc(N(c3ccc(C4CCCC4)cc3)c3ccc4ccccc4c3)ccc2-c2ccc(N(c3ccc(C4CCCC4)cc3)c3ccc4ccccc4c3)cc21]
(5)-62
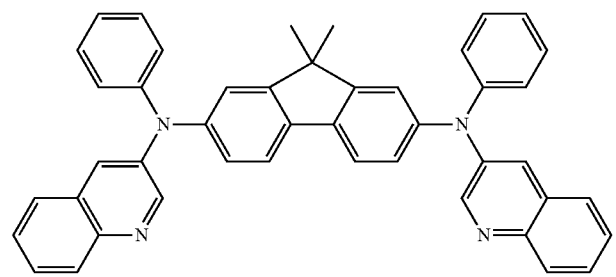 [SMILES: CC1(C)c2cc(N(c3ccccc3)c3cnc4ccccc4c3)ccc2-c2ccc(N(c3ccccc3)c3cnc4ccccc4c3)cc21]
(5)-63

TABLE 9-continued
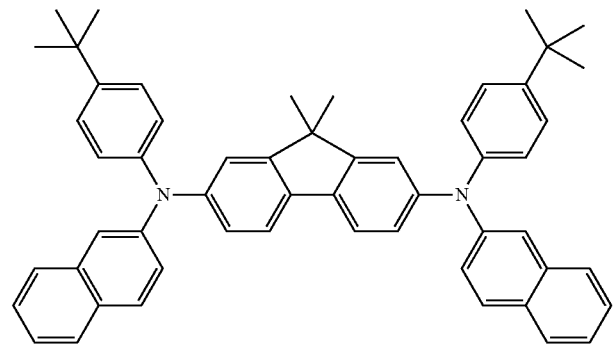 [SMILES: CC(C)(C)c1ccc(N(c2ccc3c(c2)C(C)(C)c2cc(N(c4ccc(C(C)(C)C)cc4)c4ccc5ccccc5c4)ccc2-3)c2ccc3ccccc3c2)cc1]
(5)-64
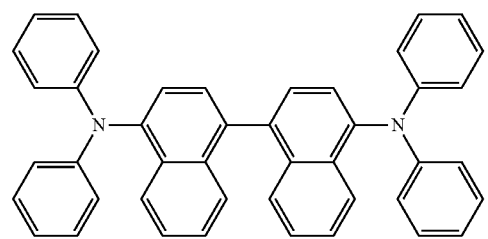 [SMILES: c1ccc(N(c2ccccc2)c2ccc(-c3ccc(N(c4ccccc4)c4ccccc4)c4ccccc34)c3ccccc23)cc1]
(5)-65
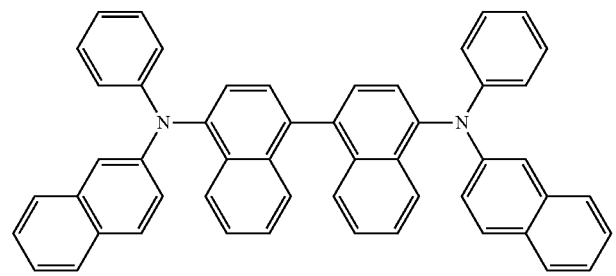 [SMILES: c1ccc(N(c2ccc3ccccc3c2)c2ccc(-c3ccc(N(c4ccccc4)c4ccc5ccccc5c4)c4ccccc34)c3ccccc23)cc1]
(5)-66
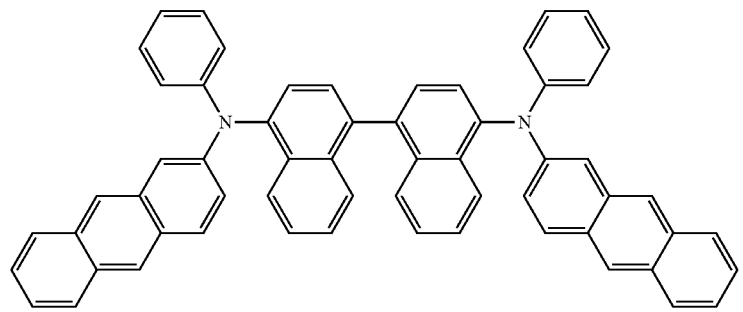 [SMILES: c1ccc(N(c2ccc3cc4ccccc4cc3c2)c2ccc(-c3ccc(N(c4ccccc4)c4ccc5cc6ccccc6cc5c4)c4ccccc34)c3ccccc23)cc1]
(5)-67

TABLE 9-continued
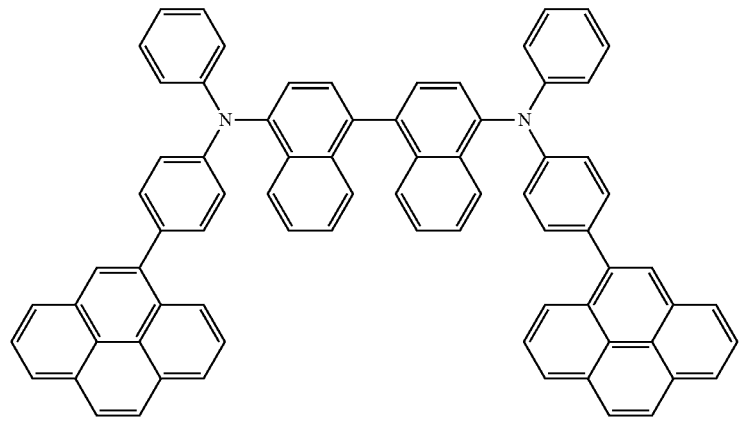 [SMILES: c1ccc(N(c2ccc(-c3cc4cccc5ccc6cccc3c6c54)cc2)c2ccc(-c3ccc(N(c4ccccc4)c4ccc(-c5cc6cccc7ccc8cccc5c8c76)cc4)c4ccccc34)c3ccccc23)cc1]
(5)-68
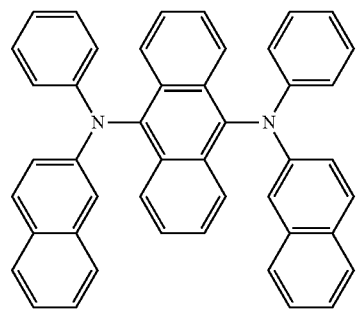 [SMILES: c1ccc(N(c2ccc3ccccc3c2)c2c3ccccc3c(N(c3ccccc3)c3ccc4ccccc4c3)c3ccccc23)cc1]
(5)-69
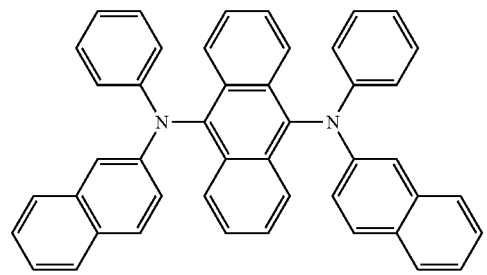 [SMILES: c1ccc(N(c2ccc3ccccc3c2)c2c3ccccc3c(N(c3ccccc3)c3ccc4ccccc4c3)c3ccccc23)cc1]
(5)-70
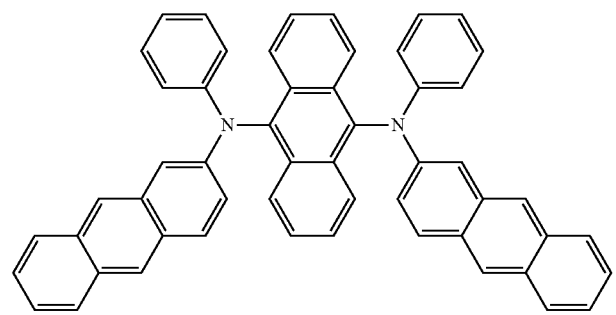 [SMILES: c1ccc(N(c2ccc3cc4ccccc4cc3c2)c2c3ccccc3c(N(c3ccccc3)c3ccc4cc5ccccc5cc4c3)c3ccccc23)cc1]
(5)-71

TABLE 9-continued
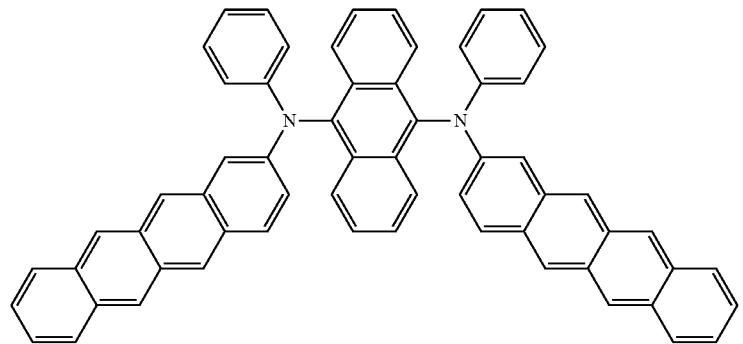 [SMILES: c1ccc(N(c2ccc3cc4cc5ccccc5cc4cc3c2)c2c3ccccc3c(N(c3ccccc3)c3ccc4cc5cc6ccccc6cc5cc4c3)c3ccccc23)cc1]
(5)-72
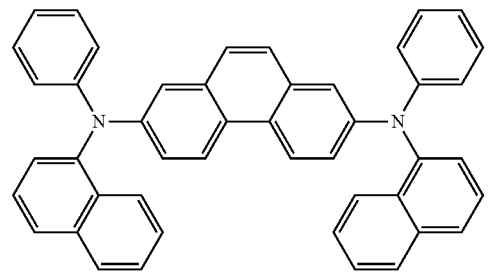 [SMILES: c1ccc(N(c2ccc3c(ccc4cc(N(c5ccccc5)c5cccc6ccccc56)ccc43)c2)c2cccc3ccccc23)cc1]
(5)-73
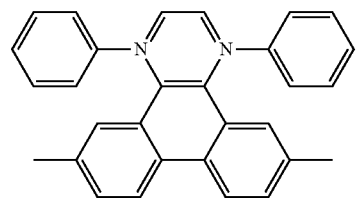
(5)-74
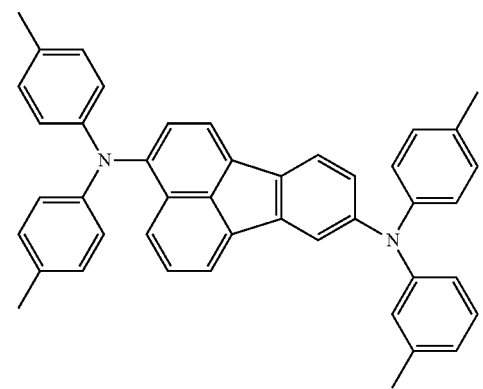 [SMILES: Cc1ccc(N(c2cccc(C)c2)c2ccc3c(c2)-c2cccc4c(N(c5ccc(C)cc5)c5ccc(C)cc5)ccc-3c24)cc1]
(5)-75

TABLE 9-continued
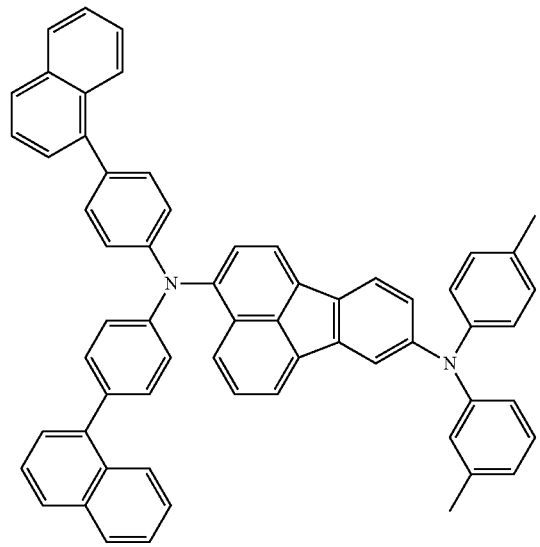 [SMILES: Cc1ccc(N(c2cccc(C)c2)c2ccc3c(c2)-c2cccc4c(N(c5ccc(-c6cccc7ccccc67)cc5)c5ccc(-c6cccc7ccccc67)cc5)ccc-3c24)cc1]
(5)-76
TABLE 10
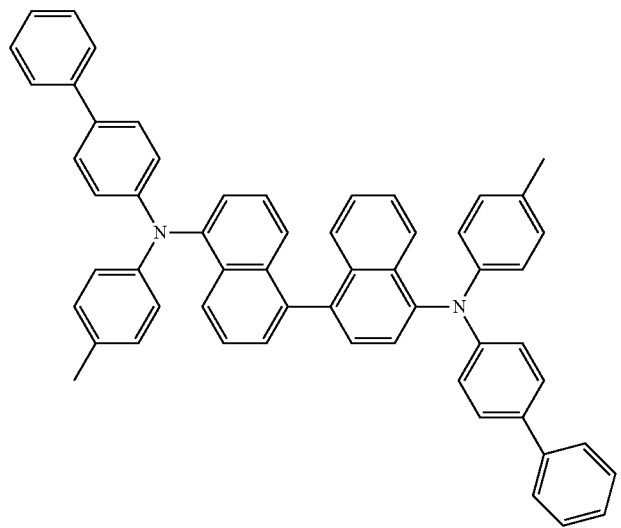 [SMILES: Cc1ccc(N(c2ccc(-c3ccccc3)cc2)c2cccc3c(-c4ccc(N(c5ccc(C)cc5)c5ccc(-c6ccccc6)cc5)c5ccccc45)cccc23)cc1]
(5)-77
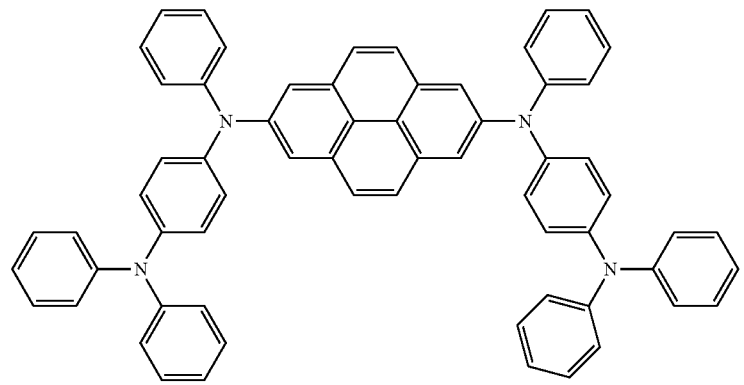 [SMILES: c1ccc(N(c2ccccc2)c2ccc(N(c3ccccc3)c3cc4ccc5cc(N(c6ccccc6)c6ccc(N(c7ccccc7)c7ccccc7)cc6)cc6ccc(c3)c4c56)cc2)cc1]
(5)-78

TABLE 10-continued
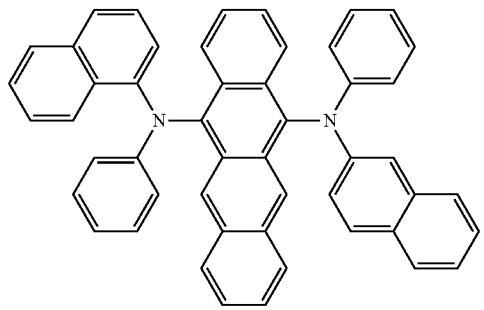 [SMILES: c1ccc(N(c2ccc3ccccc3c2)c2c3ccccc3c(N(c3ccccc3)c3cccc4ccccc34)c3cc4ccccc4cc23)cc1]
(5)-79
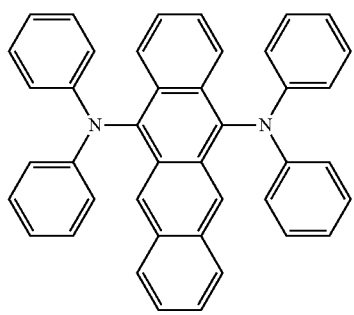 [SMILES: c1ccc(N(c2ccccc2)c2c3ccccc3c(N(c3ccccc3)c3ccccc3)c3cc4ccccc4cc23)cc1]
(5)-80
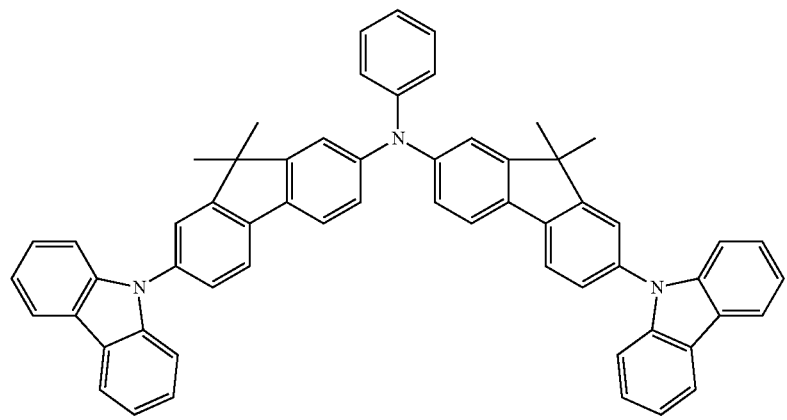 [SMILES: CC1(C)c2cc(N(c3ccccc3)c3ccc4c(c3)C(C)(C)c3cc(-n5c6ccccc6c6ccccc65)ccc3-4)ccc2-c2ccc(-n3c4ccccc4c4ccccc43)cc21]
(5)-81
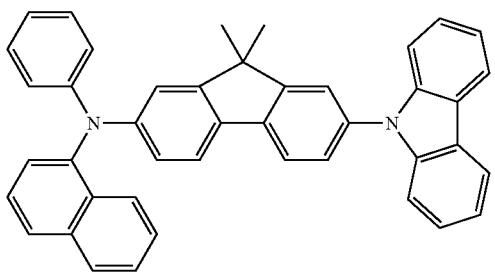 [SMILES: CC1(C)c2cc(N(c3ccccc3)c3cccc4ccccc34)ccc2-c2ccc(-n3c4ccccc4c4ccccc43)cc21]
(5)-82

TABLE 10-continued

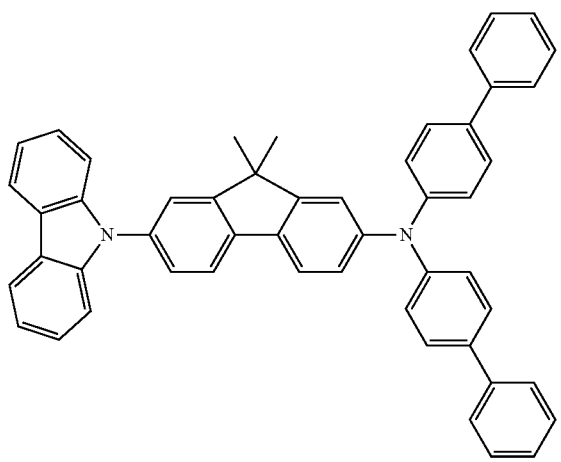 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

(5)-83

Moreover, in the triarylamine multimeric complex represented by the above-described general expression (6), $A_7$ to $A_{12}$ in the general expression (6) independently represent an aromatic hydrocarbon with 6 to 20 carbon atoms. The aromatic hydrocarbon in each of $A_7$ to $A_{12}$ may be unsubstituted or may have a substituent group. In this case, the substituent group is selected from among hydrogen, halogen, a hydroxyl group, an aldehyde group, a carbonyl group, a carbonyl ester group, an alkyl group, an alkenyl group, a cyclic alkyl group, an alkoxy group, an aryl group, an amino group, a heterocyclic group, a cyano group, a nitrile group, a nitro group and a silyl group. Any number of hydrogen atoms of the aromatic hydrocarbon in $A_7$ to $A_{12}$ may be replaced with these substituent groups. $Z_1$ to $Z_3$ in the general expression (6) each represent an aromatic hydrocarbon, and are one selected from benzene, naphthalene, anthracene, phenanthrene, naphthacene, fluoranthene and perylene. Moreover, p, q and r in the general expression (6) each represent an integer of 1 or more. $A_7$ and $A_8$, $A_9$ and $A_{10}$, and $A_{11}$ and $A_{12}$ in the general expression (6) may be connected to each other through a linking group.

Herein, specific examples of the above-described triarylamine multimeric complex include compounds represented by the following structural expressions (6)-1 to (6)-15.

TABLE 11

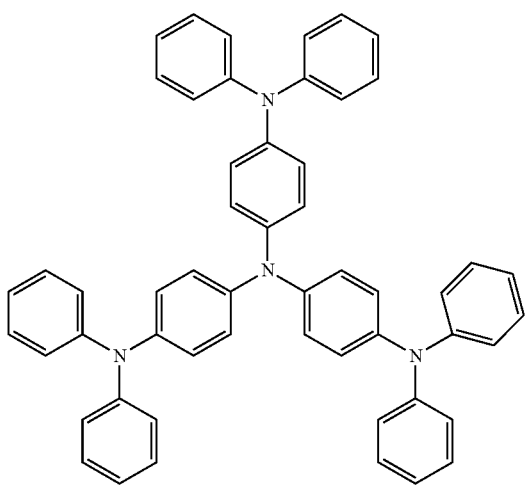 [SMILES: c1ccc(N(c2ccccc2)c2ccc(N(c3ccc(N(c4ccccc4)c4ccccc4)cc3)c3ccc(N(c4ccccc4)c4ccccc4)cc3)cc2)cc1]

(6)-1

TABLE 11-continued
(6)-2
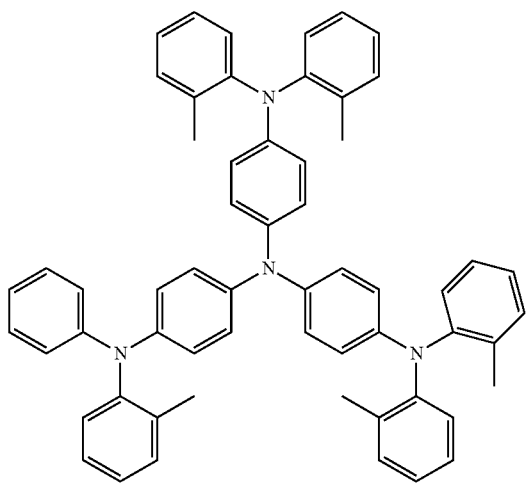 [SMILES: Cc1ccccc1N(c1ccccc1)c1ccc(N(c2ccc(N(c3ccccc3C)c3ccccc3C)cc2)c2ccc(N(c3ccccc3C)c3ccccc3C)cc2)cc1]
(6)-3
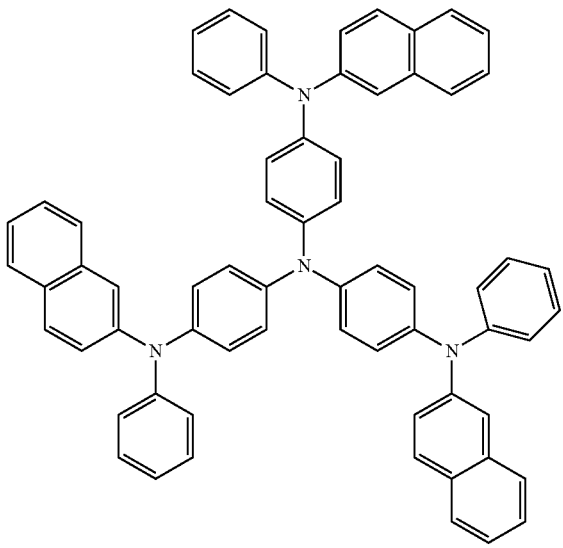 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]
(6)-4
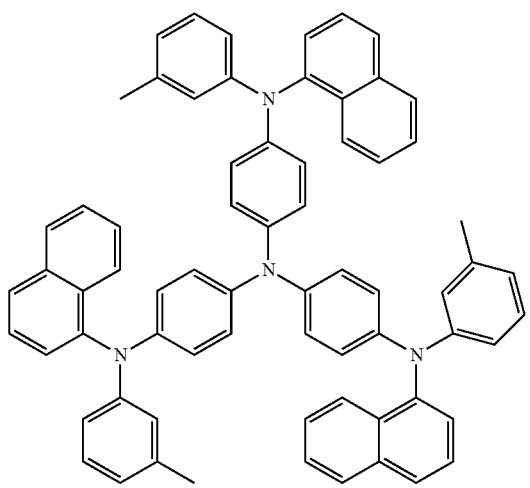 [SMILES: Cc1cccc(N(c2ccc(N(c3ccc(N(c4cccc(C)c4)c4cccc5ccccc45)cc3)c3ccc(N(c4cccc(C)c4)c4cccc5ccccc45)cc3)cc2)c2cccc3ccccc23)c1]

TABLE 11-continued
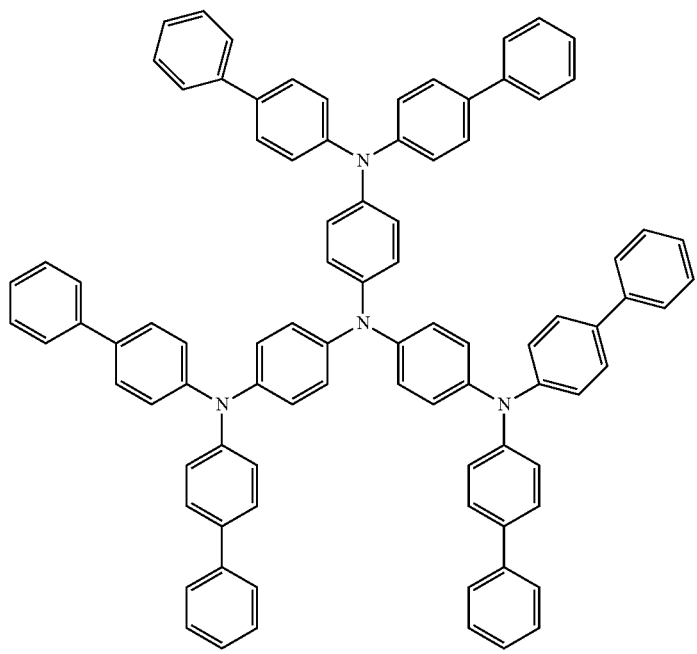 [SMILES: c1ccc(-c2ccc(N(c3ccc(-c4ccccc4)cc3)c3ccc(N(c4ccc(N(c5ccc(-c6ccccc6)cc5)c5ccc(-c6ccccc6)cc5)cc4)c4ccc(N(c5ccc(-c6ccccc6)cc5)c5ccc(-c6ccccc6)cc5)cc4)cc3)cc2)cc1]
(6)-5
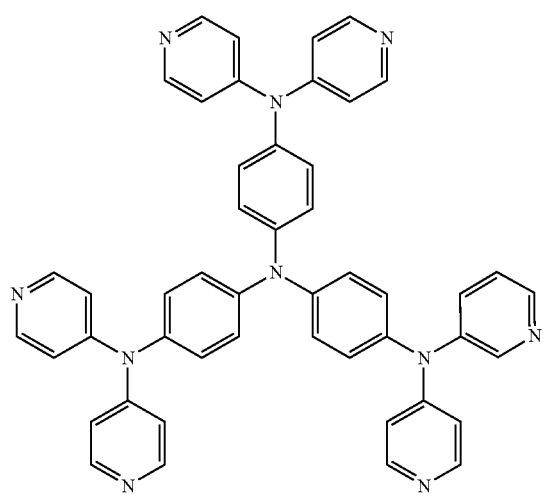 [SMILES: c1cncc(N(c2ccncc2)c2ccc(N(c3ccc(N(c4ccncc4)c4ccncc4)cc3)c3ccc(N(c4ccncc4)c4ccncc4)cc3)cc2)c1]
(6)-6

TABLE 11-continued
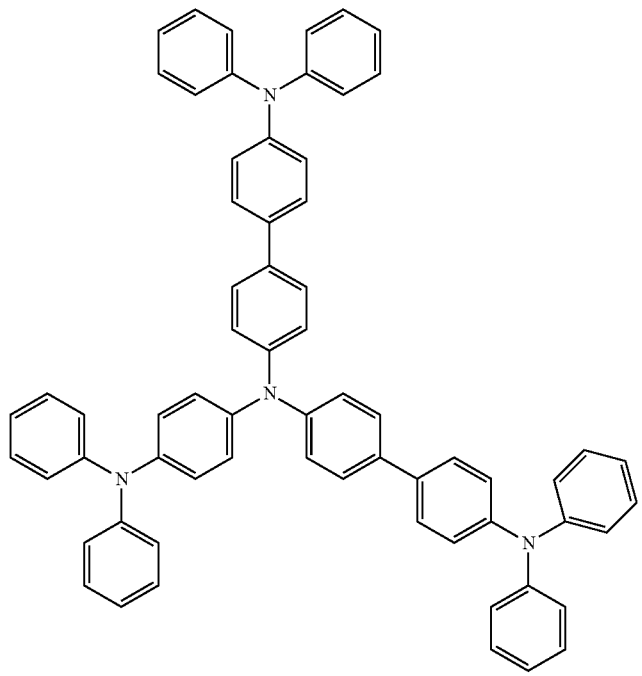 [SMILES: c1ccc(N(c2ccccc2)c2ccc(-c3ccc(N(c4ccc(-c5ccc(N(c6ccccc6)c6ccccc6)cc5)cc4)c4ccc(N(c5ccccc5)c5ccccc5)cc4)cc3)cc2)cc1]
(6)-7
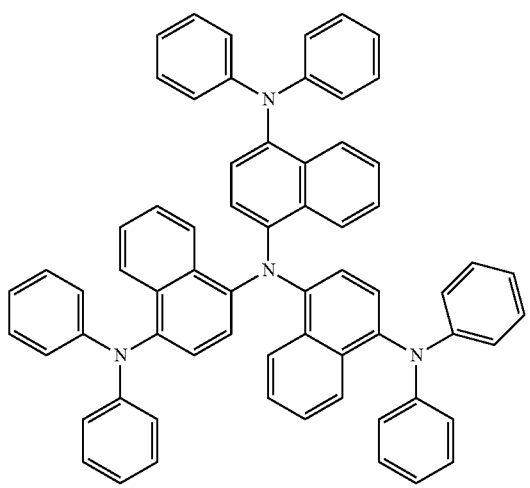 [SMILES: c1ccc(N(c2ccccc2)c2ccc(N(c3ccc(N(c4ccccc4)c4ccccc4)c4ccccc34)c3ccc(N(c4ccccc4)c4ccccc4)c4ccccc34)c3ccccc23)cc1]
(6)-8

TABLE 11-continued
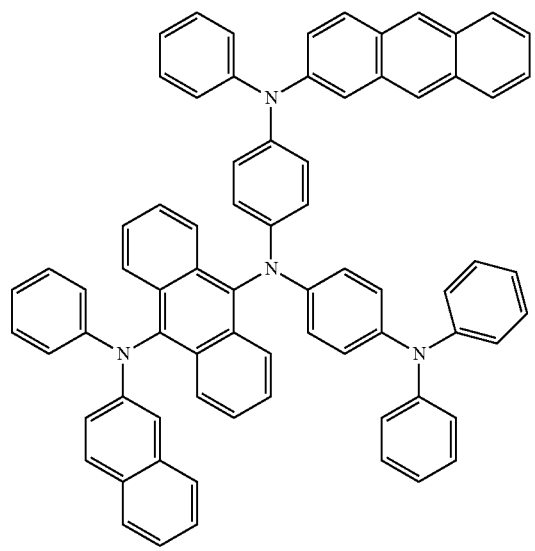 [SMILES: c1ccc(N(c2ccccc2)c2ccc(N(c3ccc(N(c4ccccc4)c4ccc5cc6ccccc6cc5c4)cc3)c3c4ccccc4c(N(c4ccccc4)c4ccc5ccccc5c4)c4ccccc34)cc2)cc1]
(6)-9
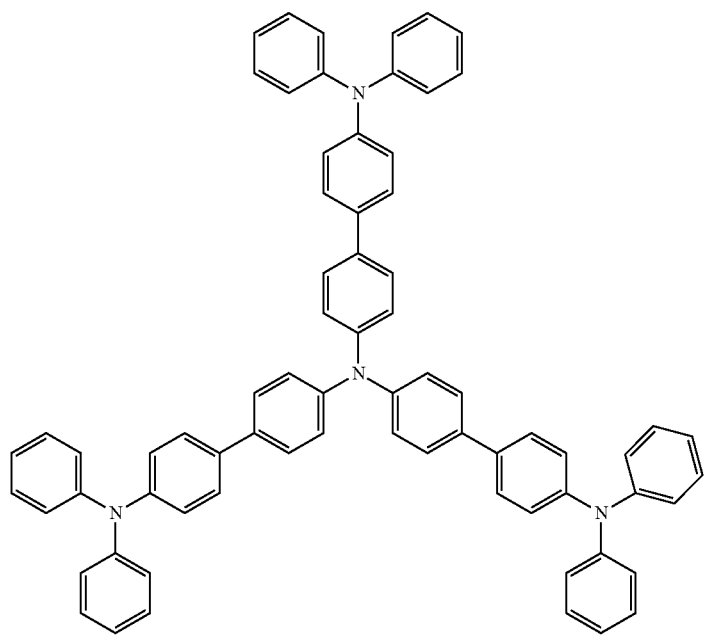 [SMILES: c1ccc(N(c2ccccc2)c2ccc(-c3ccc(N(c4ccc(-c5ccc(N(c6ccccc6)c6ccccc6)cc5)cc4)c4ccc(-c5ccc(N(c6ccccc6)c6ccccc6)cc5)cc4)cc3)cc2)cc1]
(6)-10

TABLE 11-continued
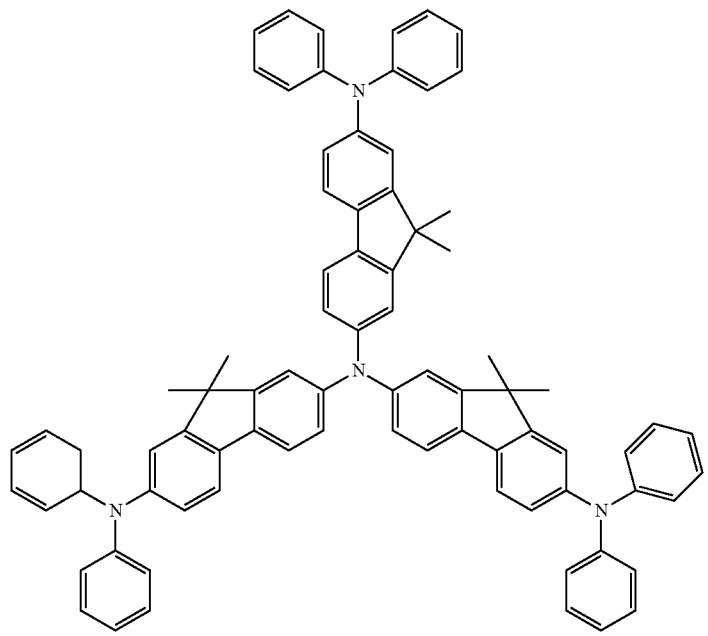 [SMILES: CC1(C)c2cc(N(c3ccccc3)c3ccccc3)ccc2-c2ccc(N(c3ccc4c(c3)C(C)(C)c3cc(N(c5ccccc5)c5ccccc5)ccc3-4)c3ccc4c(c3)C(C)(C)c3cc(N(c5ccccc5)C5C=CC=CC5)ccc3-4)cc21]
(6)-11
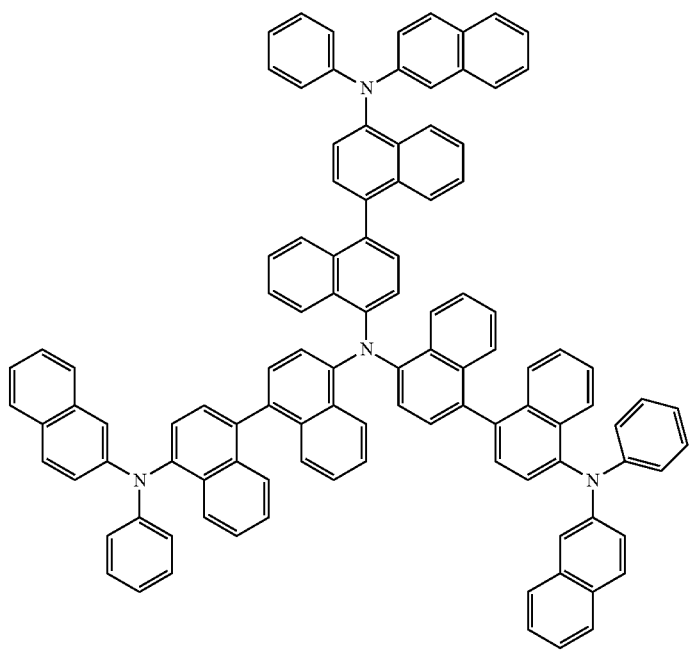 [SMILES: c1ccc(N(c2ccc3ccccc3c2)c2ccc(-c3ccc(N(c4ccc(-c5ccc(N(c6ccccc6)c6ccc7ccccc7c6)c6ccccc56)c5ccccc45)c4ccc(-c5ccc(N(c6ccccc6)c6ccc7ccccc7c6)c6ccccc56)c5ccccc45)c4ccccc34)c3ccccc23)cc1]
(6)-12

TABLE 11-continued
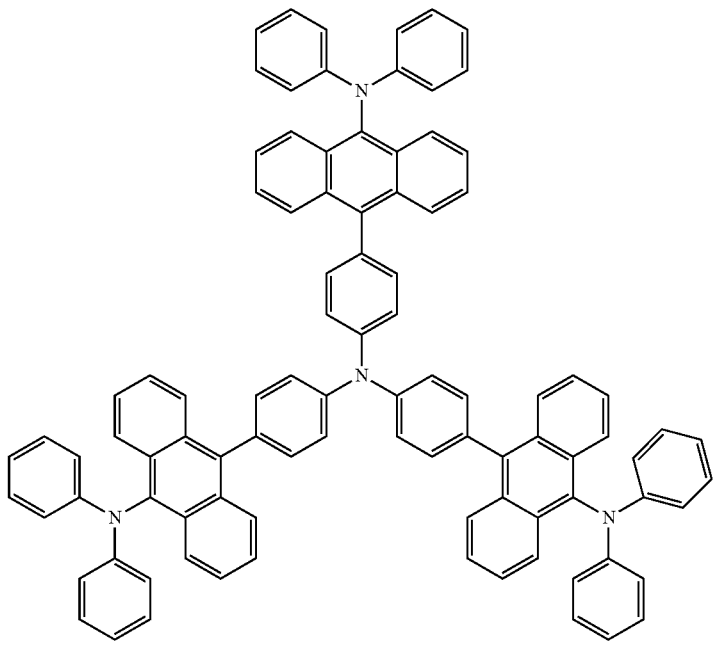 [SMILES: c1ccc(N(c2ccccc2)c2c3ccccc3c(-c3ccc(N(c4ccc(-c5c6ccccc6c(N(c6ccccc6)c6ccccc6)c6ccccc56)cc4)c4ccc(-c5c6ccccc6c(N(c6ccccc6)c6ccccc6)c6ccccc56)cc4)cc3)c3ccccc23)cc1]
(6)-13
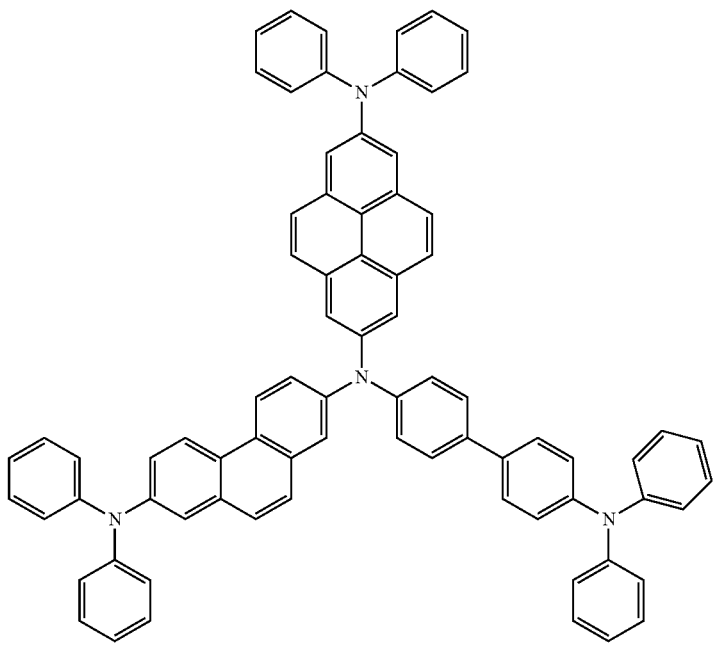 [SMILES: c1ccc(N(c2ccccc2)c2ccc(-c3ccc(N(c4ccc5c(ccc6cc(N(c7ccccc7)c7ccccc7)ccc65)c4)c4cc5ccc6cc(N(c7ccccc7)c7ccccc7)cc7ccc(c4)c5c67)cc3)cc2)cc1]
(6)-14

TABLE 11-continued

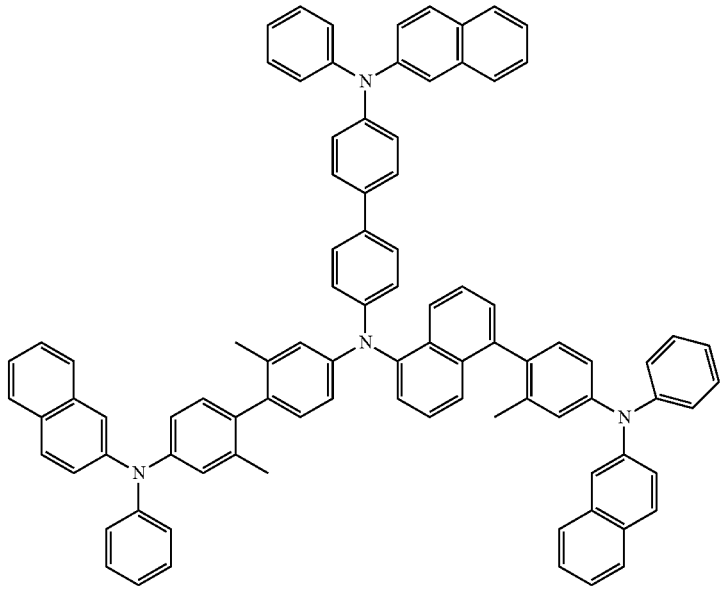 [SMILES: Cc1cc(N(c2ccccc2)c2ccc3ccccc3c2)ccc1-c1ccc(N(c2ccc(-c3ccc(N(c4ccccc4)c4ccc5ccccc5c4)cc3)cc2)c2cccc3c(-c4ccc(N(c5ccccc5)c5ccc6ccccc6c5)cc4C)cccc23)cc1C]

(6)-15

Each of the layers 14a to 14d configuring the above organic layer 14 may include any other element. Moreover, each of the layers 14a to 14d may have a laminate configuration. For example, the light-emitting layer 14c may be configured of a laminate configuration including a blue light-emitting layer, a green light-emitting layer and a red light-emitting layer so as to configure an organic EL element emitting white light.

7. Thickness Configuration of Organic Layer

Next, the thickness configuration of the organic layer 14 configured by laminating layers made of the above-described materials will be described below.

Referring to FIG. 1, the thickness of the light-emitting layer 14c in the organic layer 14 is [d1], and the total thickness of the whole organic layer 14 is [da]. In this case, the total thickness [da] of the organic layer 14 and the thickness [d1] of the light-emitting layer 14c are designed so as to satisfy a relationship of $0.90 > [d1]/[da] > 0.30$. Thereby, as will be described later in working examples, the relationship is preferable because a balance between supply of holes and electrons to the light-emitting layer 14c is easily achieved, and an improvement in current efficiency and light emission life is achieved.

Reasons for the mathematical expression will be described below. First, in a configuration where a cathode is directly formed on the light-emitting layer 14c including a host material, diffusion of after-mentioned excitons to the cathode is concerned. Therefore, it is considered necessary to arrange the electron injection layer 14d between the light-emitting layer 14c and the cathode 15. Moreover, to absorb roughness of a substrate surface (in the case of a top emission element, a surface of the anode 13), it is considered necessary to arrange a hole supply layer such as the hole injection layer 14a and the hole transport layer 14b between the light-emitting layer 14c and the anode 13.

For example, the total thickness [da] of the organic layer 14 of a blue light-emitting element by a first interference is generally approximately 170 to 250 nm, and is preferably 150 nm or over. Herein, to smoothly carry out electron injection to the light-emitting layer 14c and to absorb roughness of the substrate surface, it is considered necessary for the organic layer 14 to have a total thickness of 200 nm. This is a reason for a numerical lower limit of $[d1]/[da]$.

On the other hand, a reason for a numerical upper limit will be described in detail below, and the numerical upper limit is defined in consideration of a necessary recombination region for generating excitons and the diffusion length of the generated exciton.

The light-emitting layer 14c is preferably formed with a thickness [d1] of 70 nm or over, and when the light-emitting layer 14c is formed with a thickness of 70 nm or over, electron supply is not excessive, and is allowed to be balanced against hole supply.

A reason for the value of 70 nm will be described below. Holes and electrons injected into the light-emitting layer 14c are recombined to generate excitons, thereby emitting light, but the recombination region is generally localized in a thickness of approximately 20 nm. A distribution of the recombination region in the light-emitting layer 14c may be a normal distribution or a Poisson distribution in the case where the recombination region is close to the center of the thickness of the light-emitting layer 14c. In the case where the recombination region is localized in an interface of the light-emitting layer 14c, the distribution of the recombination region may adhere to an χ2 distribution (an χ square distribution) or a normal distribution, and the distribution of the recombination region is determined by the properties of the host material and the luminous guest material configuring the light-emitting layer 14c, and is not allowed to be uniquely defined. The diffusion length of the generated exciton is generally within 30 nm.

There is a device in which the recombination region is located in the center of the light-emitting layer 14c. In this case, in the case where a necessary thickness for the recombination region is 20 nm, and 25 nm each in a direction toward the anode 13 and a direction toward the cathode 15 is secured as the diffusion length of the exciton, 70 nm or over is necessary at minimum for the thickness [d1] of the light-emitting layer 14c.

In the case where a sufficient thickness including the diffusion length of the exciton is not secured, exciton energy is diffused to the hole supply layer or the electron transport layer around the light-emitting layer 14c, and as a result, deterioration in device characteristics such as a decline in luminous efficiency or a reduction in life occurs, and it is extremely unfavorable. In addition, as long as the thickness [d1] of the light-emitting layer 14c is 70 nm or over in total, the light-emitting layer 14c may have a laminate configuration in which different anthracene derivatives are laminated.

Next, the total thickness [d2] of the hole supply layer configured of the hole injection layer 14a and the hole transport layer 14b is smaller than the thickness [d1] of the light-emitting layer 14c. To achieve a balance of hole supply capacity against the light-emitting layer 14c, the total thickness [d2] of the hole injection layer 14a and the hole transport layer 14b is preferably set to 60 nm or less. It is because, to bring light extraction efficiency close to maximum, in the case where the recombination region is localized on an interface side between the hole supply layer and the light-emitting layer 14c, the thickness [d2] of the hole supply layer is preferably 60 nm or less as derived from a mathematical expression (2) which will be described later.

The organic EL element 11 has a resonator configuration in which emitted light is resonated between the anode 13 and the cathode 15 to be extracted, so color purity of extracted light is improvable, and the intensity of extracted light around a center wavelength of resonance is improvable. In this case, for example, a reflection end surface on the light-emitting layer 14c side of the anode 13 is a first end section P1 and a reflection end surface on the light-emitting layer 14c side of the cathode 15 is a second end section P2, and the organic layer 14 is a resonance section. Then, in the case of a resonator configuration in which light generated in the light-emitting layer 14c is resonated to be extracted from the second end section P2, an optical distance L between the first end section P1 and the second end section P2 of a resonator is set so as to satisfy the following mathematical expression (1). Actually, the optical distance L is preferably selected so as to have a positive minimum value satisfying the mathematical expression (1).

[Mathematical Expression 1]

$$(2L)/\lambda + \Phi/(2\pi) = m \quad \text{Mathematical Expression (1)}$$

In the mathematical expression (1), L is an optical distance between the first end section P1 and the second end section P2. $\Phi$ is the sum ($\Phi = \Phi_1 + \Phi_2$) (rad) of a phase shift $\Phi_1$ of reflected light generated in the first end section P1 and a phase shift $\Phi_2$ of reflected light generated in the second end section P2. $\lambda$ is a peak wavelength of a spectrum of light which is desired to be extracted from the second end section P2. Further, m is an integer allowing L to be positive. In addition, in the mathematical expression (1), L and $\lambda$ may have a common unit, for example, (nm) as a unit.

Moreover, in the organic light-emitting device 11, an optical distance $L_1$ between a maximum light emission position of the light-emitting layer 14c and the first end section P1 is adjusted so as to satisfy the following mathematical expression (2), and an optical distance $L_2$ between the maximum light emission position and the second end section P2 is adjusted so as to satisfy the following mathematical expression (3). Herein, the maximum light emission position means a position where light emission intensity is largest in the light emission region. For example, in the case where light is emitted in interfaces on both of the anode 13 side and the cathode 15 side of the light-emitting layer 14c, the maximum light emission position is an interface with larger light emission intensity.

[Mathematical Expression 2]

$$\left. \begin{array}{l} L_1 = tL_1 + a_1 \\ (2tL_1)/\lambda = -\Phi_1/(2\pi) + m_1 \end{array} \right\} \quad \text{Mathematical Expression (2)}$$

In the mathematical expression (2), $tL_1$ is an optical theoretical distance between the first end section P1 and the maximum light emission position. Further, $a_1$ is a correction amount based on a light emission distribution in the light-emitting layer 14c. $\lambda$ is a peak wavelength of a spectrum of light which is desired to be extracted. $\Phi_1$ is a phase shift (rad) of reflected light generated in the first end section P1. Further, $m_1$ is 0 or an integer.

[Mathematical Expression 3]

$$\left. \begin{array}{l} L_2 = tL_2 + a_2 \\ (2tL_2)/\lambda = -\Phi_2/(2\pi) + m_2 \end{array} \right\} \quad \text{Mathematical Expression (3)}$$

In the mathematical expression (3), $tL_2$ is an optical theoretical distance between the second end section P2 and the maximum light emission position. Further, $a_2$ is a correction amount based on a light emission distribution in the light-emitting layer 14c. $\lambda$ is a peak wavelength of a spectrum of light which is desired to be extracted. $\Phi_2$ is a phase shift (rad) of reflected light generated in the second end section P2. Further, $m_2$ is 0 or an integer.

The mathematical expression (2) is established so that when light toward the anode 13 of light generated in the light-emitting layer 14c is reflected by the first end section P1 and returned, the phase of returned light and the phase of light at the time of emission become the same as each other and the returned light has a mutually reinforcing relationship with light toward the cathode 15 of emitted light. Moreover, the mathematical expression (3) is established so that when light toward the cathode 15 of the light generated in the light-emitting layer 14c is reflected by the second end section P2 and is returned, the phase of the returned light and the phase of light at the time of emission become the same as each other and the returned light has a mutually reinforcing relationship with the light toward the anode 13 of emitted light.

In the organic EL element 11 of the embodiment, the thickness [d1] of the light-emitting layer 14c is larger than the total thickness [d2] of the hole injection layer 14a and the hole transport layer 14b, so the thicknesses are allowed to be designed so as to satisfy $m_1 > m_2$ in the above-described mathematical expressions (2) and (3). Thereby, light extraction efficiency is allowed to be improved.

In addition, in the case where it is considered that there is no expansion of the light emission region, the optical theoretical distance $tL_1$ in the mathematical expression (2) and the optical theoretical distance $tL_2$ in the mathematical expression (3) are theoretical values at which the phase of returned light and the phase of light at the time of emission becomes equal to each other by cancelling out a phase change amount in the first end section P1 or the second end section P2 and a phase change amount by traveling. However, in general, a light emission part expands, so in the mathematical expression (2) and the mathematical expression (3), the correction amounts $a_1$ an $a_2$ based on the light emission distribution is added.

The correction amounts a and $a_2$ depend on the light emission distribution, but in the case where the maximum light emission position is located on the cathode 15 side of the light-emitting layer 14c and the light emission distribution is spread from the maximum light emission position toward the anode 13, or in the case where the maximum light emission position is located on the anode 13 side of the light-emission layer 14c and the light emission distribution is spread from the maximum light emission position toward the cathode 15, the correction amounts $a_1$ and $a_2$ are determined by, for example, the following mathematical expression (4).

[Mathematical Expression 4]

$$\left. \begin{array}{l} a_1 = b(\log_e(s)) \\ a_2 = -a_1 \end{array} \right\} \quad \text{Mathematical Expression (4)}$$

In the mathematical expression (4), b is a value within a range of $2n \leqq b \leqq 6n$ in the case where the light emission distribution in the light-emitting layer 14c is spread from the maximum light emission position toward the anode 13, and a value within $-6n \leqq b \leqq -2n$ in the case where the light emission distribution in the light-emitting layer 14c is spread from the maximum light emission position toward the cathode 15. Moreover, s is a physical property value (1/e attenuation distance) relating to the light emission distribution in the light-emitting layer 14c. Further, n is an average refractive index between the first end section P1 and the second end section P2 at the peak wavelength λ of the spectrum of light which is desired to be extracted.

8. Configuration of Display

Figure 2:
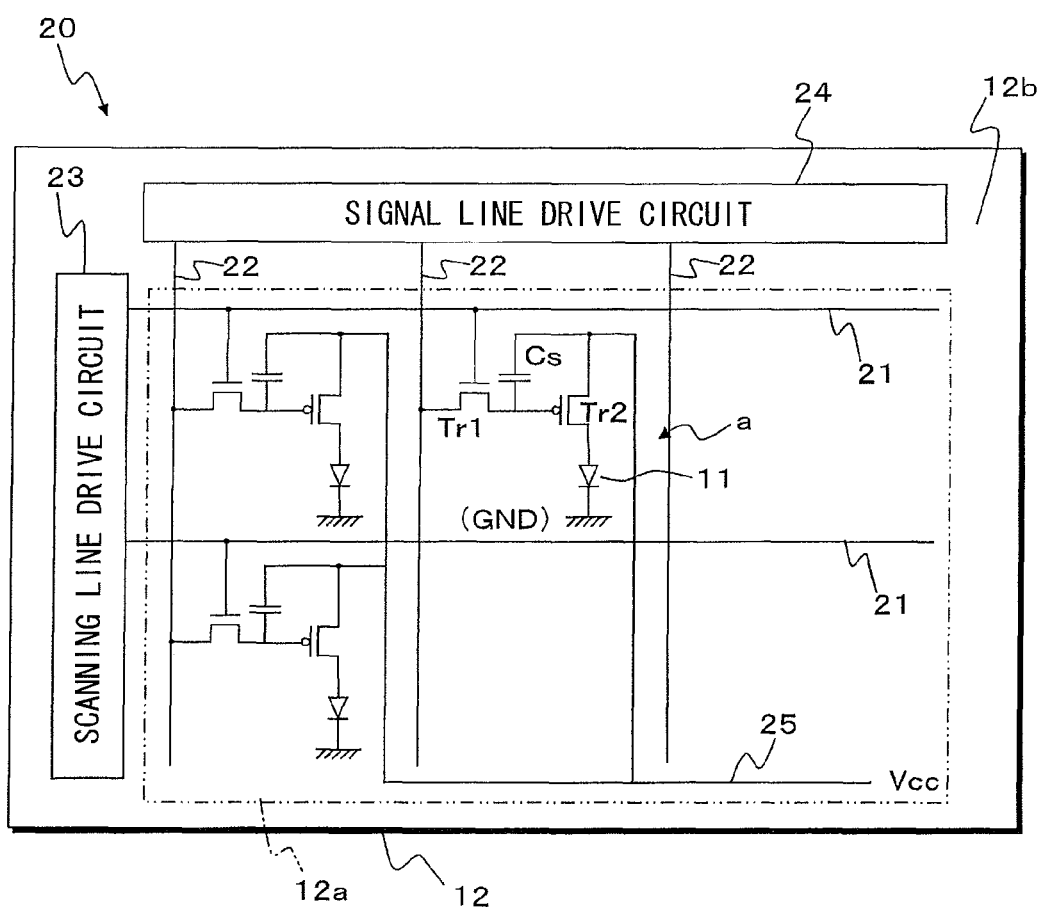
FIG. 2 is a diagram illustrating an example of a circuit configuration of a display.

Next, an example of an active matrix system display formed by arranging the organic EL elements 11 with the above-described configuration on the substrate 12 will be described referring to a circuit configuration diagram in FIG. 2.

A display region 12a and a peripheral region 12b are provided on the substrate 12 of a display 20. In the display region 12a, a plurality of scanning lines 21 and a plurality of signal lines 22 are arranged in a horizontal direction and a vertical direction, and the display region 12a is configured as a pixel array section where one pixel a is arranged corresponding to each of intersections of the scanning lines 21 and the signal lines 22. An organic EL element is arranged in each pixel a. In the peripheral region 12b, a scanning line drive circuit 23 performing a scanning drive on the scanning lines 21 and a signal line drive circuit 24 supplying a picture signal (that is, an input signal) based on luminance information to the signal lines 22 are arranged.

A pixel circuit arranged in each pixel a is configured of, for example, the organic EL element 11, a drive transistor Tr1, a write transistor (a sampling transistor) Tr2, and a retention capacitor Cs. The picture signal written from the signal line 22 through the write transistor Tr2 is retained in the retention capacitor Cs through a drive by the scanning line drive circuit 23. A current according to a retained signal amount is supplied to the organic EL element 11 so that the organic EL element 11 emits light with luminance according to the value of the current. A write transistor Tr2 for drive and the retention capacitor Cs are connected to a common power supply line (Vcc) 25.

The configuration of the above pixel circuit is only one example, and if necessary, a capacitive element may be arranged in a pixel circuit, or a pixel circuit may be configured by further arranging a plurality of transistors.

Figure 3:
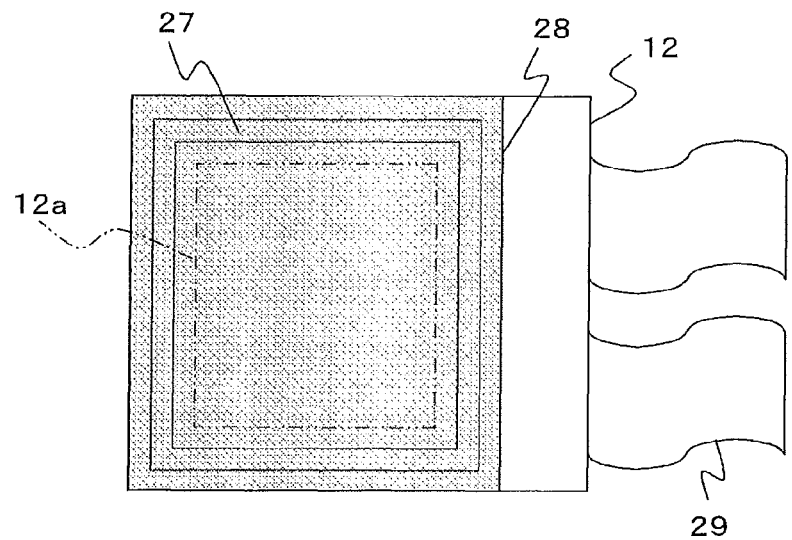
FIG. 3 is a configuration diagram illustrating a module-shaped display to which the embodiment is applied.

The display according to the embodiment includes a module-shaped display with a sealed configuration as illustrated in FIG. 3. For example, the module-shaped display corresponds to a display module formed by arranging a sealing section 27 so that the display region 12a as the pixel array section is surrounded by the sealing section 27 and bonding the sealing section 27 as an adhere to an opposite section (a sealing substrate 28) made of transparent glass or the like. On the transparent sealing substrate 28, a color filter, a protective film, a light-shielding film or the like may be arranged. In addition, on the substrate 12 as a display module where the display region 12a is formed, a flexible printed circuit 29 for inputting and outputting a signal or the like from outside to the display region 12a (the pixel array section) may be arranged.

According to such an organic EL element 11 and such a display 20, when the thickness of the hole supply layer configured of the hole injection layer 14a and the hole transport layer 14b is relatively smaller than that of the light-emitting layer 14c, a hole supply amount to the light-emitting layer 14c containing the above-described anthracene is allowed to be increased. Thereby, a carrier balance with a sufficiently large carrier supply amount is obtainable without excess and deficiency of holes and electrons in the light-emitting layer 14c, so high luminous efficiency is obtainable. Moreover, because of no excess and no deficiency of holes and electrons, it is less likely to lose the carrier balance, and drive degradation is preventable and light emission life is allowed to be increased.

Moreover, even if the total thickness of the whole organic layer 14 is large, an element with a low drive voltage is allowed to be configured. Therefore, even if a foreign substance is placed on the substrate 12, the foreign substance is allowed to be covered with the organic layer 14. Therefore, a short between the anode 13 and the cathode 15 is less likely to occur, and a pixel not emitting light is not formed, so production yields of the organic EL element 11 and the display 20 using the organic EL element 11 are allowed to be improved.

In addition, the organic EL element 11 is not exclusively used in the active matrix system display 20 using a TFT substrate, and is also applicable as an organic EL element used for a passive system display, and the same effects as those in the case where the organic EL element 11 is used for the active matrix system display 20 are obtainable. In the case of the passive system display, one of the above-described cathode 15 and the above-described anode 13 is configured as a signal line, and the other is configured as a scanning line.

Moreover, in the above embodiment, the case of "a top emission type" in which emitted light is extracted from the cathode 15 arranged on a side opposite to the substrate 12 is described. However, the embodiment is applicable to a "bottom emission type" organic EL element in which emitted light is extracted from the substrate 12 side. In this case, in a laminate configuration described referring to FIG. 1, the anode 13 on the substrate 12 made of a transparent material is configured with use of, for example, a transparent electrode material with a large work function such as ITO. Thereby, emitted light is extracted from both of the substrate 12 side and a side opposite to the substrate 12. Moreover, in such a configuration, when the cathode 15 is configured of a reflective material, emitted light is extracted only from the substrate 12 side. In this case, a sealing electrode of AuGe, Au, Pt or the like may be added to an uppermost layer of the cathode 15.

Further, even in a configuration in which layers are laminated in reverse order to the laminate configuration described referring to FIG. 1 so that the anode 13 is an upper electrode, a "transmissive type" organic EL element in which emitted light is extracted from the substrate 12 side is allowed to be configured. Also in this case, when the anode 13 which is the upper electrode is changed to a transparent electrode, emitted light is extracted from both of the substrate 12 side and a side opposite to the substrate 12.

Moreover, the organic EL element 11 described in the above embodiment is applicable to a stack type organic EL element configured by laminating units of the organic layers 14 having the light-emitting layer 14c. Herein, the stack type means a tandem element, and, for example, in Japanese Unexamined Patent Application Publication No. H11-329748, an element characterized in that a plurality of organic light-emitting elements are electrically connected to one another in series with intermediate conductive layers in between is described.

Moreover, in Japanese Unexamined Patent Application Publication Nos. 2003-45676 and 2003-272860, the disclosure of an element configuration for achieving a tandem element and specific working examples are described. According to them, it is described that in the case where 2 units of organic layers are laminated, ideally cd/A is allowed to be doubled without changing lm/W, and in the case where 3 units are laminated, ideally cd/A is allowed to be tripled without changing lm/W.

Therefore, in the case where the invention is applied to the tandem element, an element with extremely long life is obtainable by a synergistic effect between an increase in life because of an improvement in efficiency by using the tandem element and an effect of increasing life by the invention.

9. Application Examples

The above-described display according to the embodiment is applicable to displays of various electronic devices as illustrated in FIG. 4 to FIG. 8, for example, electronic devices in any field which display a picture signal inputted into the electronic devices or a picture signal produced in the electronic devices as an image or a picture, such as digital cameras, notebook personal computers, portable terminal devices such as cellular phones, and video cameras. Examples of electronic devices to which the invention is applied will be described below.

Figure 4:
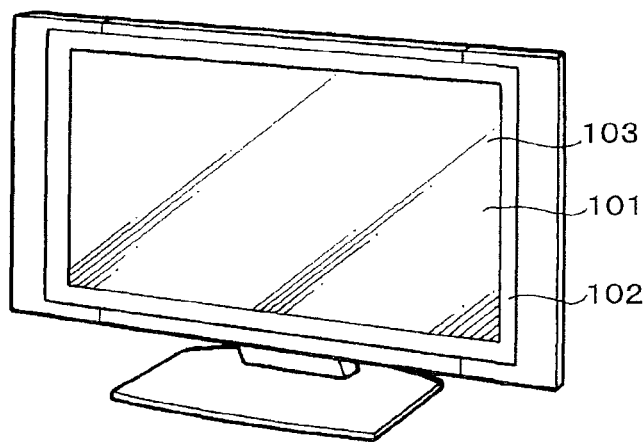
FIG. 4 is a perspective view illustrating a television to which the embodiment is applied.

FIG. 4 is a perspective view of a television to which the embodiment is applied. The television according to an application example includes a picture display screen section 101 configured of a front panel 102, a filter glass 103 and the like. The display according to the embodiment is applicable as the picture display screen section 101.

Figure 5:
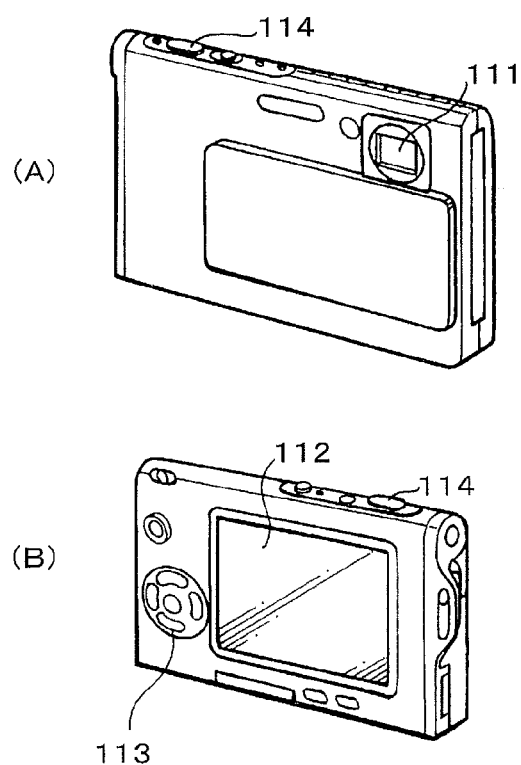
FIG. 5 is perspective views illustrating a digital camera to which the embodiment is applied, (A) and (B) are perspective views from a front side and a back side, respectively.

FIG. 5 is perspective views illustrating a digital camera to which the embodiment is applied, and (A) is a perspective view from a front side and (B) is a perspective view from a back side. The digital camera according to an application example includes a light-emitting section for a flash 111, a display section 112, a menu switch 113, a shutter button 114 and the like. The display according to the invention is applicable as the display section 112.

Figure 6:
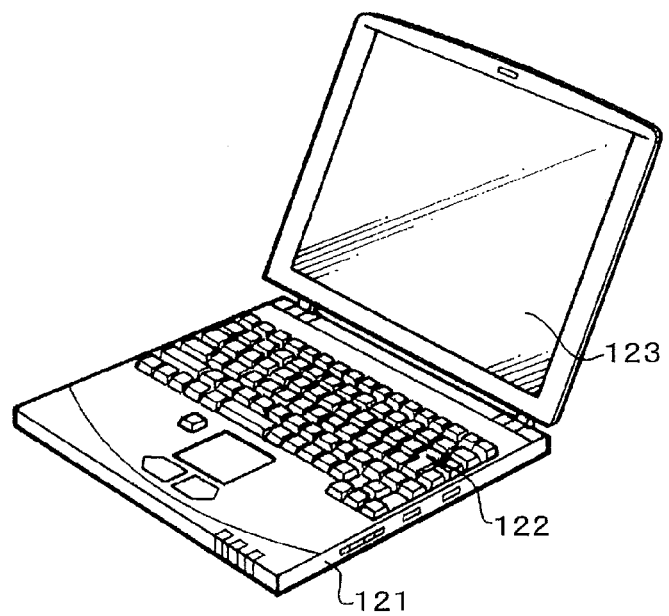
FIG. 6 is a perspective view illustrating a notebook personal computer to which the embodiment is applied.

FIG. 6 is a perspective view illustrating a notebook personal computer to which the embodiment is applied. The notebook personal computer according to an application example includes a keyboard 122 for operation of inputting characters or the like, and a display section 123 for displaying an image and the like in a main body 121. The display according to the invention is applicable as the display section 123.

Figure 7:
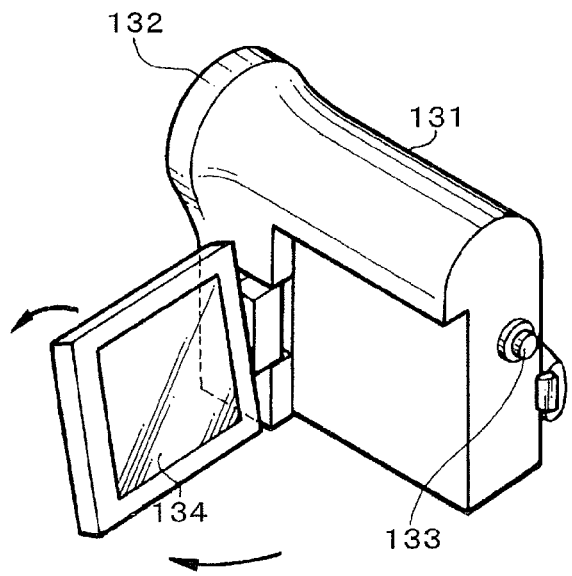
FIG. 7 is a perspective view illustrating a video camera to which the embodiment is applied.

FIG. 7 is a perspective view illustrating a video camera to which the embodiment is applied. The video camera according to an application example includes a main body 131, a lens for shooting an object 132 arranged on a front surface of the main body 131, a shooting start/stop switch 133, a display section 134 and the like. The display according to the invention is applicable as the display section 134.

Figure 8:
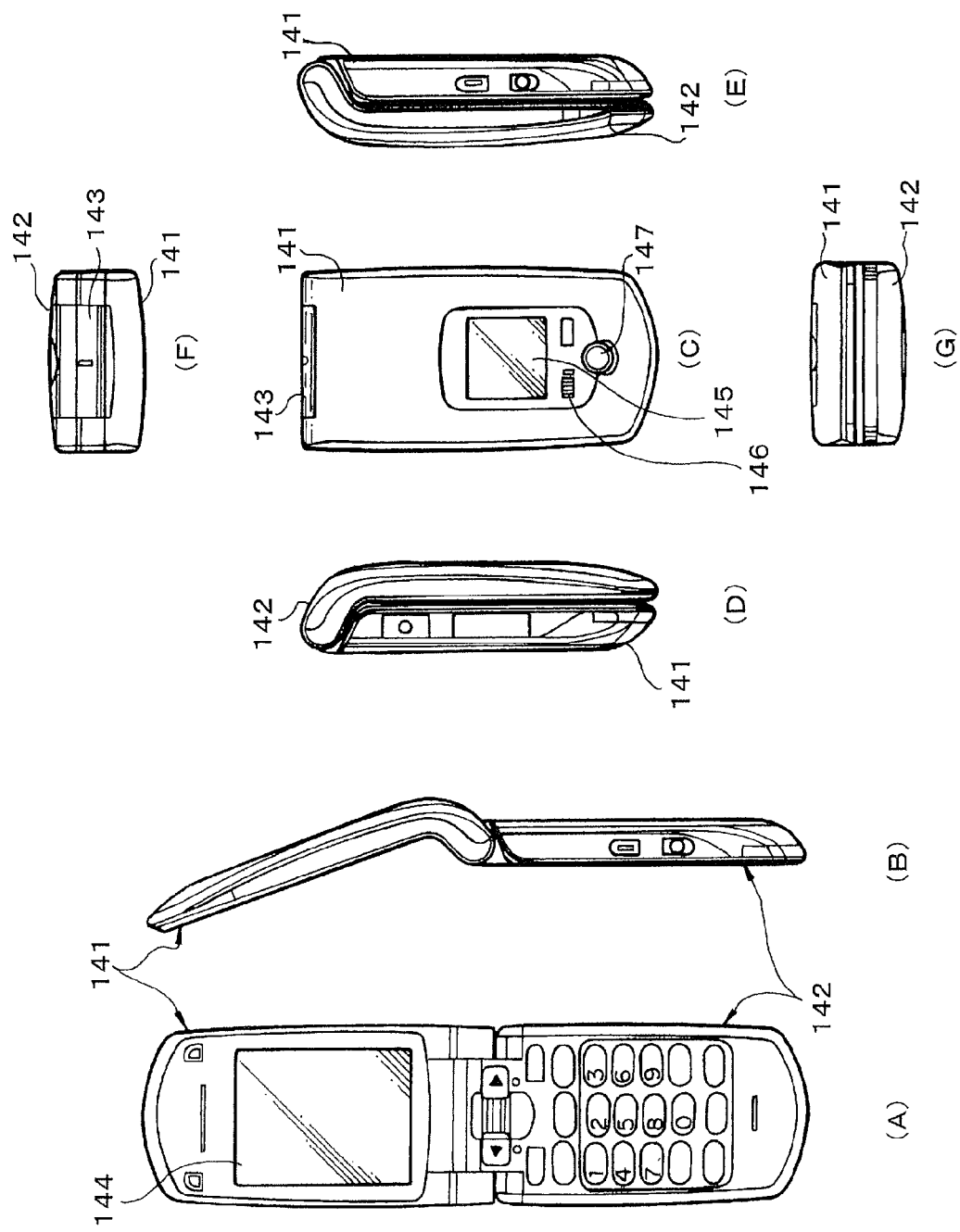
FIG. 8 is perspective views illustrating a cellular phone to which the embodiment is applied, (A) and (B) are a front view and a side view in a state in which the cellular phone is opened, respectively, and (C), (D), (E), (F) and (G) are a front view, a left side view, a right side view, a top view and a bottom view in a state in which the cellular phone is closed, respectively.

FIG. 8 is perspective views illustrating a portable terminal device, for example, a cellular phone, (A) and (B) are a front view and a side view in a state in which the cellular phone is opened, respectively, and (C), (D), (E), (F) and (G) are a front view, a left side view, a right side view, a top view and a bottom view in a state in which the cellular phone is closed, respectively. The cellular phone according to an application example includes a top-side enclosure 141, a bottom-side enclosure 142, a connection section (herein, a hinge section) 143, a display 144, a sub-display 145, a picture light 146, a camera 147 and the like. The display according to the embodiment is applicable as the display 144 or the sub-display 145.

WORKING EXAMPLES

Next, steps of manufacturing organic EL elements in specific working examples of the embodiment and comparative examples relating to the working examples and evaluation results of the organic EL elements will be described below.

Working Examples 1 to 12

The organic EL elements described referring to FIG. 1 were formed. Herein, the top emission system organic EL elements 11 in which emitted light generated by recombining holes injected from the anode 13 and electrons injected from the cathode 15 in the light-emitting layer 14c was extracted from the cathode 15 side were formed. Moreover, the organic EL elements 11 were formed as resonator configurations in which emitted light was resonated between the anode 13 and the cathode 15 to be extracted. Note that the following table 12 also illustrates layer configurations of Working Examples 1 to 12 and Comparative Examples 1 to 6, but a common configuration in the working examples and the comparative examples is not illustrated. The steps of manufacturing the organic EL elements 11 will be described below.

TABLE 12

| | Hole transport layer 14b Thickness (nm) | Light-emitting layer 14c Material · Thickness (nm) | Electron transport layer 14d Material · Thickness (nm) | Current efficiency | Drive voltage (V) | Light emission life (hr) |
|---|---|---|---|---|---|---|
| Working Example 1 | 30 nm | Host Material (1) + Guest Material (1) (5%) 160 nm | ETL material (1) 15 nm | 6.4 | 5.3 | 550 |
| Working Example 2 | | Host Material (2) + Guest Material (1) (5%) 160 nm | ETL material (4) 15 nm | 6.9 | 5.9 | 700 |
| Working Example 3 | | Host Material (1) + Guest Material (1) (5%) 270 nm | ETL material (3) 15 nm | 6.5 | 4.1 | 400 |

TABLE 12-continued

| | Hole transport layer 14b Thickness (nm) | Light-emitting layer 14c Material · Thickness (nm) | Electron transport layer 14d Material · Thickness (nm) | Current efficiency | Drive voltage (V) | Light emission life (hr) |
|---|---|---|---|---|---|---|
| Working Example 4 | | Host Material (2) + Guest Material (2) (10%) 185 nm | ETL material (3) 15 nm | 27.3 | 5.8 | 1200 |
| Working Example 5 | | Host Material (3) + Guest Material (3) (1%) 225 nm | ETL material (3) 15 nm | 18.5 | 4.3 | 3000 |
| Working Example 6 | | Host Material (1) + Guest Material (1) (5%) 30 nm/ Host Material (1) 130 nm | ETL material (1) 15 nm | 6.4 | 5.4 | 530 |
| Working Example 7 | | Host Material (1) + Guest Material (1) (5%) 30 nm/ Host Material (1) 130 nm | ETL material (3) 15 nm | 6.4 | 4.0 | 410 |
| Working Example 8 | | Host Material (3) + Guest Material (3) (1%) 40 nm/ Host Material (1) 185 nm | ETL material (3) 15 nm | 20.0 | 4.3 | 3000 |
| Working Example 9 | | Host Material (3) + Guest Material (4) (1%) 40 nm/ Host Material (1) 185 nm | ETL material (3) 15 nm | 21.0 | 4.3 | 3500 |
| Working Example 10 | | Host Material (3) + Guest Material (4) (1%) 40 nm/ Host Material (3) 185 nm | ETL material (3) 15 nm | 19.5 | 11.5 | 1000 |
| Working Example 11 | | Host Material (4) + Guest Material (5) (1%) 40 nm/ Host Material (1) 185 nm | ETL material (3) 15 nm | 40.0 | 4.8 | 1900 |
| Working Example 12 | | Host Material (1) + Guest Material (5) (1%) 40 nm/ Host Material (1) 185 nm | ETL material (3) 15 nm | 39.0 | 4.5 | 2200 |
| Comparative Example 1 | 160 nm | Host Material (1) + Guest Material (1) (5%) 30 nm | ETL material (2) 15 nm | 4.2 | 6.8 | 275 |
| Comparative Example 2 | 270 nm | Host Material (1) + Guest Material (1) (5%) 30 nm | ETL material (2) 15 nm | 3.0 | 13.5 | 50 |
| Comparative Example 3 | 30 nm | Host Material (1) + Guest Material (1) (5%) 30 nm | ETL material (2) 115 nm | 2.1 | 15.0 | 80 |
| Comparative Example 4 | 200 nm | Host Material (3) + Guest Material (3) (1%) 40 nm | ETL material (2) 30 nm | 3.0 | 8.0 | 300 |
| Comparative Example 5 | 200 nm | Host Material A + Guest Material (5) (1%) 40 nm | ETL material (2) 30 nm | 15.2 | 9.0 | 30 |
| Comparative Example 6 | 30 nm | Host Material A + Guest Material (5) (1%) 40 nm/ Host material A 185 nm | ETL material (3) 15 nm | 15.0 | 19.4 | 25 |

First, after an Ag layer with a thickness of 200 nm was formed as the anode 13 on the substrate 12 made of a 30 mm×30 mm glass plate, an ITO layer with a thickness of 10 nm was formed on the Ag layer. In this case, an end surface on the organic layer 14 side of the Ag layer in the anode 13 was the first end surface $P_1$ of the formed resonator configuration. Next, a cell for organic EL element masked with an insulating film (not illustrated) except for a 2 mm×2 mm light emission region was formed by $SiO_2$ evaporation.

Next, a film of the diamine derivative represented by the above structural expression (5)-57 as the hole injection layer 14a with a thickness of 10 nm (at an evaporation rate of 0.2 to 0.4 nm/sec) was formed on the anode 13 by a vacuum deposition method. Moreover, the hole transport layer 14b made of the material represented by the structural expression (5)-43 with each respective thickness in the above-described table 12 was formed on the hole injection layer 14a.

Next, as illustrated in the above-described table 12, in each of Working Examples 1 to 12 and Comparative Examples 1 to 6, the light-emitting layer 14c of each respective material with each respective thickness and the electron transport layer 14d of each respective material with each respective thickness were formed in this order on the hole transport layer 14b by evaporation to obtain the organic layer 14. Thereby, the organic layer 14 with a total thickness [da]=150 nm or over was formed.

Moreover, the materials illustrated in Table 12 are as follows, and anthracene derivatives were used as host materials (1) and (2) of the light-emitting layer 14c, and a naphthacene derivative was used as a host material (3) of the light-emitting layer 14c. However, in Comparative Examples 5 and 6, as a host material A, BAlq which was a polycyclic aromatic hydrogen compound having 2 ring members which was not included in the invention was used. As the luminous guest material of the light-emitting layer 14c, a blue guest material (1), a green guest material (2), red guest materials (3) and (4) and a red phosphorescent guest material (5) were used. Moreover, as ETL materials (1) to (4) configuring the electron transport layer 14d, nitrogen-containing heterocyclic derivatives were used.

[Chemical Expression 10]

host material (1)

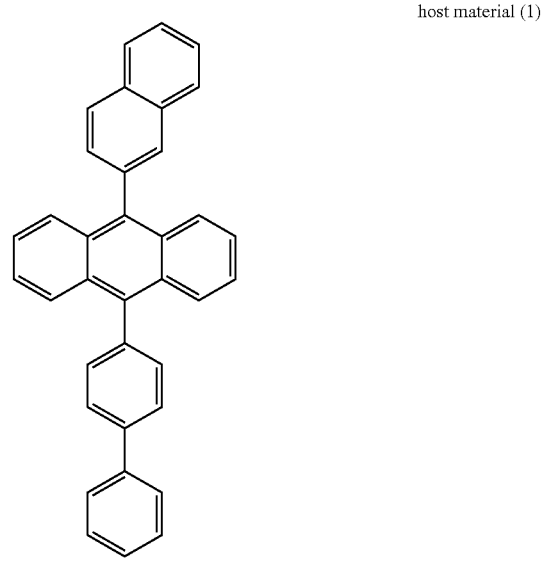

host material (2)
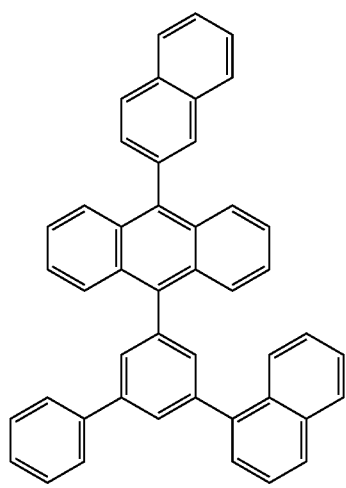
host material (3)
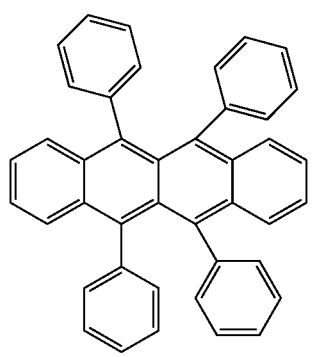
host material (4)
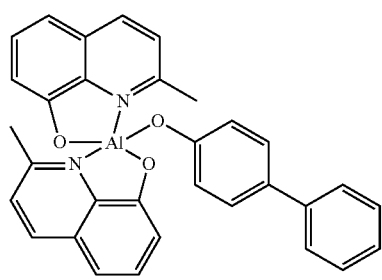
blue guest material (1)
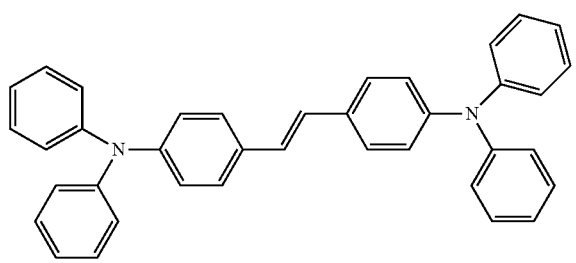
green guest material (2)
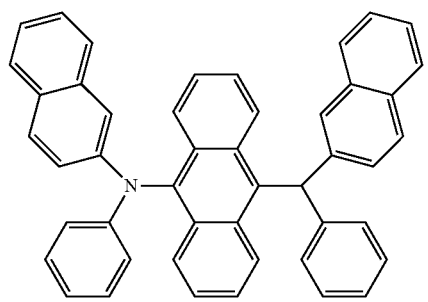
red guest material (3)
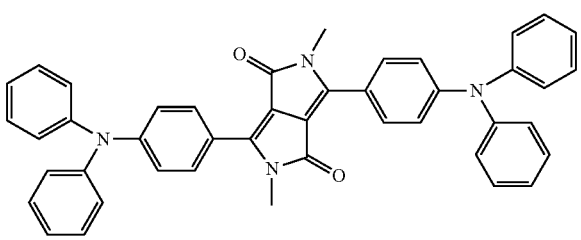
red guest material (4)
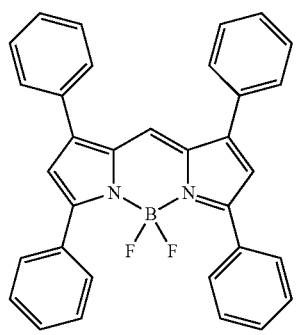
red phosphorescent guest material (5)
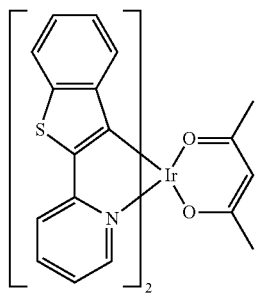
ETL material (1)
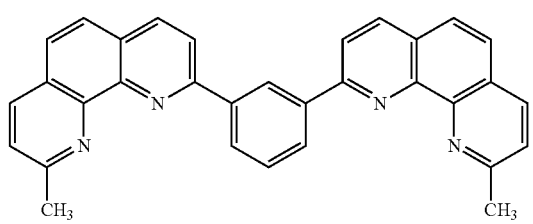

-continued

ETL material (2)
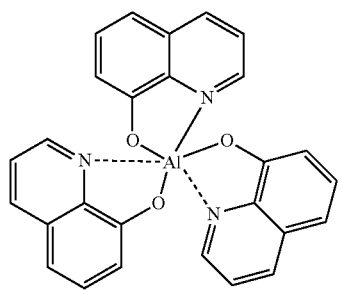

ETL material (3)
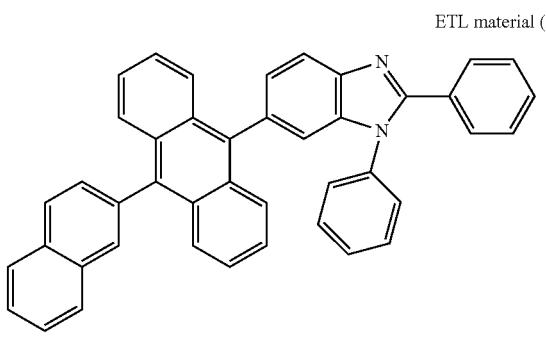

ETL material (4)
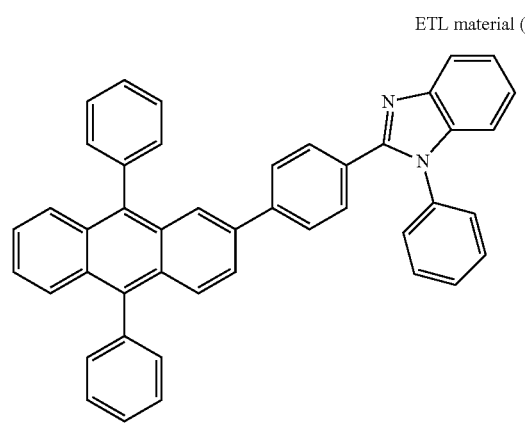

As described above, after the organic layer 14 from the hole injection layer 14a to the electron transport layer 14d was formed, as the first layer 15a of the cathode 15, a film of LiF with a thickness of approximately 0.3 nm (at an evaporation rate of approximately 0.01 nm/sec) was formed by a vacuum deposition method, and then a film of MgAg with a thickness of 10 nm was formed as the second layer 15b by a vacuum deposition method so as to provide the cathode 15 with a two-layer configuration. In this case, an end surface on the organic layer 14 side of the second layer 15b was the second end surface P2 of the resonator configuration.

As described above, the organic EL elements 11 of Working Examples 1 to 12 to which the invention was applied and the organic EL elements of Comparative Examples 1 to 6 were formed. These organic EL elements had a configuration in which the organic layer 14 had a total thickness d2=150 nm or over so as to effectively prevent a short between the anode 13 and the cathode 15.

<Evaluation Results-1>

The current efficiency (cd/A) at a current density of 10 $mAcm^{-2}$ and the drive voltage (V) in each of the formed organic EL elements of Working Examples 1 to 12 and Comparative Examples 1 to 6 were measured. Moreover, the amount of time that it took to reduce relative luminance to 0.8 in the case where initial luminance at the time of a constant current drive of 50 $mAcm^{-2}$ and 50° C. was 1 was measured as light emission life. The results are also illustrated in the above-described Table 12.

As illustrated in Table 12, in the formed organic EL elements 11 of Working Examples 1 to 12 to which the invention was applied, the host materials (1) to (3) configuring the light-emitting layer 14c were polycyclic aromatic hydrocarbon compounds with a basic skeleton having three or four ring members. Moreover, the thickness [d1] of the light-emitting layer 14c was larger than the thickness [d2] (40 nm) of the hole supply layer including the hole injection layer 14a (10 nm) and the hole transport layer 14b (30 nm).

On the other hand, in the organic EL elements of Comparative Examples 1 to 5, the light-emitting layer 14c did not have a configuration in which the thickness [d1] of the light-emitting layer 14c was larger than the thickness [d2] of the hole supply layer including the hole injection layer 14a and the hole transport layer 14b. Moreover, in the organic EL element of Comparative Examples 5 and 6, the host material A configuring the light-emitting layer 14c was not a polycyclic aromatic hydrocarbon compound with a basic skeleton having three to seven ring members.

Comparisons between Working Examples 1 to 12 and Comparative Examples 1 to 5 are as follows.

When Working Examples 1 to 3 and Comparative Examples 1 to 3 including the light-emitting layer 14c of which the whole region was doped with the same guest material (1) were compared to one another, in Working Examples 1 to 3 in which the thickness [d1] of the light-emitting layer 14c was larger than the thickness [d2] of the hole supply layer including the hole injection layer and the hole transport layer, the current efficiency was higher, the drive voltage was lower, and light emission life was longer. Moreover, it was confirmed that even though the organic layer 14 had a large total thickness d2=150 nm or over, specifically in Working Examples 3 to 5 in which the benzoimidazol derivative of the ETL material (3) corresponding to the general expression (2) was used as a nitrogen-containing heterocyclic derivative configuring the electron transport layer 14d, a device with a sufficiently lower drive voltage than that in Comparative Examples 1 to 3 with a similar configuration was formable.

Further, it was confirmed from a comparison between Working Examples 9 and 10 that in a configuration in which only a recombination region close to the anode 13 of the light-emitting layer 14c was doped with a luminous guest material, when a layer not containing a guest material was made of the anthracene derivative of the host material (1), an organic EL element with high current efficiency, a low drive voltage and long light emission life was obtained.

It was confirmed that when the host material (3) which was a naphthacene derivative was used with the red guest material (3) which was a diketopyrrolopyrrole complex as illustrated in Working Examples 5 and 8 or the red guest material (4) which was a pyrromethene complex as illustrated in Working Examples 9 and 10, an organic EL element with good luminous efficiency was obtained.

Moreover, it was confirmed from a comparison between Working Examples 11 and 12 and Comparative Examples 5 and 6 that even in the case where the phosphorescent guest material (5) was used, an organic EL element with high current efficiency, a low drive voltage and long light emission life was obtained.

Working Examples 13 to 20

The organic EL elements 11 described referring to FIG. 1 were formed. Herein, as in the case of the above Working Examples 1 to 12, the top emission system organic EL elements 11 in which emitted light generated by recombining holes injected from the anode 13 and electrons injected from the cathode 15 in the light-emitting layer 14c was extracted from the cathode 15 side were formed. Moreover, the organic EL elements 11 were formed as resonator configurations in which emitted light was resonated between the anode 13 and the cathode 15 to be extracted. Note that the following Table 13 also illustrates the thickness of each layer in each of Working Examples 13 to 20, but a common configuration in the working examples is not illustrated. Steps of manufacturing the organic EL elements 11 will be described below.

TABLE 13

|  | Hole transport layer 14b Thickness (nm) | Light-emitting layer 14c Thickness d1 (nm) | Electron transport layer 14d Thickness (nm) | d1/d2 | Current efficiency cd/A | Light emission life hr |
|---|---|---|---|---|---|---|
| Working Example 13 | 150 | 10 | 40 | 0.05 | 2.3 | 100 |
| Working Example 14 | 150 | 30 | 20 | 0.15 | 3.2 | 200 |
| Working Example 15 | 40 | 70 | 90 | 0.35 | 5.3 | 550 |
| Working Example 16 | 40 | 110 | 50 | 0.55 | 5.3 | 580 |
| Working Example 17 | 40 | 150 | 10 | 0.75 | 5.2 | 600 |
| Working Example 18 | 20 | 170 | 10 | 0.85 | 5.2 | 600 |
| Working Example 19 | 5 | 190 | 5 | 0.95 | 0.8 | 20 |
| Working Example 20 | 5 | 195 | 0 | 0.975 | 0.01 | 0.05 |

First, after an Ag layer with a thickness of 200 nm was formed as the anode 13 on the substrate 12 made of a 30 mm×30 mm glass plate, an ITO layer with a thickness of 10 nm was formed on the Ag layer. In this case, an end surface on the organic layer 14 side of the Ag layer in the anode 13 was the first end surface $P_1$ of the formed resonator configuration. Next, a cell for organic EL element masked with an insulating film (not illustrated) except for a 2 mm×2 mm light emission region was formed by $SiO_2$ evaporation.

Next, a film of the diamine derivative represented by the structural expression (5)-57 with a thickness of 10 nm (at an evaporation rate of 0.2 to 0.4 nm/sec) was formed as the hole injection layer 14a on the anode 13. Moreover, the hole transport layer 14b of the material represented by the structural expression (5)-42 with each respective thickness in the above-described table 13 was formed on the hole injection layer 14a.

Next, the light-emitting layer 14c and the electron transport layer 14d using the following materials were formed by evaporation in this order to obtain the organic layer 14 with the total thickness d2=150 nm or over. At that time, in each of Working Examples 13 to 20, the light-emitting layer 14c and the electron transport layer 14d were formed with each respective thickness illustrated in the above table 13. In addition, as the host material (1) of the light-emitting layer 14c, an anthracene derivative was used, and as an ETL material (7) configuring the electron transport layer 14d, a benzoimidazol derivative was used as a nitrogen-containing heterocyclic derivative. Moreover, the additive amount of a guest material (6) in the light-emitting layer 14c was 5 wt %.

[Chemical Expression 11]

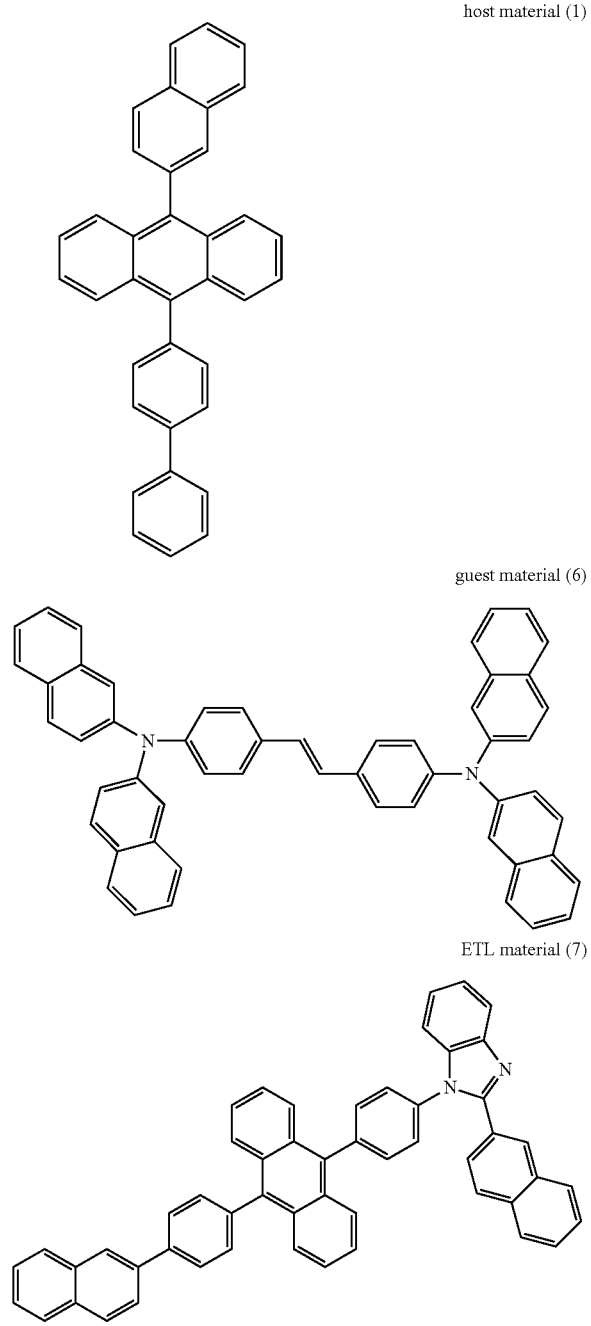

After the organic layer 14 from the hole injection layer 14a to the electron transport layer 14d was formed in the above-described manner, as the first layer 15a of the cathode 15, a film of LiF with a thickness of approximately 0.3 mm (at an evaporation rate of approximately 0.01 nm/sec) was formed by a vacuum deposition method, and then as the second layer 15b, a film of MgAg with a thickness of 10 nm was formed by a vacuum deposition method to form the cathode 15 with a two-layer configuration. In this case, a surface on the organic layer 14 side of the second layer 15b was the second end surface P2 of the resonator configuration.

The organic EL elements 11 were formed in the above-described manner. These organic EL elements 11 had a configuration in which the organic layer 14 had a total thickness [da]=150 nm or over so as to effectively prevent a short between the anode 13 and the cathode 15.

<Evaluation Result-2>

Figure 9:
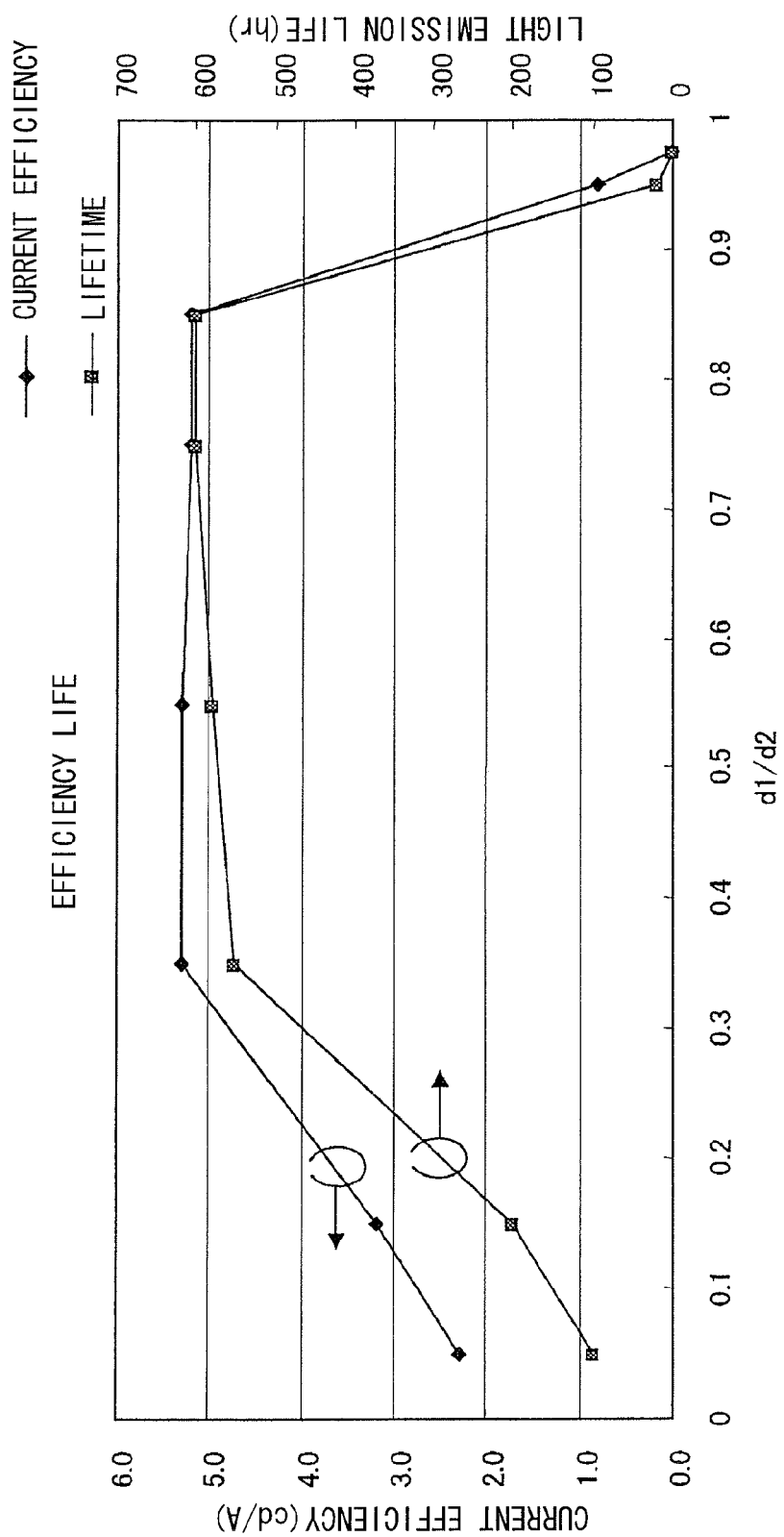
FIG. 9 is a graph illustrating a relationship between a value [d1/da] of a thickness [d1] of a light-emitting layer with respect to a total thickness [da] of an organic layer, current efficiency, and light emission life.
Figure 10:
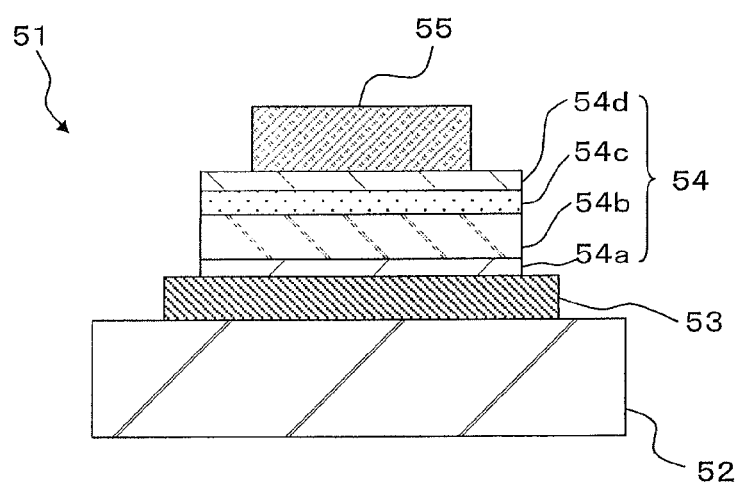
FIG. 10 is a sectional view illustrating a configuration of an organic EL element in related art.

The current efficiency (cd/A) at a current density of 10 mAcm$^{-2}$ in each of the formed organic EL elements 11 of Working Examples 13 to 20 was measured. Moreover, the amount of time that it took to reduce relative luminance to 0.8 in the case where initial luminance at the time of a constant current drive of 50 mAcm$^{-2}$ and 50° C. was 1 was measured as light emission life. The results are also illustrated in the above-described Table 13. Further, FIG. 9 illustrates a relationship between a value [d1]/[da] of the thickness [d1] of the light-emitting layer 14c with respect to the total thickness [da] of the organic layer 14, current efficiency and light emission life in graphical form.

It was confirmed from the results that as long as the range of the value [d1]/[da] satisfied a relationship of 0.90>[d1]/[da]>0.30, current efficiency of 5.2 (4.0) (cd/A) or over and light emission life of 500 (400) (hr) or over were secured.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. An organic electroluminescent element comprising:
    an anode;
    a cathode; and
    an organic layer with a total thickness da ranging from 150 to 220 nm arranged between the anode and the cathode, wherein the organic layer includes:
    a light-emitting layer having a thickness d1 ranging from 110 to 170 nm including a host material of a polycyclic aromatic hydrocarbon compound with a basic skeleton having three to seven ring members, and
    a hole supply layer having a thickness d2 ranging from 30 to 50 nm and arranged between the anode and the light-emitting layer, and
    the thickness d1 of the light-emitting layer with respect to the total thickness da of the organic layer satisfies a relationship of 0.90>d1/da≧0.55.

2. The organic electroluminescent element according to claim 1, wherein
    the basic skeleton of the polycyclic aromatic hydrocarbon compound is anthracene, pyrene, benzopyrene, chrysene, naphthacene, benzonaphthacene, dibenzonaphthacene, perylene or coronene.

3. The organic electroluminescent element according to claim 1, wherein
    the polycyclic aromatic hydrocarbon compound is an anthracene derivative represented by the following general formula (1):

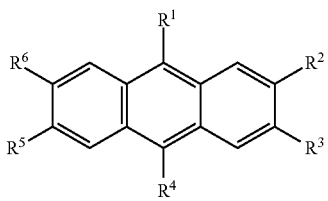

where in the general formula (1), $R^1$ to $R^6$ independently represent hydrogen, halogen, a hydroxyl group, a carbonyl group with 20 or less carbon atoms which may have a substituent group, a carbonyl ester group with 20 or less carbon atoms which may have a substituent group, an alkyl group with 20 or less carbon atoms which may have a substituent group, an alkenyl group with 20 or less carbon atoms which may have a substituent group, an alkoxyl group with 20 or less carbon atoms which may have a substituent group, a cyano group, a nitro group, a silyl group with 30 or less carbon atoms which may have a substituent group, an aryl group with 30 or less carbon atoms which may have a substituent group, a heterocyclic group with 30 or less carbon atoms which may have a substituent group, or an amino group with 30 or less carbon atoms which may have a substituent group.

4. The organic electroluminescent element according to claim 1, wherein
the light-emitting layer is configured by laminating a layer including the host material as well as a luminous guest material nearer to the anode side, and a layer including the host material further from the anode side relative to the layer including the host material and the luminous guest material.

5. The organic electroluminescent element according to claim 1, wherein
the light-emitting layer is configured by laminating a layer including a naphthacene derivative as the host material as well as a luminous guest material nearer to the anode side, and a layer including an anthracene derivative as the host material further from the anode side relative to the layer including the host material and the luminous guest material.

6. The organic electroluminescent element according to claim 1, wherein
light generated in the light-emitting layer is resonated between the anode and the cathode to be extracted from one of the anode and the cathode.

7. The organic electroluminescent element according to claim 1, wherein
a layer including a nitrogen-containing heterocyclic derivative is included between the light-emitting layer and the cathode.

8. The organic electroluminescent element according to claim 1, wherein
a layer including a nitrogen-containing heterocyclic derivative of a benzimidazole derivative is included between the light-emitting layer and the cathode.

9. The organic electroluminescent element according to claim 7, wherein
the nitrogen-containing heterocyclic derivative is a benzoimidazol derivative represented by the following general formula (2):

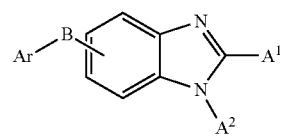

where in the general formula (2), $A^1$ and $A^2$ independently represent a hydrogen atom, an aryl group with 60 or less carbon atoms which may have a substituent group, a heterocyclic group which may have a substituent group, an alkyl group with 1 to 20 carbon atoms which may have a substituent group, or an alkoxy group with 1 to 20 carbon atoms which may have a substituent group, and $A^1$ and $A^2$ may be connected to each other through a linking group,
B represents an arylene group with 60 or less carbon atoms which may have a substituent group, a pyridinylene group which may have a substituent group, a quinolinylene group which may have a substituent group or a fluorenylene group which may have a substituent group, and
Ar represents an aryl group with 6 to 60 carbon atoms which may have a substituent group, a heterocyclic group with 3 to 60 carbon atoms which may have a substituent group, an alkyl group with 1 to 20 carbon atoms which may have a substituent group, or an alkoxy group with 1 to 20 carbon atoms which may have a substituent group.

10. The organic electroluminescent element according to claim 8, wherein
the nitrogen-containing heterocyclic derivative is a benzoimidazol derivative represented by the following general formula (2):

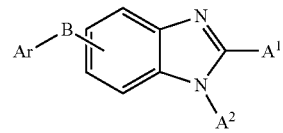

where in the general formula (2), $A^1$ and $A^2$ independently represent a hydrogen atom, an aryl group with 60 or less carbon atoms which may have a substituent group, a heterocyclic group which may have a substituent group, an alkyl group with 1 to 20 carbon atoms which may have a substituent group, or an alkoxy group with 1 to 20 carbon atoms which may have a substituent group, and $A^1$ and $A^2$ may be connected to each other through a linking group,
B represents an arylene group with 60 or less carbon atoms which may have a substituent group, a pyridinylene group which may have a substituent group, a quinolinylene group which may have a substituent group or a fluorenylene group which may have a substituent group, and
Ar represents an aryl group with 6 to 60 carbon atoms which may have a substituent group, a heterocyclic group with 3 to 60 carbon atoms which may have a substituent group, an alkyl group with 1 to 20 carbon atoms which may have a substituent group, or an alkoxy group with 1 to 20 carbon atoms which may have a substituent group.

11. The organic electroluminescent element according to claim 1, further comprising
a layer including a nitrogen-containing heterocyclic derivative of a phenanthroline derivative between the light-emitting layer and the cathode.

12. The organic electroluminescent element according to claim 1, wherein
the light-emitting layer includes a phosphorescent luminous guest material.

13. A display configured by arranging a plurality of organic electroluminescent elements on a substrate, the organic electroluminescent elements each comprising:
an anode;
a cathode; and
an organic layer with a total thickness da ranging from 150 to 220 nm or over arranged between the anode and the cathode,
wherein the organic layer includes:
a light-emitting layer having a thickness $d1$ ranging from 110 to 170 nm including a host material of a polycyclic aromatic hydrocarbon compound with a basic skeleton having three to seven ring members, and
a hole supply layer having a thickness $d2$ ranging from 30 to 50 nm and arranged between the anode and the light-emitting layer,
the thickness $d1$ of the light-emitting layer with respect to the total thickness da of the organic layer satisfies a relationship of $0.90 > d1/da \geqq 0.55$.

* * * * *